United States Patent [19]
Sugihara

[11] Patent Number: 5,160,779
[45] Date of Patent: Nov. 3, 1992

[54] MICROPROBE PROVIDED CIRCUIT SUBSTRATE AND METHOD FOR PRODUCING THE SAME

[75] Inventor: Osamu Sugihara, Nagasaka, Japan

[73] Assignee: Hoya Corporation, Japan

[21] Appl. No.: 620,861

[22] Filed: Nov. 29, 1990

[30] Foreign Application Priority Data

Nov. 30, 1989 [JP] Japan ............................... 1-311887
Mar. 30, 1990 [JP] Japan ............................... 2-83832
Mar. 30, 1990 [JP] Japan ............................... 2-83833
Aug. 31, 1990 [JP] Japan ............................... 2-231697

[51] Int. Cl.[5] .......................................... B32B 9/00
[52] U.S. Cl. ............................... 428/209; 428/901; 428/432; 428/426; 428/457
[58] Field of Search ............... 428/209, 901, 432, 426, 428/457

[56] References Cited

U.S. PATENT DOCUMENTS 3,827,891  8/1974  Larry .................................. 428/901
4,563,640  1/1986  Hasegawa ........................... 324/158

Primary Examiner—Patrick J. Ryan
Assistant Examiner—Kam F. Lee
Attorney, Agent, or Firm—Nixon & Vanderhye

[57] ABSTRACT

A probe assembly for testing semiconductor wafer chips includes microprobes embedded in a circuit substrate. The microprobes are pillar-shaped conductors formed in through holes in a base of the substrate. One end of the microprobe is flush with the base surface contacts and is electrically connected through a reinforcing substrate to a probe assembly test head which generates various test signals. The other end of the pillar-shaped microprobes projects beyond the base to make contact with and deliver test signals to various electrodes of a chip to be tested.

18 Claims, 34 Drawing Sheets

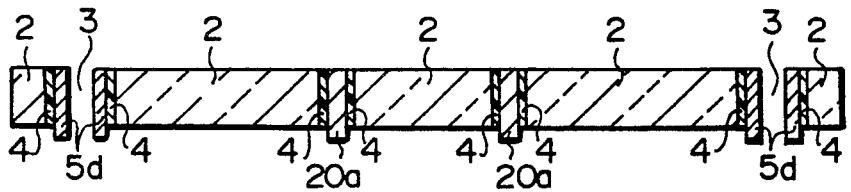
FIG. 4g
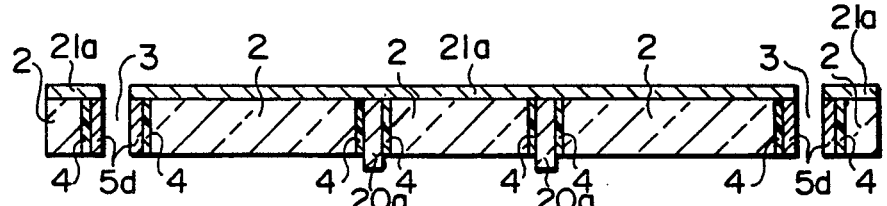
FIG. 4h
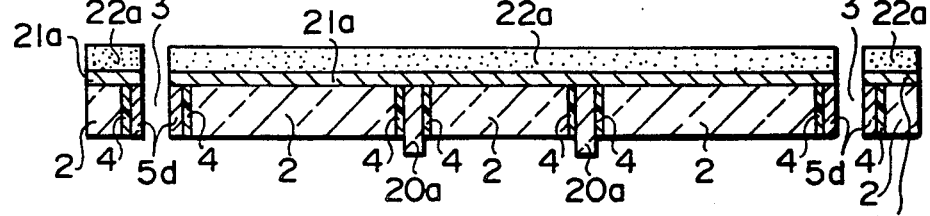
FIG. 4i
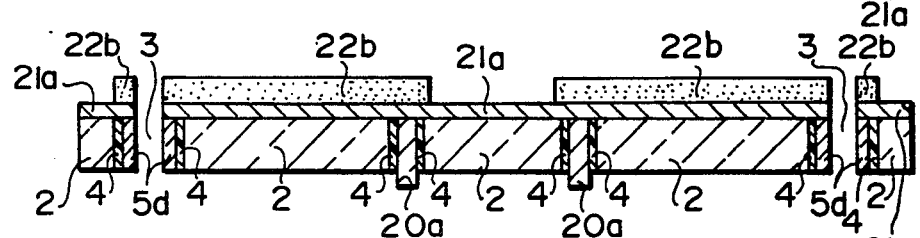
FIG. 4j
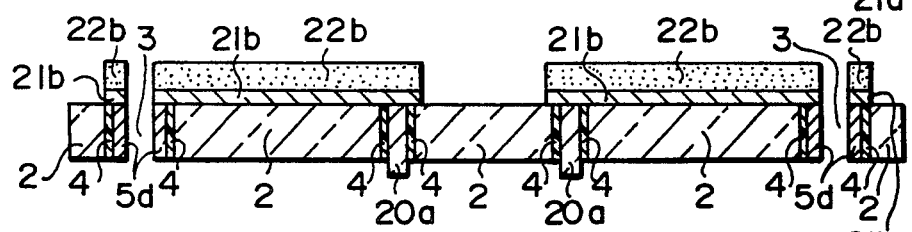
FIG. 4k
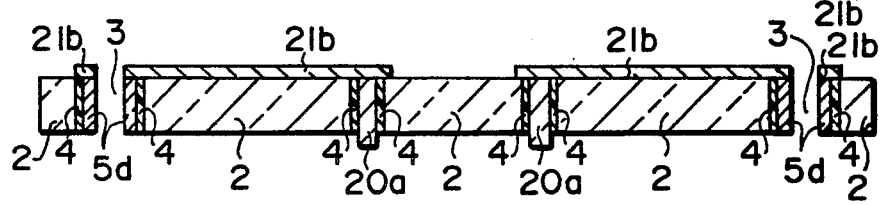
FIG. 4ℓ

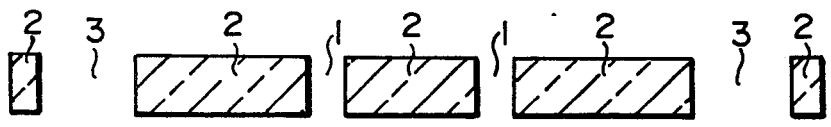
FIG. 16a
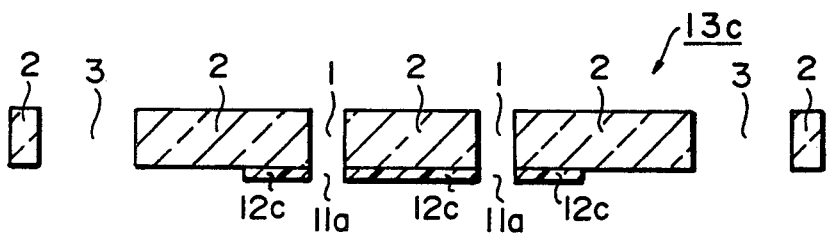
FIG. 16b
FIG. 16c
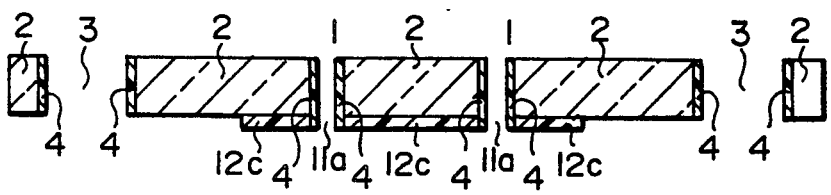
FIG. 16d
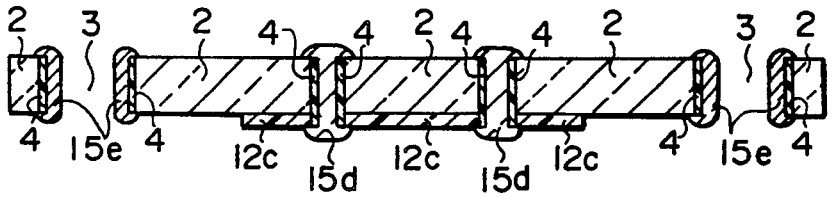
FIG. 16e
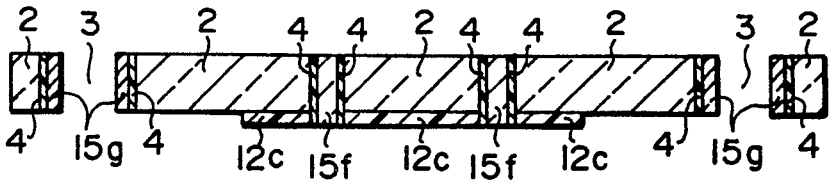
FIG. 16f
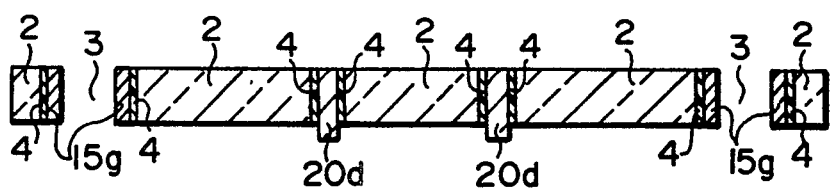

MICROPROBE PROVIDED CIRCUIT SUBSTRATE AND METHOD FOR PRODUCING THE SAME

BACKGROUND OF THE INVENTION

The present invention relates to a circuit substrate with microprobes (hereinafter referred to as "microprobe-provided circuit substrate") as represented by a probe assembly, and a method for producing the same.

Heretofore, a microprobe-provided circuit substrate as represented by a probe assembly such as those described in Japanese Patent Unexamined Publication No. Sho-57-201039 has been produced by fixing electrically conductive metals at predetermined positions on an electrically insulating or semiconductive base manually and at the same time electrically connecting the electrically conductive metals to conductive portions to thereby arrange microprobes at predetermined positions after producing the electrically insulating or semiconductive base having the conductive portions and the electrically conductive metals constituting the microprobes as separate members.

For example, a method for producing a probe assembly used in an integrated circuit of wafer tester is as follows. Predetermined conductive portions are provided on an electrically insulating base having an opening portion at a predetermined position. Needle-shaped electrically conductive metals as microprobes formed by bending their pointed-end portions are produced separately from the base. As shown in FIGS. 26a and 26b, the electrically conductive metals 90 are fixed onto the electrically insulating base 91 with an adhesive agent 94 so that one end 90a of each of the electrically conductive metals 90 can be brought into contact with a work opening 93 side end of a corresponding conductive portion 92 provided on the electrically insulating base 91. Further, the one end 90a of the electrically conductive metal 90 is stuck to the opening 93 side end of the conductive portion 92 with solder 95, by which the electrically conductive metal and the conductive portion are electrically connected to each other. In the aforementioned method, the electrically conductive metals 90 are one by one fixed and soldered manually so that the arrangement of the bent pointed-end portions (microprobes) 90b of the electrically conductive metals 90 is adjusted to accord with the arrangement of bonding pads of an integrated circuit of wafer as a subject of the testing.

Each of the microprobes in the probe assembly is projected by a predetermined length out of a surface of the base to form a predetermined gap between the probe assembly and the tested base at the time of the testing of the base such as an integrated circuit of wafer or the like to thereby prevent the contact between the microprobe and the tested base from becoming poor in the case where foreign substances penetrate between the tested substrate and the probe assembly. In use of the probe assembly, a load of about 700 g is applied to each microprobe to prevent the contact between the microprobe and the tested substrate from becoming poor.

Therefore, high accuracy is required of the horizontal-direction and vertical-direction positions of the microprobes 90b at the time of the fixing and soldering of the electrically conductive metals 90 as shown in FIGS. 26a and 26b.

It is however difficult that the microprobes are arranged with high positional accuracy by the conventional technique in which the treatment of fixing and soldering the electrically conductive metals as precursors of microprobes onto the base is carried out by handwork. In particular, the probe assembly requires fining of the microprobes, high accuracy in positioning the microprobes and diversifying of the arrangement of the microprobes, with the advance of high integration and diversification in the integrated circuit of wafer as a subject of testing. There arises a problem in that a great skill and a large time are required for producing such a microprobe-provided circuit substrate by the conventional technique.

SUMMARY OF THE INVENTION

An object of the present invention is therefore to provide a microprobe-provided circuit substrate which can be used as a probe assembly, and in which microprobes can be arranged accurately at predetermined positions on an electrically insulating or semiconductive base without handwork.

Another object of the invention is to provide a method for producing a microprobe-provided circuit substrate satisfying the aforementioned objects.

In order to attain the foregoing objects, according to an aspect of the present invention, the microprobe-provided circuit substrate (hereinafter called "circuit substrate A") comprises: a base made of an inorganic electrically-insulating material or a semiconductive material and having a plurality of fine through holes; microprobes constituted by pillar-shaped conductors correspondingly respectively provided in the fine through holes, each of the microprobes having one end projected out of one surface of the base; and conductive portions provided on the other surface of the base and electrically connected to the respective microprobes. The term "pillar-shaped conductors" includes both solid type conductors and hollow type conductors.

In order to produce the circuit substrate A, according to another aspect of the present invention, the method (hereinafter called "Method I") of producing a microprobe-provided circuit substrate according to the invention comprises the steps of: providing fine through holes in a base made of an electrically insulating or semiconductive material; providing pillar-shaped conductors correspondingly respectively in the fine through holes; etching a surface portion of the base after providing the pillar-shaped conductors in the base to project one end of each of the pillar-shaped conductors project out of one surface of the base to thereby form microprobes; and providing conductive portions on the other surface of the base, an end of each conductive portion being electrically connected to an end of the corresponding one of the pillar-shaped conductors or the microprobes.

In this Method I, one end of each of the pillar-shaped conductors provided in the fine through holes provided in the base as described above is projected out of a surface of the base by etching a surface portion of the base to thereby form microprobes.

To attain a circuit substrate containing a large number of fine microprobes with the probe diameter of 300 $\mu$m or less and with high positional accuracy according to the Method I, the fine through holes may be preferably provided by a photolithographic process using thin photosensitive glass as the base. Further, an electroless plating method is suitable as means for providing pillar-shaped conductors in the fine through holes. Further, to improve adhesion between the conductor precipitated by the electroless plating method and the base, resin layers or the like may be preferably provided on inner walls of the fine through holes in advance.

However, in the case where the resin layers are provided around the pillar-shaped conductors, an etching solution between the resin layers and the base may penetrate when etching a surface portion of the base, so that grooves 83 having a V-shape in section may be produced between the base 82 and the resin layers 81 provided around microprobes 80 constituted by the pillar-shaped conductors as shown in FIG. 25. In the case where the etching solution penetrates between the pillar-shaped conductors and the base, the aforementioned V-shaped grooves are provided though there is no resin layer provided around the pillar-shaped conductors.

For this reason, in particular in the case where a thin base is used, the supporting of the microprobes may become unreliable and/or the strength of the microprobes may becomes insufficient, when the circuit substrate is used as a probe assembly which is loaded at the time of use thereof.

Therefore, to obtain a circuit substrate provided with microprobes securely supported and improved in strength in spite of use of a thin base, a microprobe-provided circuit (hereinafter called "circuit substrate B") having surface portions of a base protruded around the microprobes on the projecting end side of the microprobes can be preferably produced by the producing method (hereinafter called "Method II") according to a further aspect of the invention which further includes the step of protruding a surface portion of the base around one opening portion of each of the fine through holes or around one end surface of each of the pillar-shaped conductors, the base surface portion protruding step being carried out before the step of forming microprobes in the Method I, that is, the step of etching a surface portion of the base after providing the pillar-shaped conductors to project one end of each of the pillar-shaped conductors out of a surface of the base to thereby form microprobes.

By carrying out the step of protruding the surface portion of the base around one opening portion of each of the fine through holes or around one end surface of each of the pillar-shaped conductors by removing the other portion of the surface of the base by etching technique or the like before carrying out the step of projecting one end of each of the pillar-shaped conductors provided in the fine through holes out of the surface of the base by etching the surface portion of the base on this side, it is possible to produce a microprobe-provided circuit substrate in which a necessary gap can be secured between the base as a subject of testing and the circuit substrate when, for example, it is used as a probe assembly. Because the etching time required for projecting the pillar-shaped conductors in this case is shortened compared with the etching time required in the case of the Method I, the V-shaped grooves produced between the base and the resin layers around the pillar-shaped conductors and between the base and the pillar-shaped conductors become shallow.

According to the Method II, therefore, the contacting area sufficient to support the microprobes reliably can be secured between the base and the pillar-shaped conductors or between the base and the resin layers provided around the pillar-shaped conductors, regardless of the thinness of the base. In short, according to the Method II, it is possible to obtain the circuit substrate B more reliable in the supporting of the microprobes than the circuit substrate A according to the Method I. Further, because it is needless to take the projecting length of the microprobes so much, microprobes improved in strength can be formed. In short, according to the Method II, it is possible to obtain the circuit substrate B improved in the strength of the microprobes compared with the circuit substrate A according to the Method I.

Such a circuit substrate reliable in the supporting of microprobes regardless of the thinness of a base can be also obtained by the following method other than the Method II. In short, the above circuit substrate can be obtained by a method (hereinafter called "Method III") of producing a microprobe-provided circuit substrate, according to a further aspect of the present invention, which comprises: a first step of providing a plurality of pillar-shaped fine conductors in a base member having a base made of an inorganic electrically-insulating material or a semiconductive material, and a probe-forming auxiliary layer of a mono- or multi-layer structure provided on one surface of the base so that the pillar-shaped fine conductors extend from the base to the probe-forming auxiliary layer; a second step of removing a part or whole of the probe-forming auxiliary layer from the base member after providing the pillar-shaped fine conductors to thereby project one end of each of the pillar-shaped fine conductors out of the base or the base member after removing a part of the probe-forming auxiliary layer so as to form microprobes; and a third step of providing conductive portions on the other surface of the base, an end of each conductive portion being electrically connected to an end of the corresponding one of the pillar-shaped fine conductors or microprobes.

According to this Method III, microprobes can be formed by projecting one end of each of the pillar-shaped fine conductors out of a surface of the base or base member with no necessity of etching a surface portion of the base. Accordingly, there is no V-shaped groove produced between the base and the rein layers around the pillar-shaped fine conductors or between the base and the pillar-shaped fine conductors. Accordingly, even in the case where a thin base is used, the microprobes can be formed while securing the contacting area sufficient to support the pillar-shaped fine conductors, that is, sufficient to support the microprobes, between the base and the pillar-shaped fine conductors or between the base and the resin layers around the pillar-shaped conductors. Accordingly, it is possible to obtain a microprobe-provided circuit substrate in which the microprobe are supported by the base reliably.

It is preferable that the aforementioned first step includes the steps of: providing fine through holes in a base; providing first pillar-shaped fine conductors correspondingly respectively in the fine through holes; providing the mono- or multi-layer structure probe-forming auxiliary layer on the one surface of the base, the probe-forming auxiliary layer having fine through holes being in one-to-one correspondence to the first pillar-shaped fine conductors and exposing one end surface of each of the fine conductors; and providing second pillar-shaped fine conductors united with the first pillar-shaped fine conductors correspondingly respectively in the fine through holes of the probe-forming auxiliary layer (hereinafter, this producing method being called "Method IIIa"). Further, at this time, it is particularly preferable to use photoresist as a material of a part or whole of the probe-forming auxiliary layer.

Alternatively, it is preferable that the aforementioned first step includes the steps of: providing first fine through holes in a base; providing the mono- or multi-layer structure probe-forming auxiliary layer on the one surface of the base, the probe-forming auxiliary layer having second fine through holes communicated in one-to-one correspondence with the first fine through holes provided in the base; and providing the pillar-shaped fine conductors correspondingly respectively in the first and second fine through holes communicated with each other across the base and the probe-forming auxiliary layer so that the pillar-shaped fine conductors extend from the base to the probe-forming auxiliary layer (hereinafter, this producing method being called "Method IIIb").

Such a circuit substrate reliable in the supporting of microprobes regardless of the thinness of a base can be also obtained by the following method other than the foregoing Methods II and III. That is, the above circuit substrate can be obtained by a method (hereinafter called "Method IV") of producing a microprobe-provided circuit substrate, according to a still further aspect of the present invention, which comprises the steps of: providing fine through holes in a base made of an inorganic electrically-insulating material or a semiconductive material; providing pillar-shaped conductors correspondingly respectively in the fine through holes so that at least one end of each of the pillar-shaped conductors substantially flushes with one surface of the base; accumulating a conductor on the one end of each of the pillar-shaped conductors by plating treatment to thereby project the one end of each of the pillar-shaped conductors out of the one surface of the base so as to form microprobes; and providing conductive portions on the other surface of the base, an end of each conductive portion being electrically connected to an end of the corresponding one of the pillar-shaped conductors or microprobes.

Also in this Method IV, microprobes can be formed by projecting one end of each of the pillar-shaped conductors out of a surface of the base with no necessity of etching a surface portion of the base. Accordingly, even in the case where a thin base is used, the microprobes can be formed while securing the contacting area sufficient to support the pillar-shaped conductors, that is, sufficient to support the microprobes, between the base and the pillar-shaped conductors or between the base and the resin layers around the pillar-shaped conductors. Accordingly, it is possible to obtain a microprobe-provided circuit substrate in which the microprobe are supported by the base reliably.

By carrying out the step of protruding a surface portion of the base around one opening portion of each of the fine through holes or around one end surface of each of the first pillar-shaped fine conductors before the step of providing the mono- or multi-layer structure probe-forming auxiliary layer in the Method IIIa, the same circuit substrate B reliable in the supporting of the microprobes and improved in the strength thereof as obtained by the Method II can be obtained by the Method III.

By carrying out the step of protruding a surface portion of the base around one opening portion of each of the fine through holes before the step of providing the mono- or multi-layer structure probe-forming auxiliary layer in the Method IIIb, the same circuit substrate B reliable in the supporting of the microprobes and improved in the strength thereof as obtained by the Method II can be also obtained by the Method III.

By carrying out the step of protruding a surface portion of the base around one opening portion of each of the fine through holes or around one end surface of each of the pillar-shaped fine conductors before the step of projecting one end of each of the pillar-shaped conductors out of a surface of the base to form microprobes in the Method IV, the same circuit substrate B reliable in the supporting of the microprobes and improved in the strength thereof as obtained by the Method II can be obtained by the Method IV.

In any one of the Methods II, IIIa, IIIb and IV, it is particularly preferable that the fine through holes are provided in the same manner as in the Method I, by a photolithographic process using thin photosensitive glass as the base, to obtain a circuit substrate containing a large number of fine microprobes with the probe diameter of 300 $\mu$m or less and with high positional accuracy. Further, the same electroless plating technique as in the Method I is preferably used as means of providing pillar-shaped conductors in the fine through holes.

In the case where the base in the circuit substrate A or the circuit substrate B prepared by the Method I or the Method IV is made of an inorganic electrically-insulating material or a semiconductive material relatively low in mechanical strength such as thin photosensitive glass under the condition that the circuit substrate is used as a probe assembly loaded at the time of the use thereof, the base cannot endure the load so that it may be broken. It is, therefore, preferable that a reinforcement substrate made of an electrically insulating or a semiconductive material is stuck onto a surface of each of the circuit substrates A and B to improve durability of the circuit substrates A and B and, accordingly, improve reliability thereof.

Accordingly, any one of the Methods I through IV preferably includes the step of providing a reinforcement substrate made of an electrically insulating or semiconductive material, on a surface of the base.

Because the circuit substrate A or the circuit substrate B can be electrically connected to external test apparatus (hereinafter referred to as "test apparatus") through connection terminals having one-to-one correspondence to the conductive portions provided on a surface of the base to electrically connect the conductive portions to test apparatus, these circuit substrates A and B may have such connection terminals provided in advance.

Accordingly, any one of the Methods I through IV may include the step of providing connection terminals having one-to-one correspondence to the conductive portions provided on a surface of the base to thereby electrically connect the circuit patterns to test apparatus.

Because a material having a relatively low thermal expansion coefficient, for example such as an inorganic electrically insulating material or a semiconductor material, is used as the base, the positional accuracy of microprobes provided in the circuit substrates A and B is relatively stable against the thermal change in the surroundings or the outer atmosphere.

BRIEF DESCRIPTION OF THE DRAWINGS

FIGS. 16*a* to 16*f* are sectional views showing typically a further example of procedure carried out till the step of forming microprobes in the case where the circuit substrate A is produced according to the Method IIIb;

DETAILED DESCRIPTION OF THE PREFERRED EMBODIMENTS

Examples of the present invention will be described below with reference to the drawings.

EXAMPLE 1

Production of Circuit Substrate A according to Method I

An $Li_2O$—$Al_2O_3$—$SiO_2$(Au, Ce) chemically machinable photosensitive glass base (tradename: PEG3, made in HOYA Corp.) with the size of $100 \times 100 \times 0.5$ mm was used as a base made of an inorganic electrically insulating material. The chemically machinable photosensitive glass base (hereinafter merely called "photosensitive glass base") was subjected to exposure treatment (using an He-Xe lamp) using a predetermined mask, developing treatment (heat treatment) under the conditions of about 500° C. and an hour, etching treatment (acid treatment) with a solution of 5% hydrofluoric acid, and rinsing treatment with pure water as a step of providing a plurality of fine through holes. Thus, as typically shown in FIG. 1*a*, fine through holes 1 (420 holes in total) each having an opening diameter of 80 $\mu$m were arranged at intervals of 20 $\mu$m in the form of a regular square (in which the length of one side was taken as about 9 mm) in the central portion of the chemically machinable photosensitive glass base 2.

Figure 1A:
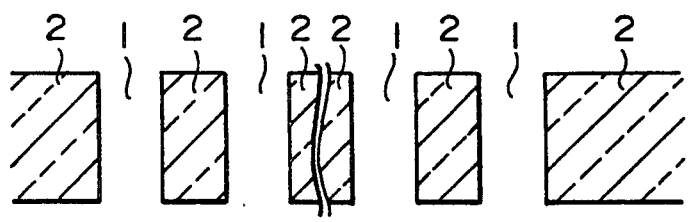
FIGS. 1a to 1l; are sectional views showing typically an example of procedure for producing the circuit substrate A according to the Method I.
Figure 1B:
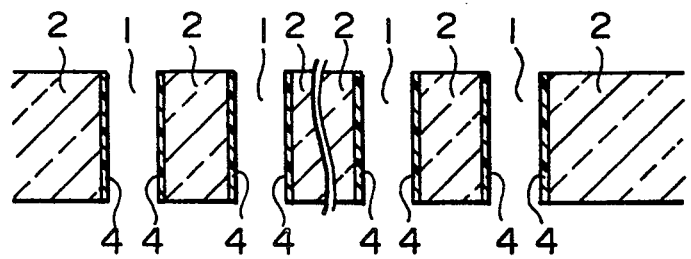

Then, a step of providing pillar-shaped conductors respectively in the fine through holes 1 was conducted as follows. First of all, as shown in FIG. 1*b*, epoxy resin layers 4 were provided respectively on inner walls of the fine through holes 1 by wetting the inner walls of the fine through holes 1 provided in the photosensitive glass base 2 with a solution prepared by dissolving an epoxy resin adhesive agent in acetone (in which epoxy resin adhesive agent and acetone were mixed in the volume proportion 1:30); and then drying the inner walls. The epoxy resin layers 4 were provided to improve adhesion in the case where metal precipitated by electroless plating (which will be described later) adhered onto the photosensitive glass base 2.

Figure 1C:
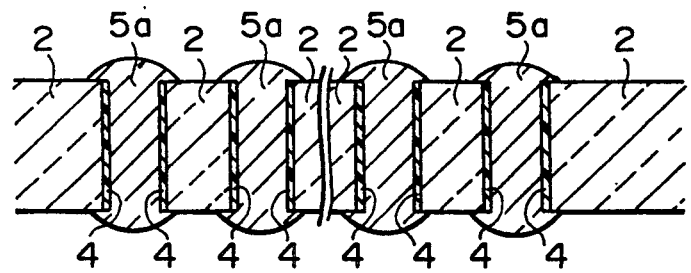

Then, the photosensitive glass base 2 having the epoxy resin layers 4 was subjected to electroless Ni-P plating (partial plating) treatment to form Ni-P layers 5a on the epoxy resin layers 4 in the fine through holes 1 and out of the openings of the fine through holes 1 with respect to the two surfaces of the photosensitive glass base 2 as shown in FIG. 1c. Thus, the fine through holes 1 were blocked with the Ni-P layers 5a, respectively. The electroless Ni-P plating treatment was perfected by successively carrying out (1) activation, (2) catalyst addition, (3) catalyst activation and (4) electroless plating as follows.

(1) Activation

A solution having the pH value adjusted to 8.8 by adding a hydrochloric acid to an activating agent (tradename: ITO Reductor, made in Okuno Chemical Industry Co., Ltd.) was diluted with pure water to prepare a solution with a concentration of 200 ml/l. The photosensitive glass base 2 was immersed in the resulting solution at a liquid temperature of 45° C. for 2 minutes and then washed with pure water.

(2) Catalyst Addition

A mixture solution (tradename: ITO Catalyst, made in Okuno Chemical Industry Co., Ltd.) of vanadium chloride and tin chloride in a hydrochloric acid, a buffer (tradename: ITO-SAL, made in Okuno Chemical Industry Co., Ltd.) and a solution of 35% hydrochloric acid were mixed in pure water in the amounts of 60 ml/l, 50 g/l and 150 ml/l to prepare a solution. The photosensitive glass base 2 was immersed in the resulting solution at a liquid temperature of 35° C. for 6 minutes and then washed with pure water.

(3) Catalyst Activation

A catalyst activating agent (tradename: ITO Accelerator, made in Okuno Chemical Industry Co., Ltd.) was diluted with pure water to prepare a solution with a concentration of 200 ml/l. The photosensitive glass base 2 was immersed in the resulting solution at a liquid temperature of 25° C. for 2 minutes and then washed with pure water.

(4) Electroless Plating

A reducing agent (tradename: ITO-90-M, made in Okuno Chemical Industry Co., Ltd.) and a nickel salt aqueous solution (tradename: ITO-90-I, Okuno Chemical Industry Co., Ltd.) containing $Ni^{2+}$ ions and pyrophosphate ions (reducing agent) were mixed in pure water in the amounts of 100 ml/l and 50 ml/l to prepare a solution. The photosensitive glass base 2 was immersed in the resulting solution at a liquid temperature of 80° C. for about 10 hours and then washed with pure water. The precipitating rate in the aforementioned reaction was about 1 μm per 10 minutes.

Figure 1D:
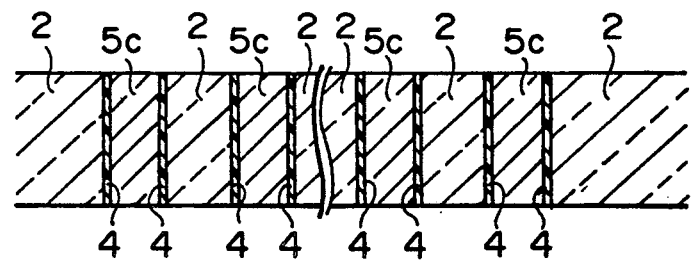

Thereafter, Ni-P being attached to the surfaces of the photosensitive glass base 2 in the neighbors of the openings of the fine through holes 1 was polished/removed with an abrasive agent of cerium oxide and then washed. Thus, Ni-P pillar-shaped matters 5c each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the fine through holes 1 as shown in FIG. 1d.

Figure 1E:
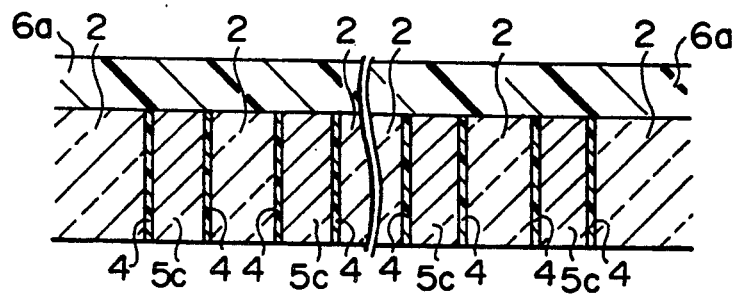
Figure 1F:
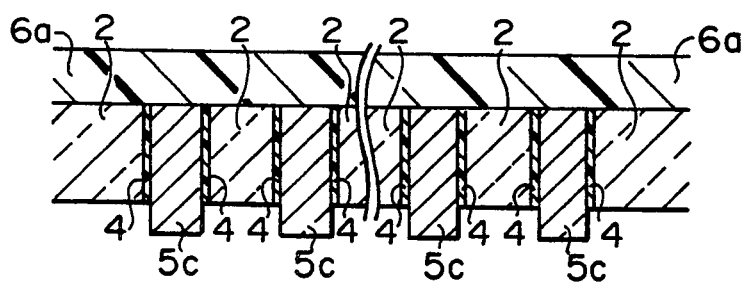

Then, the following procedure was carried out as a step of forming microprobes by etching a surface portion of the photosensitive glass base 2 after providing the Ni-P pillar-shaped matters 5c, to make one end of each of the Ni-P pillar-shaped matters 5c project out of a surface of the photosensitive glass base 2. First of all, as shown in FIG. 1e, vinyl tape 6a as a protective layer was stuck to one surface of the photosensitive glass base 2 containing the Ni-P pillar-shaped matters 5c. Then, etching treatment was applied to the photosensitive glass base 2 by immersing the photosensitive glass base 2 in a solution of 50% hydrofluoric acid (liquid temperature: 20° C.) for 3 minutes. The surface of the photosensitive glass base 2 which was not covered with the vinyl tape 6a was removed by a thickness of 30 μm by the etching treatment, so that the Ni-P pillar-shaped matters 5c projected 30 μm out of the newly formed surface of the base at the surface side which was not covered with the vinyl tape 6a, as shown in FIG. 1f. The Ni-P pillar-shaped matters 5c each having one projecting end were formed as microprobes (hereinafter called "microprobes 20a").

Figure 1G:
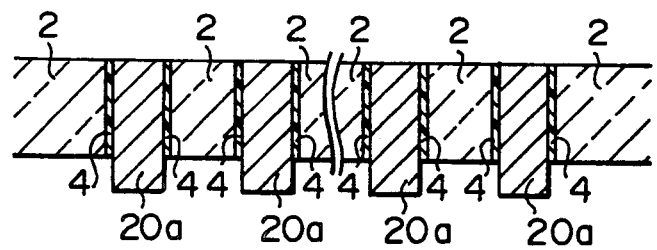

Then, the vinyl tape 6a was torn off and then the photosensitive glass base 2 was washed with pure water and isopropyl alcohol. Thus, a photosensitive glass base 2 having microprobes 20a formed by projection of a part of each of the Ni-P pillar-shaped matters 5c provided in the fine through holes 1 was prepared as shown in FIG. 1g.

Figure 1H:
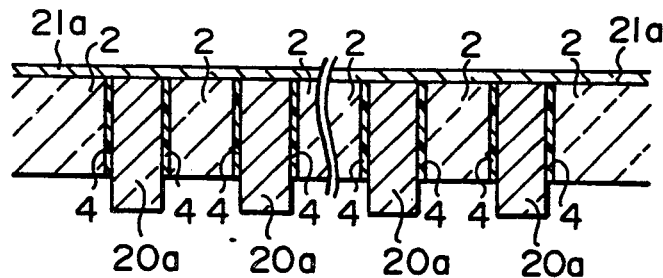
Figure 1:
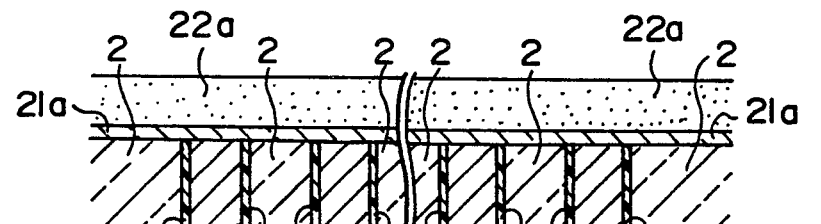
Figure 1:
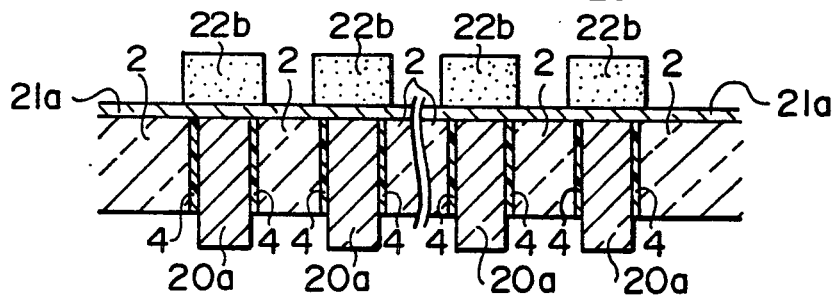
Figure 1:
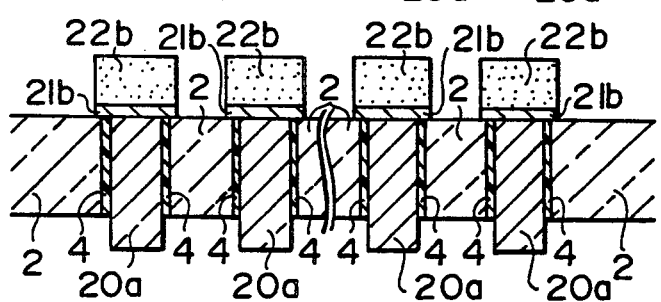
Figure 1:
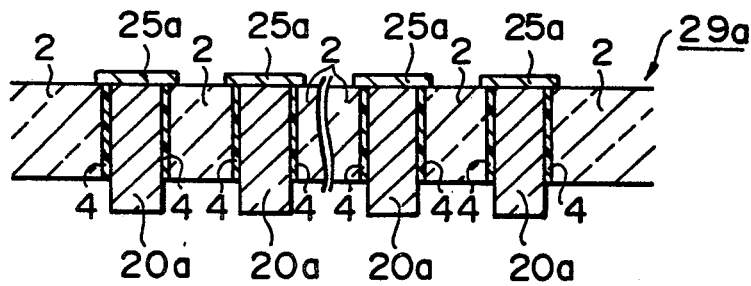

Then, the following procedure was carried out as a step of providing conductive portions on a surface of the photosensitive glass base 2, whereby an end of each conductive portion was electrically connected to an end of the corresponding one of the microprobes 20a. First of all, as shown in FIG. 1h, a 1000 Å-thick ITO (indium-tin oxide) film 21a was formed by a DC magnetron sputtering method, on a surface of the photosensitive glass base 2 opposite to the etched surface thereof.

After the ITO film 21a was formed, a photoresist layer 22a as shown in FIG. 1i was formed on the ITO film 21a by using a spinner and baked for an hour.

Then, contact exposure treatment and developing treatment were carried out by using a photomask having a predetermined pattern to thereby prepare resist patterns 22b on the ITO film 21a as shown in FIG. 1j.

The photosensitive glass base 2 having the resist patterns 22b was immersed in a solution which consists of 1:1 mixture of a 40 Be $FeCl_3$ aqueous solution and a 35% HCl aqueous solution, for 12 hours to thereby etch the ITO film 21a masked with the resist patterns 22b to thereby prepare ITO film patterns 21b corresponding to the resist patterns 22b as shown in FIG. 1k.

Then, the resist patterns 22b were torn off to form on the surface of the photosensitive glass base 2 a plurality of monolayer-structure conductive portions (hereinafter called "conductive portions 25a") each having a linear width of 85 μm and constituted by an ITO film pattern 21b having an end portion on one end surface of a corresponding microprobe 20a, as shown in FIG. 1l. Thus, a circuit substrate 29a was prepared as circuit substrate A according to Method I.

Figure 2:
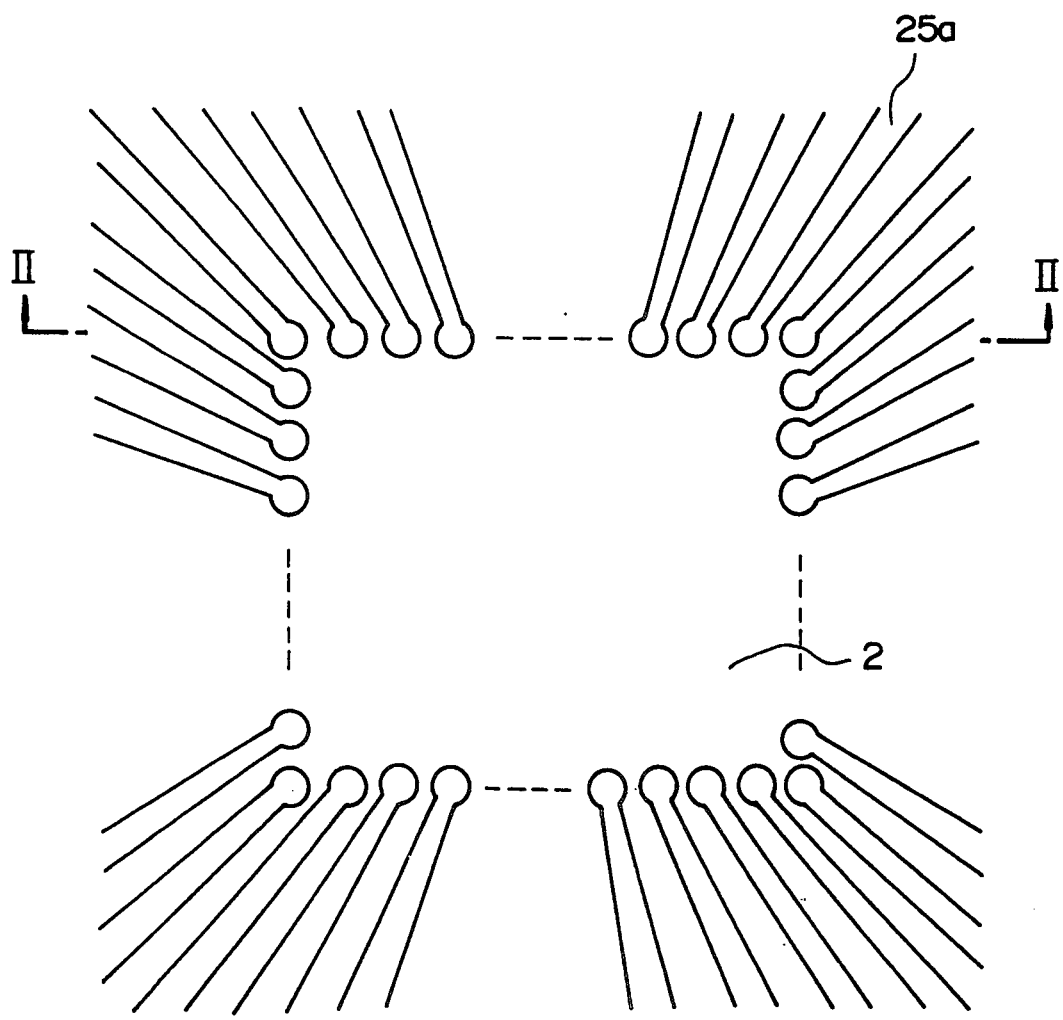
FIG. 2 is an enlarged view showing typically the upper surface in the vicinity of a central portion of the circuit substrate A depicted in FIG. 1*l*.

FIG. 2 is typically showing a top plan view of a central portion (in which fine through holes 1 are provided) of the circuit substrate 29a seen at a surface side where conductive portions 25a are provided. FIGS. 1a through 1l are sectional views taken along the line II—II of FIG. 2 and typically showing a part of the section. In FIGS. 2 and 1l, items the same as or similar to each other are referenced correspondingly.

The circuit substrate 29a thus prepared was subjected to the following continuity test. The electrical continuity between the end portions of the conductive portions 25a constituted by the ITO film patterns 21b and the microprobes 20a was tested by using a tester. It was found from the continuity test that they were perfectly continuous to each other with electric resistance of 40Ω.

Figure 3:
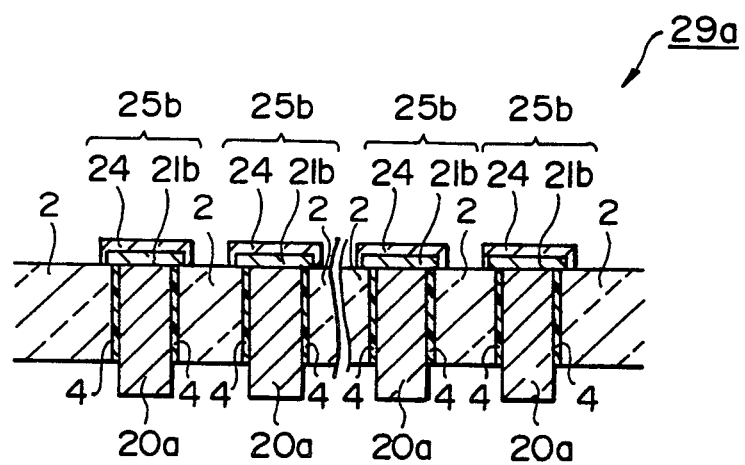
FIG. 3 is a sectional view showing typically an example of the microprobes and conductive portions of the circuit substrate A.

The electric resistance between the conductive portions 25a and the microprobes 20a can be reduced to a smaller value by changing the structure of the conductive portions to a two-layer structure (hereinafter called "conductive portions 25b") formed by providing an Ni-P layer 24 on the outside of the respective ITO film pattern 21b as shown in FIG. 3. The Ni-P layer 24 may be formed in the same manner as in the electroless Ni-P plating (partial plating) treatment used in the aforementioned method of producing a microprobe-provided circuit substrate. In FIG. 3, the same reference numerals as in FIG. 1l are given to like parts, except the conductive portion 25b and the Ni-P layer 24 in FIG. 3.

EXAMPLE 2

Production of Circuit Substrate A according to Method I

A chemically machinable photosensitive glass base of the same quality and the same shape as in Example 1 was used as a base made of an inorganic electrically insulating material. The chemically machinable photosensitive glass base (hereinafter called "photosensitive glass base") was subjected to exposure treatment (using an He-Xe lamp) using a predetermined mask, developing treatment (heat treatment) under the conditions of about 500° C. and an hour, etching treatment (acid treatment) with a solution of 5% hydrofluoric acid, and rinsing treatment with pure water as a step of providing a plurality of fine through holes. Thus, as typically shown in FIG. 4a, fine through holes 1 each having an opening diameter of 50 μm were arranged at intervals of 80 μm in the form of a regular square (in which the length of one side was taken as about 9 mm) in the central portion of the photosensitive glass base 2. (In this specification, like parts are identified by the same reference numeral regardless of the difference in shape and size if the parts can have the same function and can be used for the same purpose.) At the same time, a plurality of terminal-forming through holes 3 each having an opening diameter of 420 μm were arranged at equal intervals with separation of 5 mm from sides of the photosensitive glass base 2. The terminal-forming through holes 3 were provided so as to respectively correspond to the fine through holes 1.

Figure 4A:
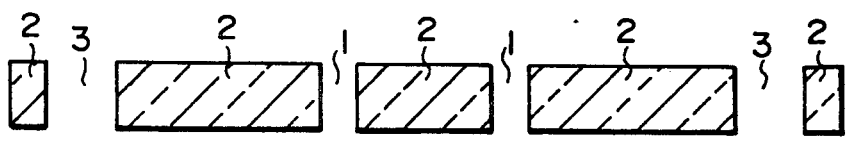
FIGS. 4*a* to 4*o* are sectional views showing typically another example of procedure for producing the circuit substrate A according to the Method I.
Figure 4B:
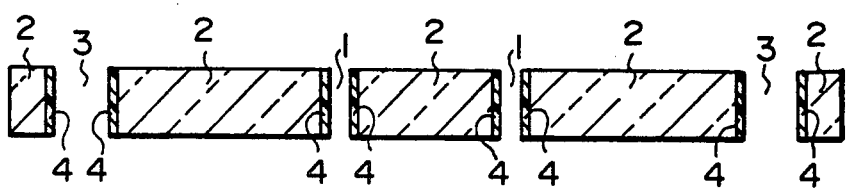

Then, a step of providing pillar-shaped conductors respectively in the fine through holes 1 was conducted as follows. First of all, as shown in FIG. 4b, epoxy resin layers 4 were provided respectively on inner walls of the fine through holes 1 in the same manner as in Example 1. At the same time, epoxy resin layers 4 were provided respectively on inner walls of the terminal-forming through holes 3 in the same manner as described above. The epoxy resin layers 4 were provided to improve adhesion in the case where metal precipitated by electroless plating (which will be described later) adhered onto the photosensitive glass base 2.

Figure 4C:
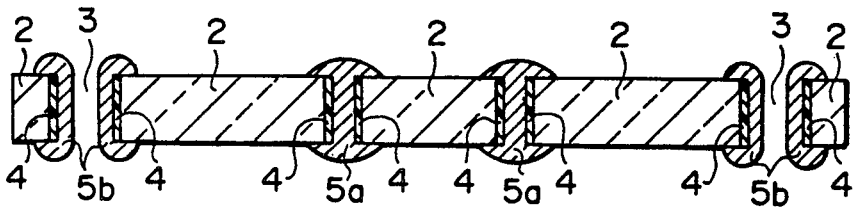

Then, the photosensitive glass base 2 having the epoxy resin layers 4 was subjected to electroless Ni-P plating (partial plating) treatment in the same manner as in Example 1 except that the time for precipitation in the treatment was changed from about 10 hours to about 6 hours, to form Ni-P layers 5a on the epoxy resin layers 4 in the fine through holes 1 and out of the openings of the fine through holes 1 with respect to the two surfaces of the photosensitive glass base 2 as shown in FIG. 4c. Thus, the fine through holes 1 were blocked with the Ni-P layers 5a, respectively. At the same time, Ni-P layers 5b were precipitated on the epoxy resin layers 4 in the terminal-forming through holes 3 and in the neighbors of the openings of the terminal-forming through holes 3 with respect to the two surfaces of the photosensitive glass base 2 with no blockade of the terminal-forming through holes 3.

Figure 4D:
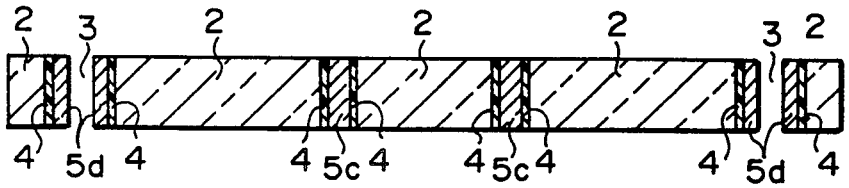

Thereafter, Ni-P being attached to the surfaces of the photosensitive glass base 2 in the neighbors of the openings of the fine through holes 1 was polished/removed with an abrasive agent of cerium oxide and then washed. Thus, Ni-P pillar-shaped matters 5c each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the fine through holes 1 as shown in FIG. 4d. Further, Ni-P being attached to the surfaces of the photosensitive glass base 2 in the neighbors of the openings of the terminal-forming through holes 3 was polished/removed and washed in the same manner as described above. Thus, Ni-P hollow pillar-shaped matters 5d each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the terminal-forming through holes 3 as shown in FIG. 4d.

Figure 4E:
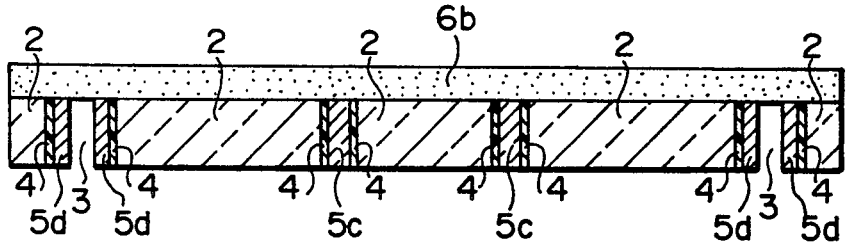

Then, the following procedure was carried out as a step of forming microprobes by etching a surface portion of the photosensitive glass base 2 after providing the Ni-P pillar-shaped matters 5c, to make one end of each of the Ni-P pillar-shaped matters 5c project out of a surface of the photosensitive glass base 2. First of all, as shown in FIG. 4e, a resist film (tradename: Fuji Banx Dry Film-Photoresist A-425, made in Fuji Hunt Electronics Technology Co., Ltd.) 6b as a protective layer having high additive strength to glass was stuck to one surface of the photosensitive glass base 2 having the Ni-P pillar-shaped matters 5c.

Figure 4F:
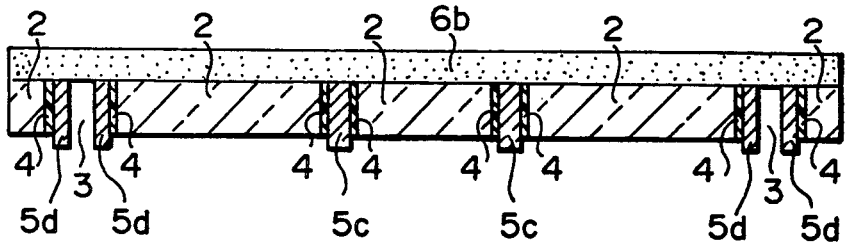

Then, the photosensitive glass base 2 having one surface covered with the resist film 6b was immersed in a solution of 50% hydrofluoric acid for 3 minutes to apply etching treatment to the photosensitive glass base 2. The surface of the photosensitive glass base 2 which was not covered with the resist film 6b was removed by a thickness of 15 μm by the etching treatment, so that the Ni-P pillar-shaped matters 5c projected 15 μm out of the newly formed surface of the base at the surface side which was not covered with the resist film 6b, as shown in FIG. 4f. The Ni-P pillar-shaped matters 5c each having one projecting end were formed as microprobes (hereinafter called "microprobes 20a").

After the etching treatment, the resist film 6b was torn off and then the photosensitive glass base 2 was successively washed with acetone, isopropyl alcohol and freon vapor. Thus, a photosensitive glass base 2 having microprobes 20a was prepared as shown in FIG. 4g.

Then, the following procedure was carried out as a step of providing conductive portions on a surface of the photosensitive glass base 2, whereby an end of each conductive portion was electrically connected to an end of the corresponding one of the microprobes 20a. First of all, the projections of the Ni-P hollow pillar-shaped matters 5d formed in the terminal-forming through holes 3 by etching a surface of the photosensitive glass base 2 so as to be out of a newly formed surface of the photosensitive glass base 2 were polished/removed with an abrasive agent of cerium oxide and then washed. Thus, the Ni-P hollow pillar-shaped matters 5d each having one end surface substantially flush with the surface of the photosensitive glass base 2 newly formed by the etching were prepared as shown in FIG. 4h.

Then, as shown in FIG. 4h, a 1000 Å-thick ITO (indium-tin oxide) film 21a was formed in the same manner as in Example 1, on a surface of the photosensitive glass base 2 opposite to the etched surface thereof to thereby prepare a photosensitive glass base 2 having one surface covered with the ITO film 21a (sheet resistance: 30–40Ω per unit area) except for the opening portions of the Ni-P hollow pillar-shaped matters 5d provided in the terminal-forming through holes 3.

After the ITO film 21a was formed, an about 10000 Å-thick photoresist layer 22a as shown in FIG. 4i was provided on the ITO film 21a by spin-coating a photoresist film (tradename: Hoechst AZ1350, made in Hoechst Japan Ltd.) onto the ITO film 21a and was baked at 90° C. for 30 minutes.

Then, contact exposure treatment and developing treatment were carried out by using a photomask having a predetermined pattern to thereby prepare resist patterns 22b on the ITO film 21a as shown in FIG. 4j. The resist patterns 22b were baked at 220° C. for 30 minutes.

The photosensitive glass base 2 having the resist patterns 22b thus baked was immersed in a solution (liquid temperature: 50° C.) which consists of 1:1 mixture of a 40 Be FeCl$_3$ aqueous solution and a 36% HCl aqueous solution, for about one minute to thereby etch the ITO film 21a masked with the resist patterns 22b to thereby prepare ITO film patterns 21b corresponding to the resist patterns 22b as shown in FIG. 4k.

Then, after rinsing treatment with pure water, the resist patterns 22b were torn off by using an organic solvent (isopropyl alcohol) to form on the surface of the photosensitive glass base 2 a plurality of ITO film patterns 21b to be electrically connected to one end of each of the microprobes 20a as shown in FIG. 4l. Not only each of the ITO film patterns 21b was electrically connected to one end of a corresponding microprobe 20a but it was electrically connected to one of the Ni-P hollow pillar-shaped matters 5d provided in the terminal-forming through holes 3 to have one-to-one correspondence to the microprobes 20a.

Then, to reduce electric resistance between the ITO film patterns 21b and the microprobes 20a, Ni-P layers were respectively provided on the ITO film patterns 21b by the following procedure.

Figure 4M:
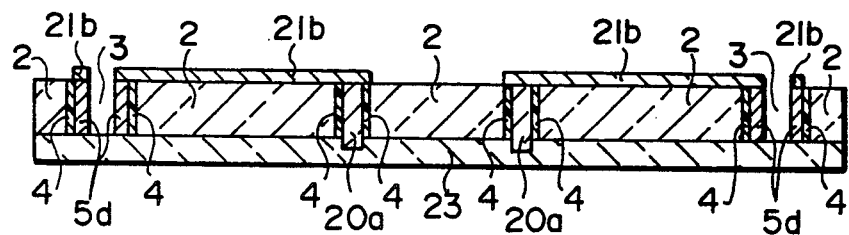

As shown in FIG. 4m, a protective transparent adhesive tape 23 was stuck onto a surface of the photosensitive glass base 2 in the side of the projecting ends of the microprobes 20a.

Figure 4N:
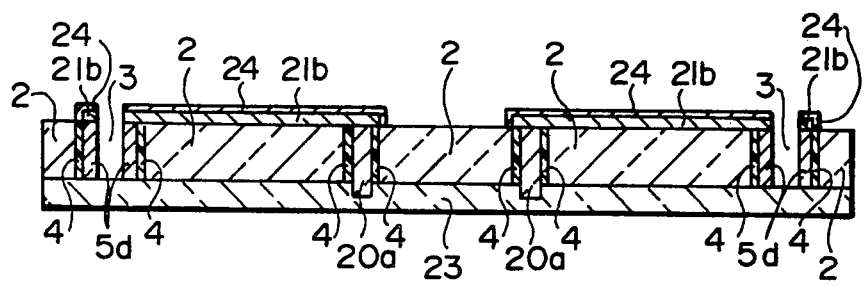

Then, 2 μm-thick Ni-P layers 24 as shown in FIG. 4n were precipitated on the outer surface of the respective ITO film patterns 21b in the same manner as the Ni-P layers 5a and 5b. The time required for the electroless plating was 20 minutes. The Ni-P layers were precipitated on the inner walls of the terminal-forming through holes 3. (Hereafter, these Ni-P layers were not shown in figures.)

Figure 4O:
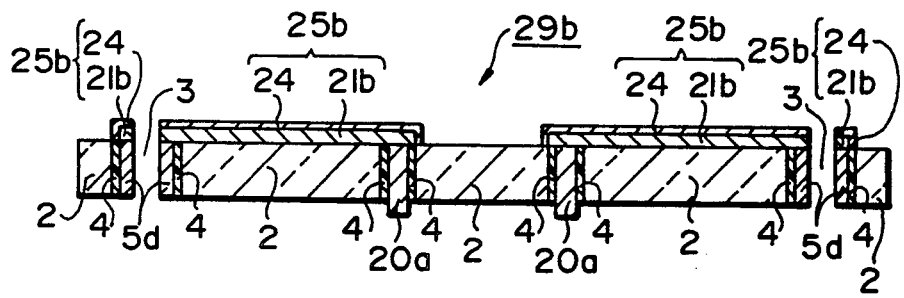

After the Ni-P layers 24 were precipitated, the transparent adhesive tape 23 was torn off to form on the photosensitive glass base 2 a plurality of conductive portions 25b each having a two-layer structure formed by applying an Ni-P layer 24 on the outer surface of an ITO film pattern 21b so as to be electrically connected to one end of the respective microprobe 20a, as shown in FIG. 4o. Thus, a circuit substrate 29b was prepared as circuit substrate A according to Method I.

Figure 5A:
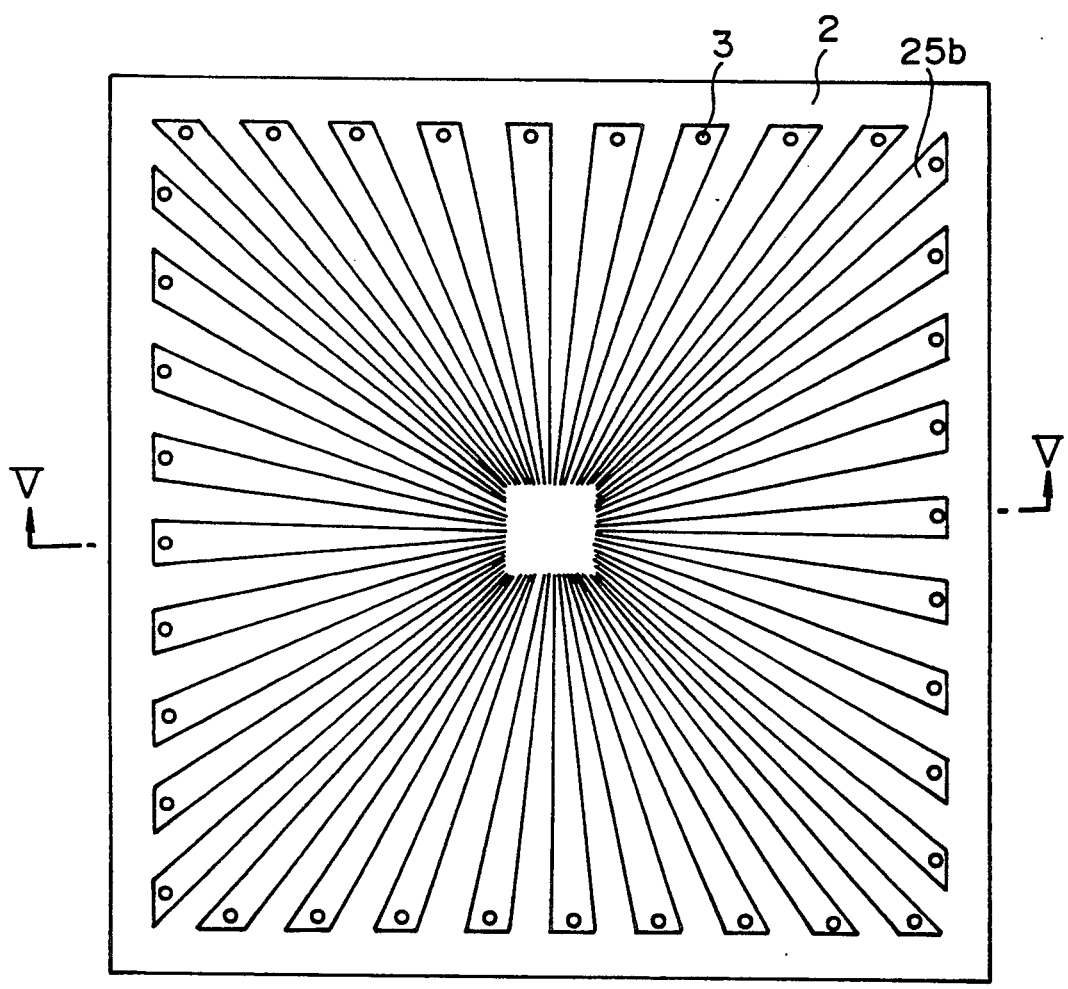
FIG. 5*a* is a top view showing typically the circuit substrate A prepared in Embodiment 2.
Figure 5B:
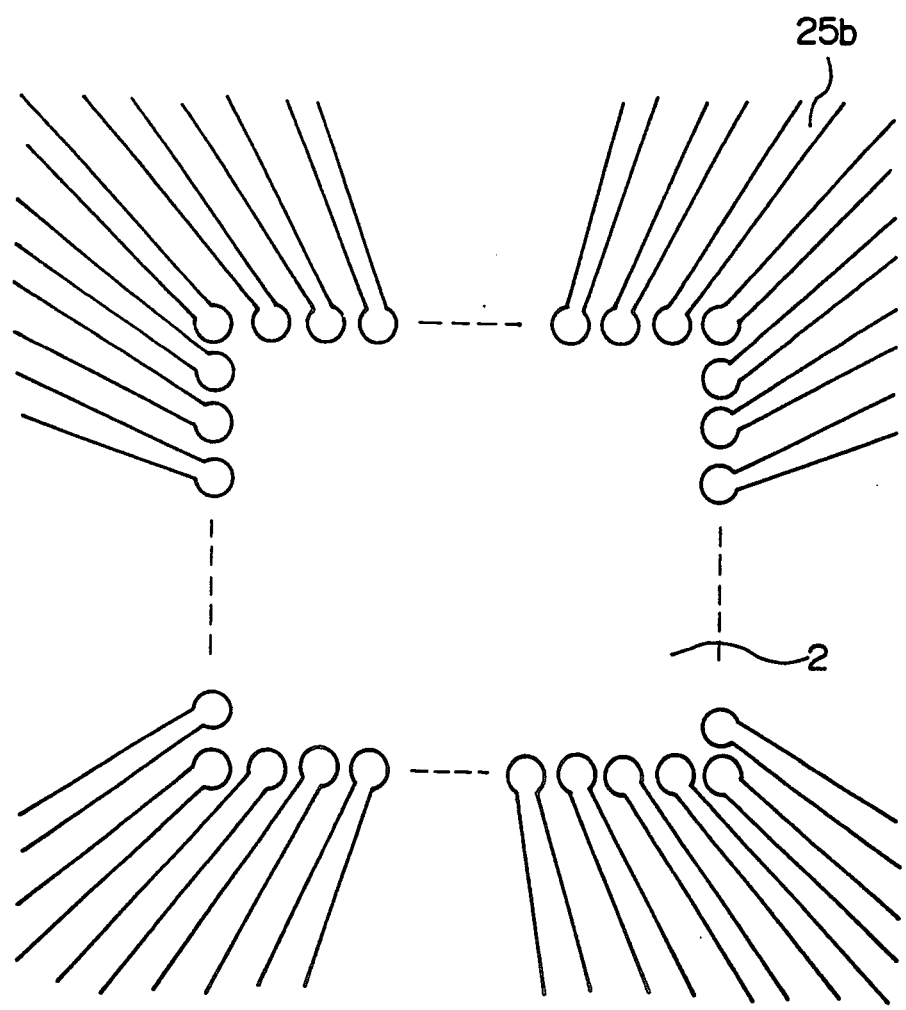
FIG. 5*b* is an enlarged view showing typically the upper surface in the vicinity of a central portion of the circuit substrate A depicted in FIG. 5*a*.

FIG. 5a is typically showing a top plan view of the circuit substrate 29a seen at a surface side where conductive portions 25b are provided. FIG. 5b is an enlarged view of a central portion (in which fine through holes 1 are provided) of the circuit substrate 29a depicted in FIG. 5a. FIGS. 4a through 4o are sectional views taken along the line V—V of FIG. 5a and typically showing a part of the section. In FIGS. 5a, 5b and 4o, items the same as or similar to each other are referenced correspondingly.

Then, a step of providing a reinforcement substrate made of an electrically insulating or semiconductive material on a surface of the photosensitive glass base 2 was carried out by the following procedure.

Figure 6A:
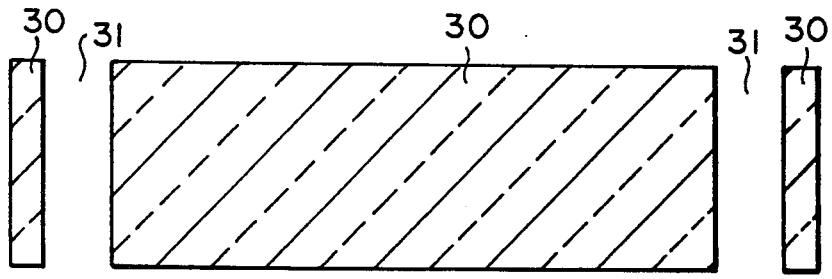
FIGS. 6*a* to 6*g* are sectional views showing typically an example of procedure for providing a reinforcement substrate on the circuit substrate A depicted in FIG. 4*o*.

An Li$_2$O—Al$_2$O$_3$—SiO$_2$ (Au, Ce) chemically machinable photosensitive glass plate (tradename: PEG3, made in HOYA Corp.) with the size of 100×100×2 mm was used as a reinforcement substrate material. The chemically machinable photosensitive glass plate (hereinafter merely called "photosensitive glass plate") was successively subjected to exposure treatment using a predetermined mask, developing treatment (heat treatment), etching treatment (acid treatment) and rinsing treatment in the same manner as described above in the step of providing a plurality of fine through holes 1 in the photosensitive glass base 2. Thus, as shown in FIG. 6a, through holes 31 each having an opening diameter of 420 μm were arranged at equal intervals with separation of 5 mm from sides of the photosensitive glass plate 30. The through holes 31 were provided so as to respectively correspond to the terminal-forming through holes 3 provided in the photosensitive glass base 2 constituting the circuit substrate 29b.

Figure 6B:
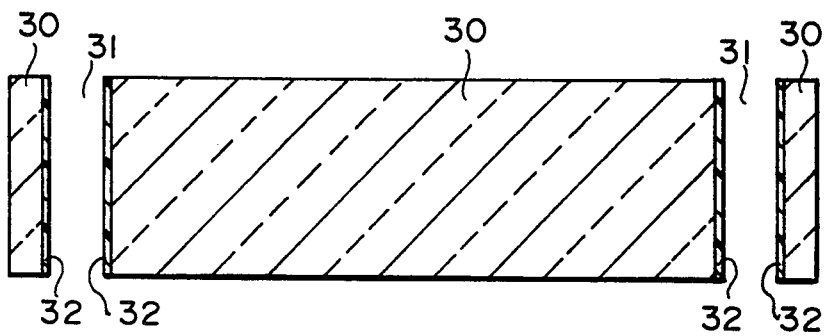
Figure 6C:
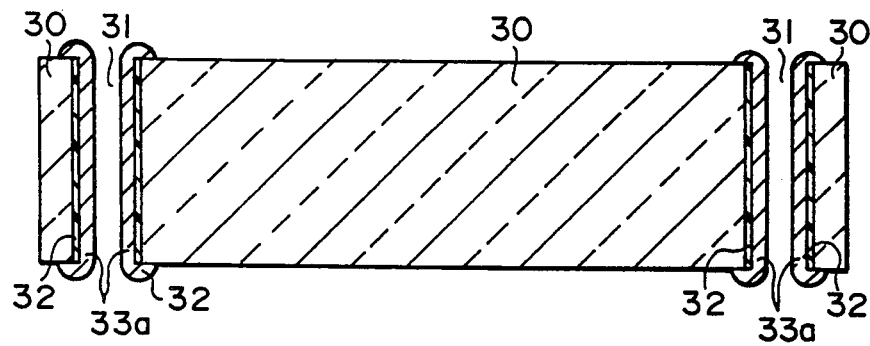

After the through holes 31 were provided in the photosensitive glass plate 30, Ni-P layers 33a were formed in the same manner as described above in the step of providing pillar-shaped conductors 5c in the fine through holes 1. First of all, as shown in FIG. 6b, epoxy resin layers 32 were provided respectively on inner walls of the through holes 31 provided in the photosensitive glass plate 30. Then, electroless Ni-P plating (partial plating) treatment was applied to the photosensitive glass plate 30 containing the epoxy resin layers 32. Thus, Ni-P layers 33a as shown in FIG. 6c were prepared on the epoxy resin layers 32 in the through holes 31 and on the surfaces of the photosensitive glass plate 30 in the neighbors of the openings of the through holes 31 without blockade of the through holes 31, respectively.

Figure 6D:
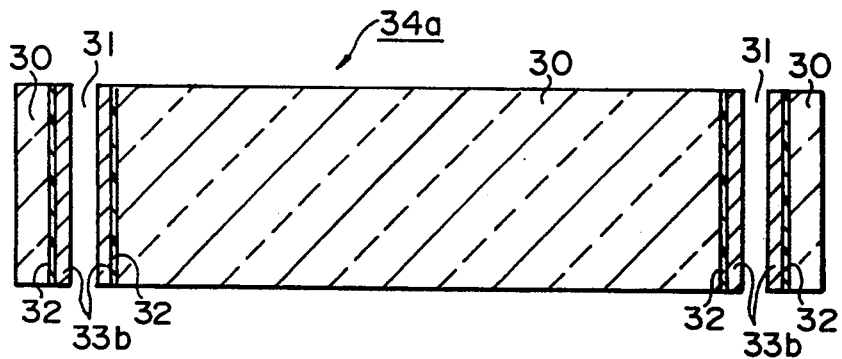

Thereafter, Ni-P being attached to the surfaces of the photosensitive glass plate 30 in the neighbors of the openings of the through holes 31 was polished/removed with an abrasive agent of cerium oxide and then washed. Thus, Ni-P hollow pillar-shaped matters 33b each having one end surface substantially flush with the upper surface of the photosensitive glass plate 30 with respect to the direction of the thickness thereof, and another, opposite end surface substantially flush with the lower surface of the glass plate 30 with respect to the direction of the thickness thereof were provided in the through holes 31 as shown in FIG. 6d. Thus, a reinforcement substrate 34a was prepared.

Figure 6E:
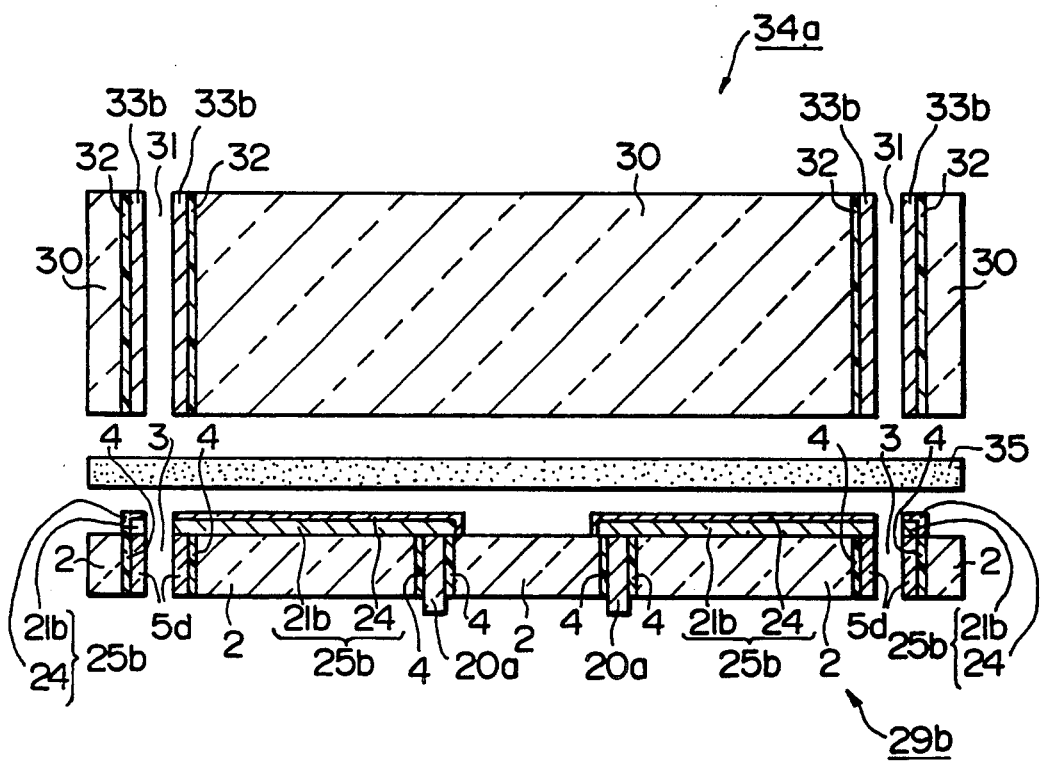

Then, as shown in FIG. 6e, the reinforcement substrate 34a and the circuit substrate 29b were piled up through a hot-melt type sheet-shaped adhesive agent 35 to form a laminate in which: the conductive portions 25b provided in the photosensitive glass base 2 constituting the circuit substrate 29b were located in the inside of the laminate; and the positions of the through holes 31 provided in the photosensitive glass plate 30 were respectively adjusted to the positions of the terminal-forming through holes 3 provided in the photosensitive glass base 2.

Figure 6F:
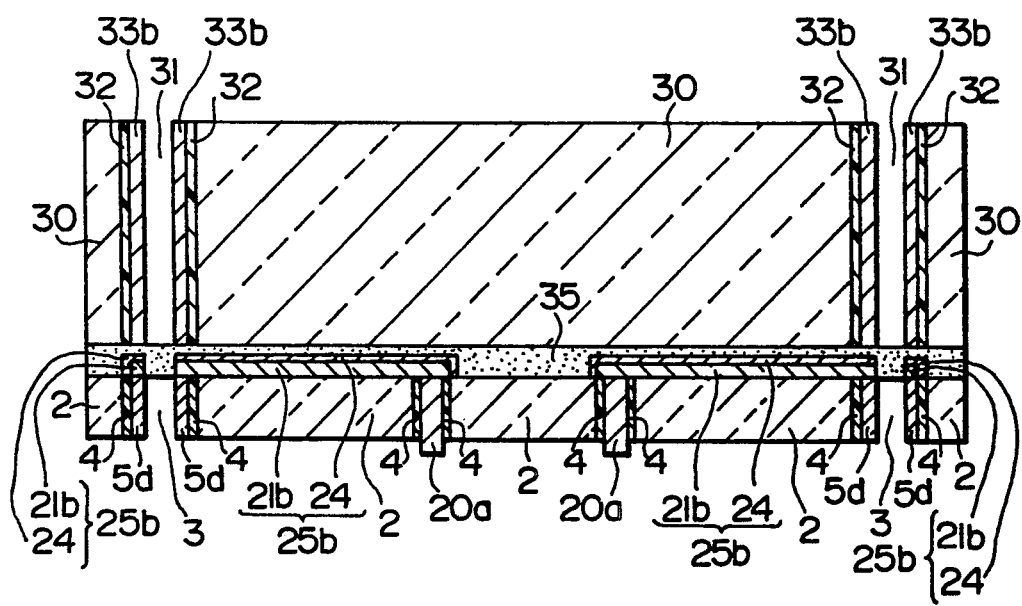

After the piling, the laminate was heated at a temperature of from 120° to 140° C. in a vacuum oven while applying a load of about 400 g on the laminate. Then, the laminate was cooled, so that the reinforcement substrate 34a and the circuit substrate 29b were stuck to each other with the hot-melt type sheet-shaped adhesive agent 35 as shown in FIG. 6f.

Figure 6G:
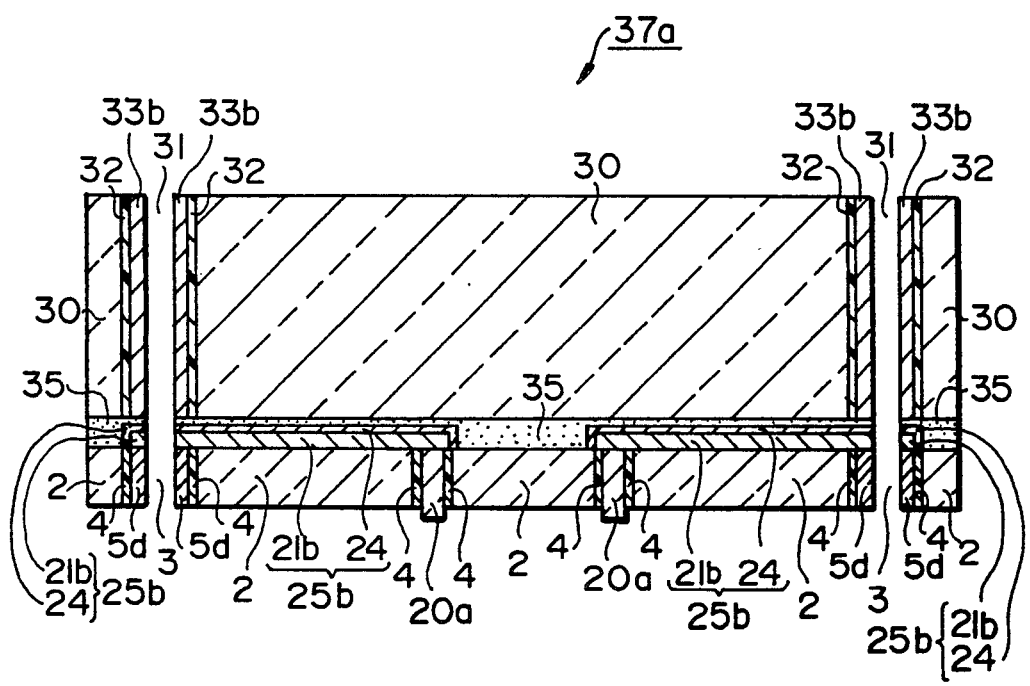

After the sticking, the hot-melt type sheet-shaped adhesive agent 35 arranged between the through holes 31 provided in the photosensitive glass plate 30 and the terminal-forming through holes 3 provided in the photosensitive glass base 2 was perforated by inserting a sharp-topped wire respectively into the through holes 31 provided in the photosensitive glass plate 30. Thus, a circuit substrate 37a formed by sticking the reinforcement substrate 34a onto the circuit substrate 29b at a surface of the photosensitive glass base 2 where the conductive portions 25b were provided was prepared as shown in FIG. 6g.

Then, a step of providing a plurality of connection terminals having one-to-one correspondence to the conductive portions 25b provided at the surface of the photosensitive glass base 2, to electrically connect the conductive portions 25b and test apparatus to each other was carried out by the following procedure.

Figure 7A:
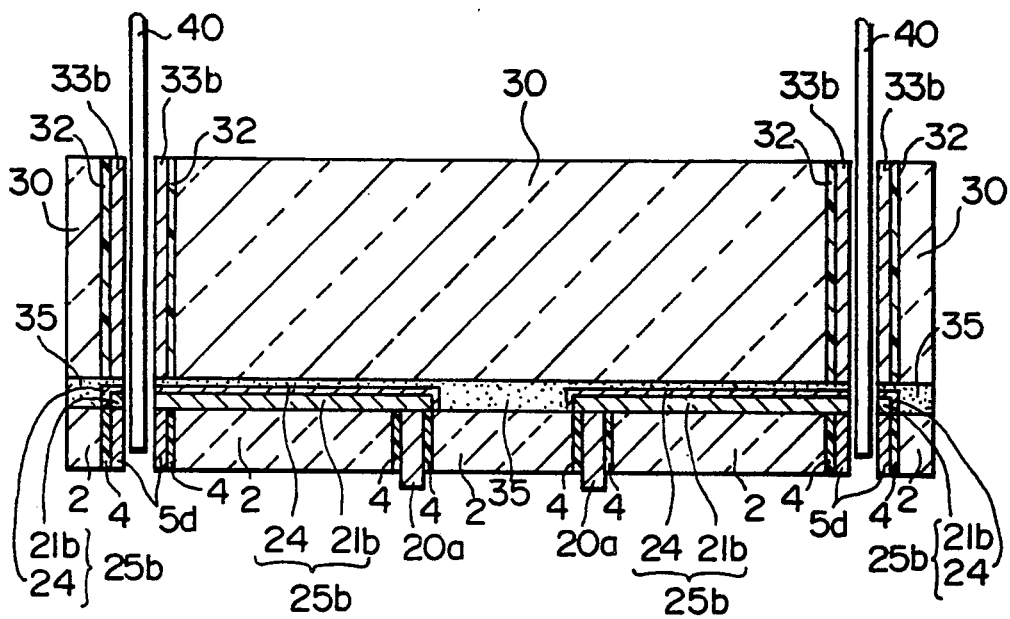
FIGS. 7*a* and 7*b* are sectional views showing typically an example of procedure for providing connection terminals on a reinforcement substrate in the circuit substrate A depicted in FIG. 6*g*.

Stainless-steel wires with the diameter of 300 μm were used as a connection terminal material. As shown in FIG. 7a, the stainless-steel wires 40 were respectively inserted into the through holes 31 provided in the photosensitive glass plate 30 and were kept in a state in which the forward ends of the wires respectively reached the terminal-forming through holes 3 provided in the photosensitive glass base 2 but were not out of the terminal-forming through holes 3.

Figure 7B:
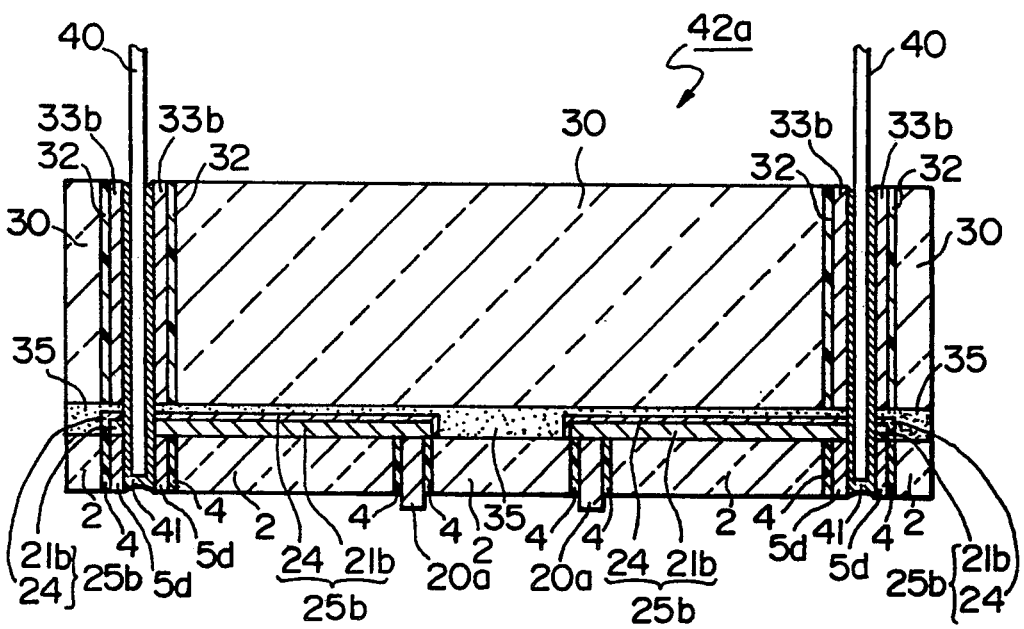

Melted solder was poured respectively into the through holes in which the stainless-steel wires 40 were kept. Then, the solder 41 was hardened to thereby fix the stainless-steel wires 40 into the circuit substrate 37a as shown in FIG. 7b to thereby prepare a circuit substrate 42a equivalent to circuit substrate A according to Method I containing the reinforcement substrate 34a and the connection terminals formed of stainless-steel wires 40 fixed by solder 41.

EXAMPLE 3

Production of Circuit Substrate B according to Method II

Figure 8A:
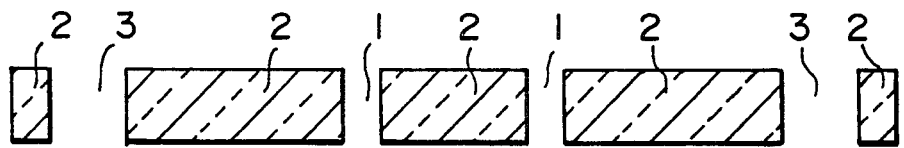
FIGS. 8*a* to 8*c* are sectional views showing typically an example of procedure carried out till the step of forming conductive portions in the case where the circuit substrate B is produced according to the Method II.

A chemically machinable photosensitive glass base of the same quality and the same shape as in Example 2 was used as a base made of an inorganic electrically insulating material. The chemically machinable photosensitive glass base (hereinafter called "photosensitive glass base") was successively subjected to exposure treatment, developing treatment (heat treatment), etching treatment (acid treatment) and rinsing treatment in the same manner as in Example 2, as a step of providing a plurality of fine through holes. Thus, as typically shown in FIG. 8a, fine through holes 1 each having an opening diameter of 50 μm were arranged at intervals of 80 μm in the form of a regular square (in which the length of one side was taken as about 9 mm) in the central portion of the photosensitive glass base 2. At the same time, a plurality of terminal-forming through holes 3 each having an opening diameter of 420 μm were arranged at equal intervals with separation of 5 mm from sides of the photosensitive glass base 2. The terminal-forming through holes 3 were provided so as to respectively correspond to the fine through holes 1.

Figure 8B:
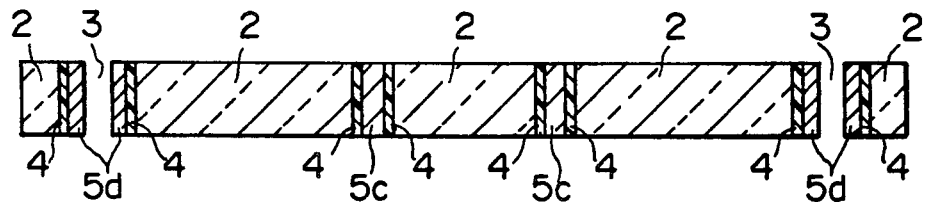

Then, epoxy resin layer forming treatment, electroless Ni-P plating treatment and polishing treatment were carried out in the same manner as in Example 2, as a step of providing pillar-shaped conductors respectively in the fine through holes 1. Thus, Ni-P pillar-shaped matters 5c each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the fine through holes 1 as shown in FIG. 8b. Further, Ni-P hollow pillar-shaped matters 5d each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the terminal-forming through holes 3 in the same manner as described above as shown in FIG. 8b.

Figure 8C:
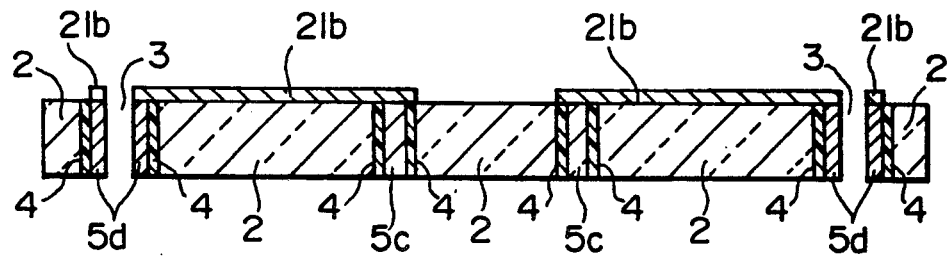

Then, a step of providing conductive portions on a surface of the photosensitive glass base 2 to thereby be electrically connected to the Ni-P pillar-shaped matters 5c was carried out in the same manner as the step of providing conductive portions on a surface of the photosensitive glass base 2, whereby an end of each conductive portion was electrically connected to an end of the corresponding one of the microprobes 20a in Example 2. In short, as shown in FIG. 8c, a plurality of ITO film patterns 21b electrically connected to one end of each of the Ni-P pillar-shaped matters 5c and electrically connected to the Ni-P hollow pillar-shaped matters 5d provided in the terminal-forming through holes 3 were provided on a surface of the photosensitive glass base 2 by: forming an ITO film on a main surface of the photosensitive glass base 2; forming a photoresist layer on the ITO film; forming resist patterns on the ITO film; and forming ITO film patterns.

The ITO film patterns 21b were equivalent to conductive portions. In short, in Example 3, a plurality of monolayer structure conductive portions (hereinafter called "conductive portions 25a") constituted by the ITO film patterns 21b were provided on a surface of the photosensitive glass base 2.

Then, a step of providing a reinforcement substrate made of an electrically insulating or semiconductive material on the surface of the photosensitive glass base 2 were provided was carried out by the following procedure.

Figure 9A:
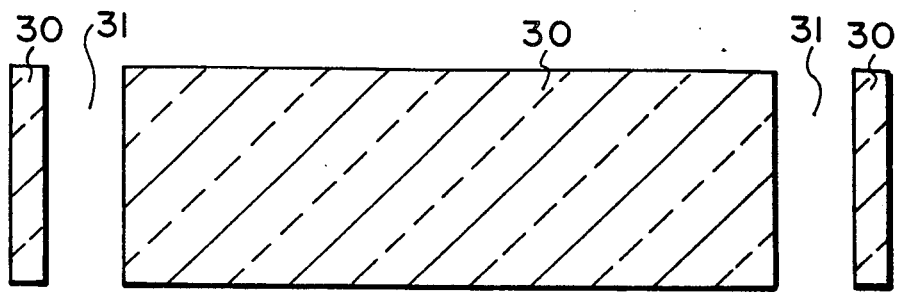
FIGS. 9*a* to 9*c* are sectional views showing typically an example of procedure for providing a reinforcement substrate on the base depicted in FIG. 8*c*.

A chemically machinable photosensitive glass plate (hereinafter merely called "photosensitive glass plate") with the same quality and the same shape as in Example 2 was used as a reinforcement substrate material. The photosensitive glass plate was successively subjected to exposure treatment, developing treatment (heat treatment), etching treatment (acid treatment) and rinsing treatment in the same manner as in Example 2. Thus, as shown in FIG. 9a, through holes 31 each having an opening diameter of 420 μm were arranged at equal intervals with separation of 5 mm from sides of the photosensitive glass plate 30. The through holes 31 were provided so as to respectively correspond to the terminal-forming through holes 3 provided in the photosensitive glass base 2 shown in FIG. 8a.

Figure 9B:
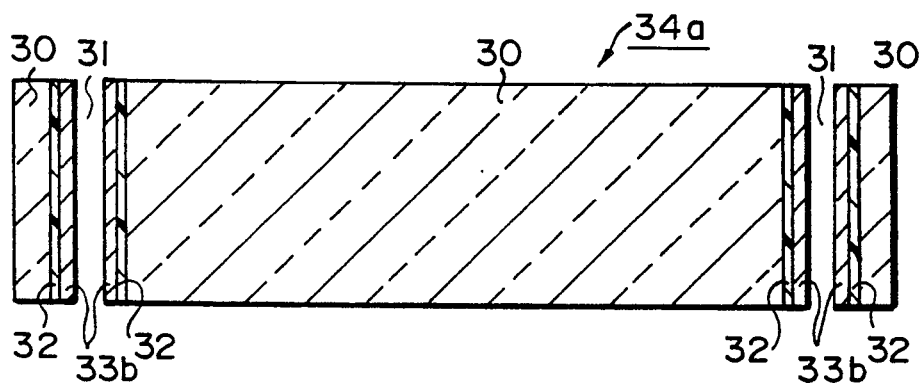

Then, the photosensitive glass plate was successively subjected to epoxy resin layer forming treatment, electroless Ni-P plating treatment and polishing treatment in the same manner as in Example 2. Thus, as shown in FIG. 9b, Ni-P hollow pillar-shaped matters 33b each having one end surface substantially flush with the upper surface of the photosensitive glass plate 30 with respect to the direction of the thickness thereof, and another, opposite end surface substantially flush with the lower surface of the glass plate 30 with respect to the direction of the thickness thereof were provided in the through holes 31. Thus, a reinforcement substrate 34a was prepared.

Figure 9C:
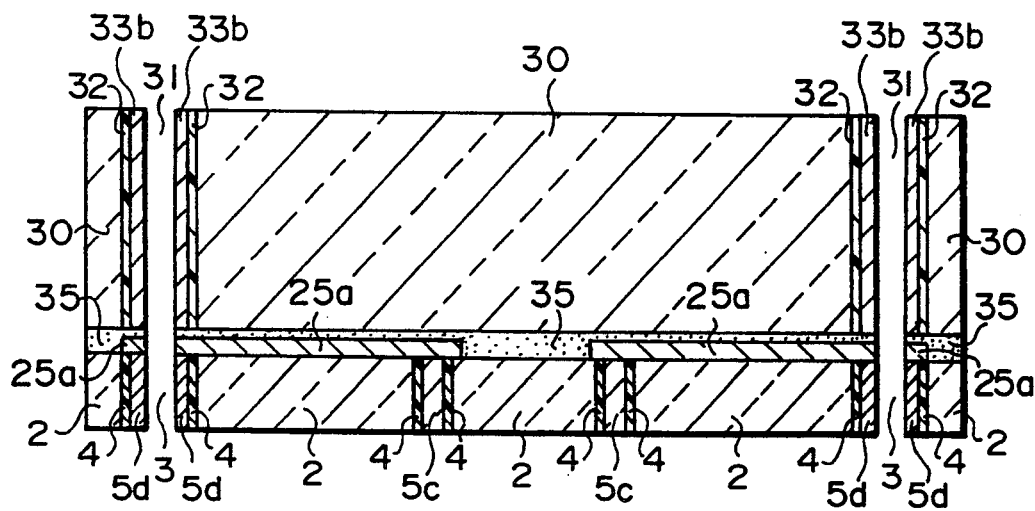

Then, treatment of piling/laminating reinforcement substrate 34a and the photosensitive glass base 2 containing the conductive portions 25a through a hot-melt type sheet-shaped adhesive agent 35, treatment of heating the laminate and then cooling the laminate and treatment of perforating the hot-melt type sheet-shaped adhesive agent 35 were carried out in the same manner as in Example 2. Thus, as shown in FIG. 9c, the reinforcement substrate 34a was stuck through the hot-melt type sheet-shaped adhesive agent 35 onto the surface of the photosensitive glass base 2 where the conductive portions 25a were provided.

Figure 10A:
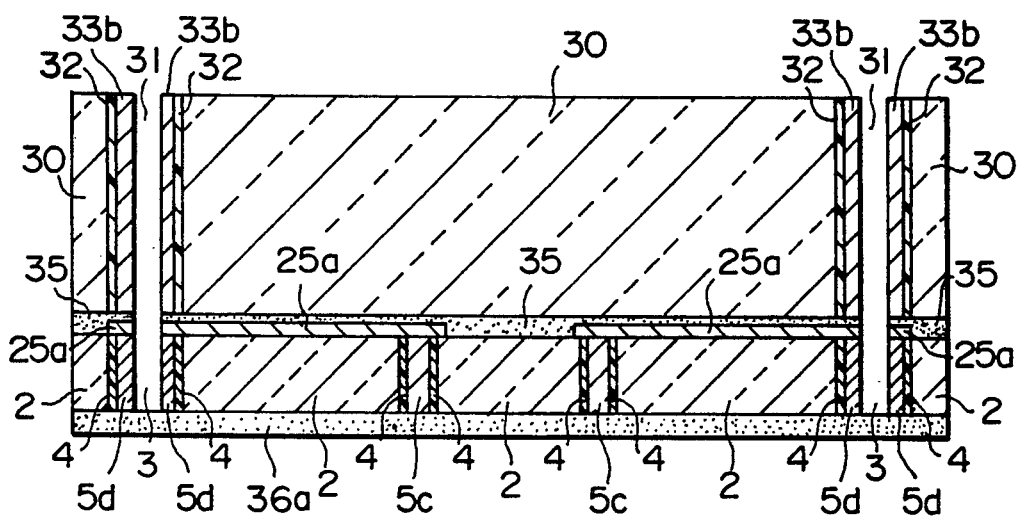
FIGS. 10*a* to 10*f* are sectional views showing typically an example of procedure for forming microprobes according to the Method II.

Then, a step of protruding the neighbors of the end surfaces of the Ni-P pillar-shaped matters 5c at a surface of the photosensitive glass base 2 was carried out by the following procedure. First of all, as shown in FIG. 10a, a resist film (tradename: Fuji Banx Dry Film-Photoresist A-425, made in Fuji Hunt Electronics Technology Co., Ltd.) 36a as a resist layer having high additive strength to glass was stuck to a surface of the photosensitive glass base 2 where the neighbors of the end surfaces of the Ni-P pillar-shaped matters 5c were to be protruded with respect to the photosensitive glass base 2 stuck to the reinforcement substrate 34.

Figure 10B:
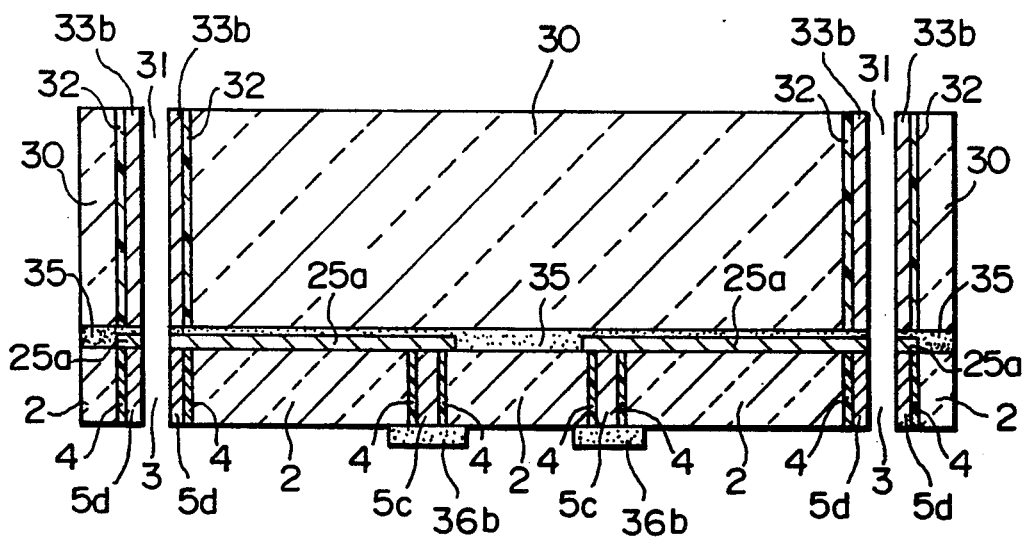

Then, contact exposure treatment using a photomask having a predetermined pattern and developing treatment were carried out to prepare 80 μm-diameter resist patterns 36b for covering the end surfaces of the Ni-P pillar-shaped matters 5c and the neighbors thereof as shown in FIG. 10b.

Figure 10C:
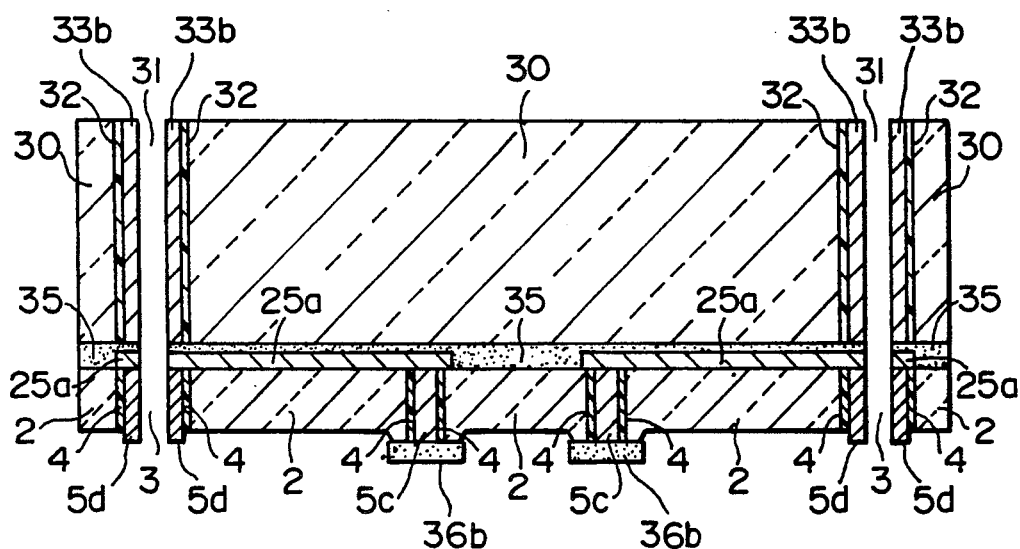

Then, the surface of the photosensitive glass base 2 masked with the resist patterns 36b was etched by about 15 μm. By the etching, the neighbors of the end surfaces of the Ni-P pillar-shaped matters 5c at the surface of the photosensitive glass base 2 were protruded by about 15 μm out of a flat portion which was formed as a new surface of the photosensitive glass base 2 by the etching as shown in FIG. 10c. In the etching, 5% hydrofluoric acid was used as an etching solution.

Figure 10D:
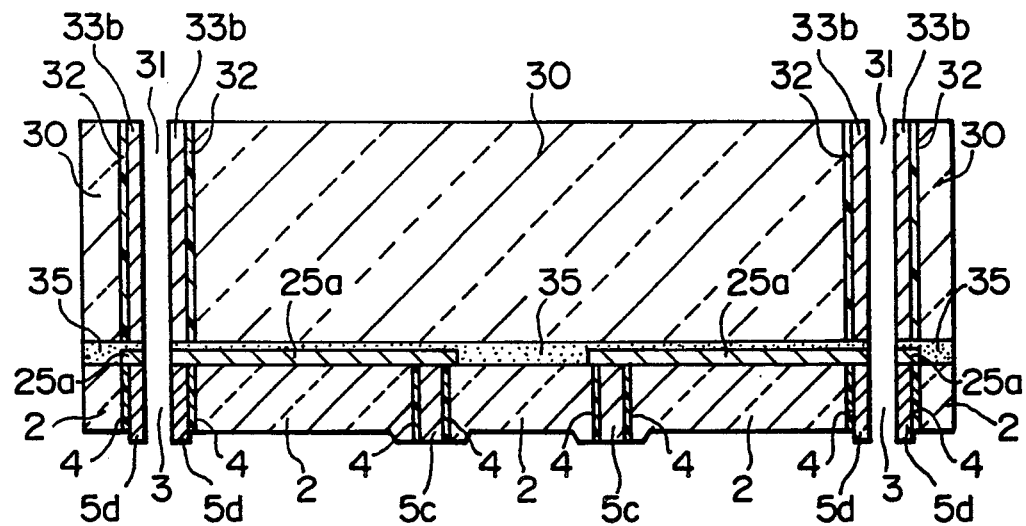

Then, the following procedure was carried out as a step of etching a surface portion of the photosensitive glass base 2 to project the end surfaces of the pillar-shaped conductors 5c out of the surface of the base to thereby form microprobes. First of all, the resist patterns 36b were torn off by using an organic solvent to expose the end surfaces of the Ni-P pillar-shaped matters 5c as shown in FIG. 10d.

Figure 10E:
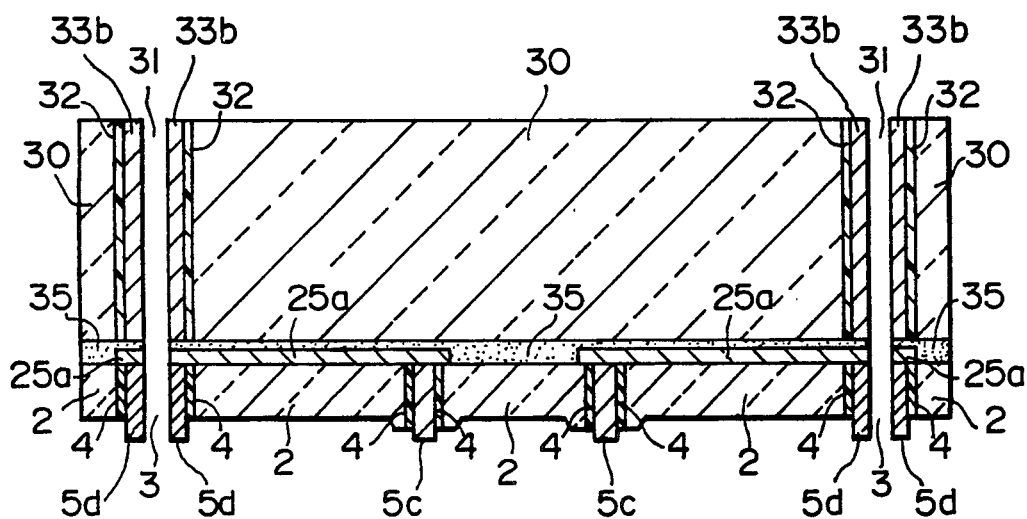

Then, the surface of the photosensitive glass base 2 where the neighbors of the end surfaces of the Ni-P pillar-shaped matters 5c were protruded was removed by about 15 μm by etching. By the etching, as shown in FIG. 10e, the end surfaces of the Ni-P pillar-shaped matters 5c were projected by about 15 μm out of the protruded portions which were newly formed at a surface of the photosensitive-glass 2 by the second etching treatment, and by about 30 μm out of the flat portions which were newly formed at a surface of the photosensitive glass 2 by the second etching treatment. The Ni-P pillar-shaped matters 5c each having one projecting end were equivalent to microprobes (hereinafter called "microprobes 20b"). In the etching treatment, 50% hydrofluoric acid was used as an etching solution.

Figure 10F:
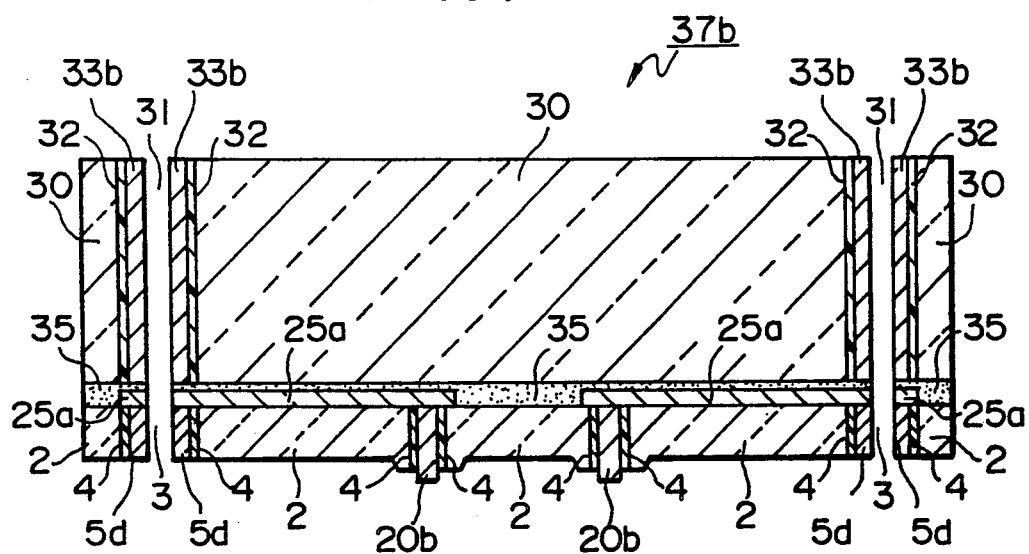

After the microprobes 20b were formed, the projecting portions of the Ni-P hollow pillar-shaped matters 5d provided in the terminal-forming through holes 3 to be projected out of the surface of the photosensitive glass base 2 by etching the surface of the photosensitive glass base 2 were polished/removed with an abrasive agent of cerium oxide and then washed. Thus, as shown in FIG. 10f, a circuit substrate 37b equivalent to substrate B according to Method II, in which: the end surfaces of the Ni-P hollow pillar-shaped matters 5d were formed so as to be substantially flush with the flat portions which were formed at a surface of the photosensitive glass base 2 by etching; and the reinforcement substrate 34a was stuck to an opposite surface of the photosensitive glass base 2 where the conductive portions 25a were provided, was prepared.

Figure 11:
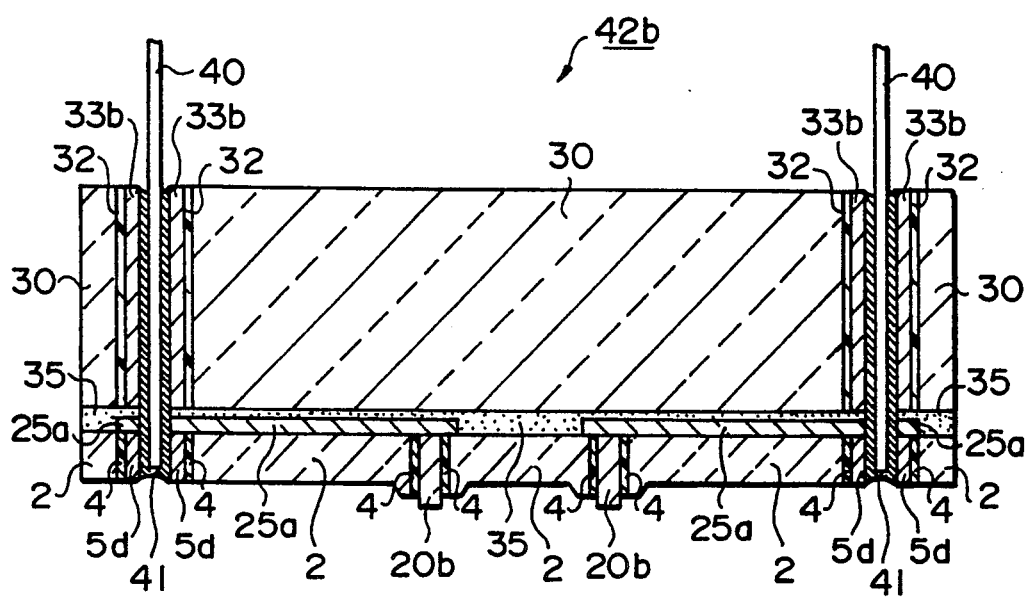
FIG. 11 is a sectional view showing typically an example of the circuit substrate B formed by providing connection terminals in the circuit substrate depicted in FIG. 10*f*.

Then, a step of providing a plurality of connection terminals having one-to-one correspondence to the conductive portions 25a provided at the surface of the photosensitive glass base 2, to electrically connect the conductive portions 25a and test apparatus to each other was carried out in the same manner as in Example 2 to thereby prepare a circuit substrate 42b equivalent to circuit substrate B according to Method II, containing the reinforcement substrate 34a and the connection terminals formed of stainless-steel wires 40 fixed by solder 41 as shown in FIG. 11.

EXAMPLE 4

Production of Circuit Substrate A according to Method IIIa (1) First Process

A chemically machinable photosensitive glass base of the same quality and the same shape as in Example 1 was used as a base made of an inorganic electrically insulating material. A 30 μm-thick sheet-shaped negative-type photoresist film (tradename: Fuji Banx Dry Film-Photoresist A-425, made in Fuji Hunt Electronics Technology Co., Ltd.) was used as a probe-forming auxiliary layer material. A plurality of pillar-shaped fine conductors extending from the chemically machinable photosensitive glass base to the probe-forming auxiliary layer formed of the negative type photoresist film were provided in a base member, which is explained in detail below.

Figure 12A:
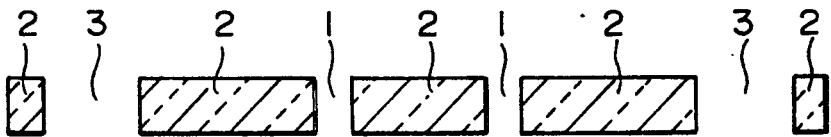
FIGS. 12*a* to 12*k* are sectional views showing typically an example of procedure for producing the circuit substrate A according to the Method IIIa.

The chemically machinable photosensitive glass base (hereinafter merely called "photosensitive glass base") was successively subjected to exposure treatment (using an Hg-Xe lamp) using a predetermined mask, developing treatment (heat treatment) under the conditions of about 520° C. and an hour, etching treatment (acid treatment) with a solution of 5% hydrofluoric acid, and rinsing treatment with pure water as a step of providing a plurality of fine through holes in the photosensitive glass base. Thus, as shown in FIG. 12a, fine through holes 1 each having an opening diameter of 50 μm were arranged at intervals of 80 μm in the form of a regular square (in which the length of one side was taken as about 9 mm) in the central portion of the photosensitive glass base 2. At the same time, a plurality of terminal-forming through holes 3 each having an opening diameter of 500 μm were arranged at equal intervals with separation of 5 mm from sides of the photosensitive glass base 2. The terminal-forming through holes 3 were provided so as to respectively correspond to the fine through holes 1.

Figure 12B:
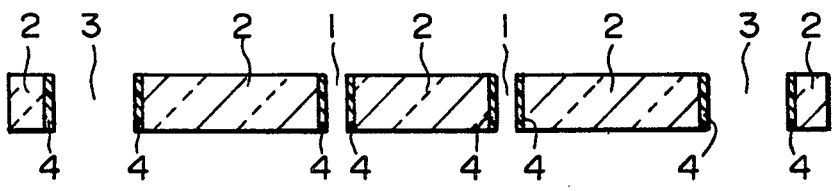

Then, the following procedure was carried out as a step of providing first pillar-shaped fine conductors respectively in the fine through holes 1. First of all, as shown in FIG. 12b, epoxy resin layers 4 were provided respectively on inner walls of the fine through holes 1 by wetting the inner walls of the fine through holes 1 provided in the photosensitive glass base 2 with a solution prepared by dissolving an epoxy resin adhesive agent in IPA (isopropyl alcohol) (in which epoxy resin adhesive agent and IPA were mixed in the volume proportion 1:30); and then drying the inner walls. At the same time, epoxy resin layers 4 were provided respectively on inner walls of the terminal-forming through holes 3 in the same manner as described above. The epoxy resin layers 4 were provided to improve adhesion in the case where metal precipitated by electroless plating (which will be described later) adhered onto the photosensitive glass base 2. The epoxy resin layers 4 were excellent in ultraviolet-rays transmission.

Figure 12C:
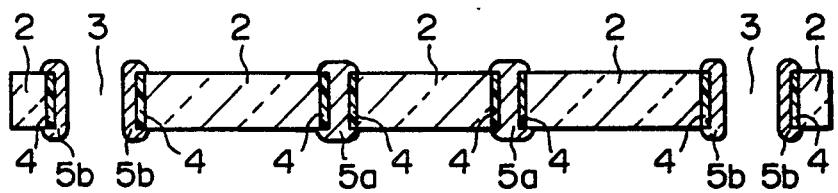

Then, the photosensitive glass base 2 having the epoxy resin layers 4 was subjected to electroless Ni-P plating (partial plating) treatment in the same manner as in Example 2, to form Ni-P layers 5a on the epoxy resin layers 4 in the fine through holes 1 and out of the openings of the fine through holes 1 with respect to the two surfaces of the photosensitive glass base 2 as shown in FIG. 12c. Thus, the fine through holes 1 were blocked with the Ni-P layers 5a, respectively. At the same time, Ni-P layers 5b were formed on the epoxy resin layers 4 in the terminal-forming through holes 3 and in the neighbors of the openings of the terminal-forming through holes 3 with respect to the two surfaces of the photosensitive glass base 2 with no blockade of the terminal-forming through holes 3.

Figure 12D:
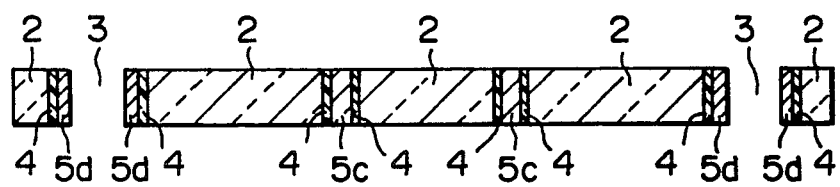

Thereafter, Ni-P being attached to the surfaces of the photosensitive glass base 2 in the neighbors of the openings of the fine through holes 1 was polished/removed with an abrasive agent of cerium oxide and then washed. Thus, Ni-P pillar-shaped matters 5c (first pillar-shaped fine conductors) each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the fine through holes 1 as shown in FIG. 12d. Further, as shown in FIG. 12d, Ni-P hollow pillar-shaped matters 5d each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the terminal-forming through holes 3 in the same manner as described above.

Figure 12E:
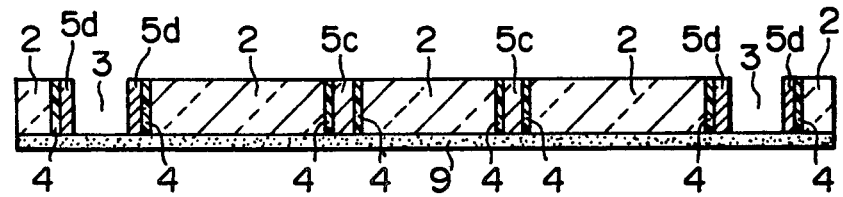

Then, the following procedure was carried out as a step of providing on a surface of the photosensitive glass base 2 a probe-forming auxiliary layer having fine through holes for exposing one end surface of each of the first pillar-shaped fine conductors. First of all, as shown in FIG. 12e, the sheet-shaped negative type photoresist film 9 was stuck to one surface of the photosensitive glass base 2.

Figure 12F:
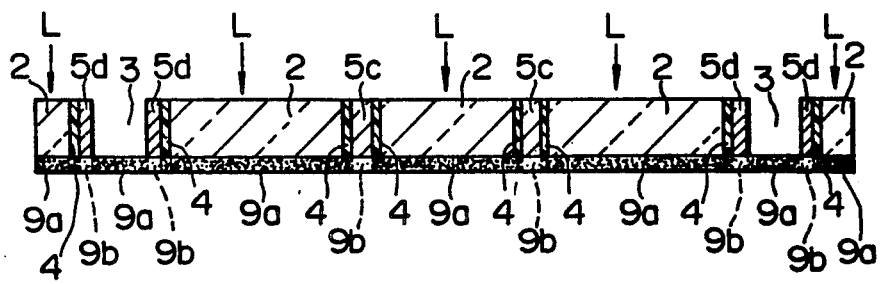

Then, as shown in FIG. 12f, ultraviolet rays L were applied to the photosensitive glass base 2 having the negative type photoresist film 9 from the back thereof (opposite to the surface where the negative type photoresist film 9 was provided) to carry out exposure treatment while masking the film 9 with the Ni-P pillar-shaped matters 5c as first pillar-shaped fine conductors and the Ni-P hollow pillar-shaped matters 5d to thereby form exposure portions 9a and non-exposure portions 9b in the negative type photoresist film 9.

Figure 12G:
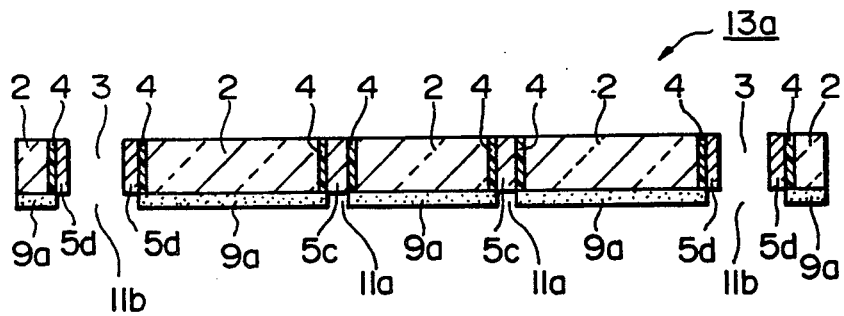

Then, the negative type photoresist film 9 having the exposure portions 9a and the non-exposure portions 9b was developed with an alkali developing solution to remove the non-exposure portions 9b. Thus, as shown in FIG. 12g, fine through holes 11a for exposing one end surface of each of the Ni-P pillar-shaped matters 5c as first pillar-shaped fine conductors were provided in the negative type photoresist film 9 (exposure portions 9a). At the same time, through holes 11b for exposing one end surface of each of the Ni-P hollow pillar-shaped matters 5d were provided in the negative type photoresist film 9 (exposure portions 9a).

In this Example 4, the negative type photoresist film 9 (exposure portions 9a) provided with the fine through holes 11a and the through holes 11b was equivalent to the probe-forming auxiliary layer (hereinafter called "probe-forming auxiliary layer 12a"). A base member 13a was constituted by the probe-forming auxiliary layer 12a and the photosensitive glass base 2 containing the epoxy resin layers 4, Ni-P pillar-shaped matters 5c and Ni-P hollow pillar-shaped matters 5d.

Then, the following procedure was carried out as a step of providing second pillar-shaped fine conductors in the fine through holes 11a of the probe-forming auxiliary layer 12a to respectively unite the second pillar-shaped fine conductors with the Ni-P pillar-shaped matters 5c as first pillar-shaped fine conductors. First of all, the base member 13a was baked at 120° C. for 30 minutes.

Figure 12H:
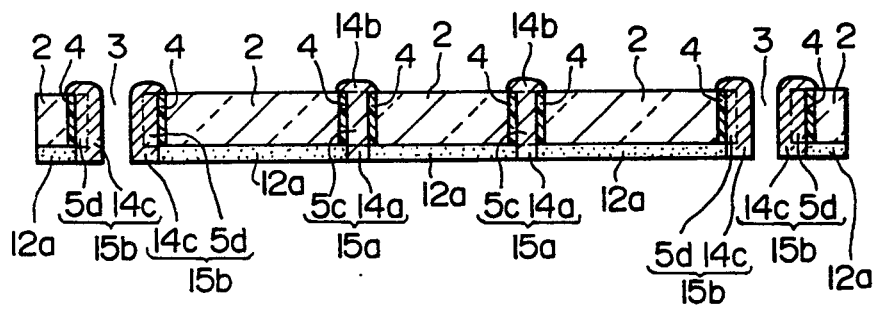

Then, the same plating treatment as the aforementioned electroless Ni-P plating treatment was applied to the base member 13a to precipitate Ni-P pillar shaped matters 14a as second pillar-shaped fine conductors respectively united with the Ni-P pillar-shaped matters 5c in the fine through holes 11a provided in the probe-forming auxiliary layer 12a to thereby block the fine through holes 11a as shown in FIG. 12h. (Hereinafter, a combination of an Ni-P pillar-shaped matter 5c and an Ni-P pillar-shaped matter 14a will be called "Ni-P pillar-shaped matter 15a"). At this time, Ni-P layers 14b respectively united with the Ni-P pillar-shaped matters 5c were formed on end surfaces of the Ni-P pillar-shaped matters 5c opposite to the end surfaces where the Ni-P pillar-shaped matters 14a were provided. Further, Ni-P layers 14c respectively united with the Ni-P hollow pillar-shaped matters 5d were precipitated around the Ni-P hollow pillar-shaped matters 5d, respectively. (Hereinafter, a combination of an Ni-P hollow pillar-shaped matter 5d and an Ni-P layer 14c will be called "Ni-P hollow pillar-shaped matter 15b").

The Ni-P pillar-shaped matters 5c and the Ni-P hollow pillar-shaped matters 5d had self-catalyzing effect. It was necessary to prevent the precipitation of Ni-P to the negative type photoresist film 9 (exposure portions 9a) as a probe-forming auxiliary layer 12a. Accordingly, the electroless Ni-P plating treatment was carried out with no addition of catalyst in the order of activation, catalyst activation and electroless plating under the same condition as in the aforementioned electroless plating treatment, except that the immersing time in the electroless plating was changed to about 5 hours. The electroless Ni-P plating treatment was terminated when the blockade of the fine through holes 11a with the Ni-P pillar-shaped matters 14a was observed microscopically.

By providing the Ni-P pillar-shaped matters 15a through the electroless Ni-P plating treatment, a plurality of pillar-shaped fine conductors extending from the photosensitive glass base 2 to the probe-forming auxiliary layer 12a were provided in the base member 13a.

Thereafter, the surface of the probe-forming auxiliary layer 12a where the fine through holes 11a were blocked with the Ni-P pillar-shaped matters 14a was polished with an abrasive agent of cerium oxide so as to be flat.

(2) Second Process

Then, the second process of projecting one end of each of the Ni-P pillar-shaped matters 15a out of a surface of the photosensitive glass base 2 by removing a part or all of the probe-forming auxiliary layer 12a was carried out as follows. After the pillar-shaped fine conductors 15a extending from the photosensitive glass base 2 to the probe-forming auxiliary layer 12a were provided, the base member 13a was immersed in a solution of 10% sodium hydroxide.

As a result, all of the negative type photoresist film 9 (exposure portions 9a) as a probe-forming auxiliary layer 12a was torn off and removed.

Figure 12I:
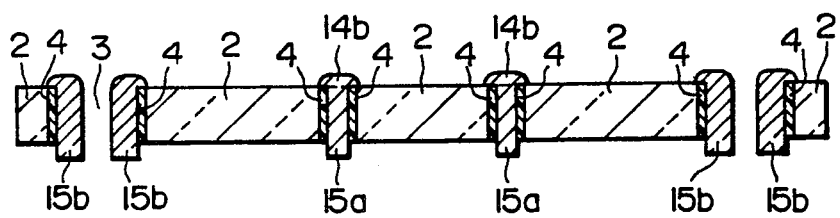

FIG. 12i is a sectional view of the base member 13a after the probe-forming auxiliary layer 12a was torn off and removed.

As shown in FIG. 12i, one end of each of the Ni-P pillar-shaped matters 15a was projected by 30 μm out of the surface of the photosensitive glass base 2 because the probe-forming auxiliary layer 12a was torn off and removed. The Ni-P pillar-shaped matters 15a each having one projecting end were equivalent to microprobes (hereinafter called "microprobes 20c").

After the probe-forming auxiliary layer 12a was torn off and removed, the base member 13a was rinsed with pure water. Then, the projecting portions of the Ni-P hollow pillar-shaped matters 15b out of the surface of the photosensitive glass base 2 where the Ni-P pillar-shaped matters 14a were provided as second pillar-shaped fine conductors were polished/removed with an abrasive agent of cerium oxide.

(3) Third Process

Then, the third process of providing conductive portions on a surface of the photosensitive glass base 2, whereby an end of each conductive portion was electrically connected to an end of the corresponding one of the microprobes 20c, was carried out as follows. First of all, the Ni-P layers 14b projecting out of a surface of the photosensitive glass base 2 and the projecting portions of the Ni-P hollow pillar-shaped matters 15b were polished/removed with an abrasive agent of cerium oxide. Hereinafter, the Ni-P hollow pillar-shaped matters 15b prepared by polishing/removing the projecting portions will be called "Ni-P hollow pillar-shaped matters 15c".

Figure 12J:
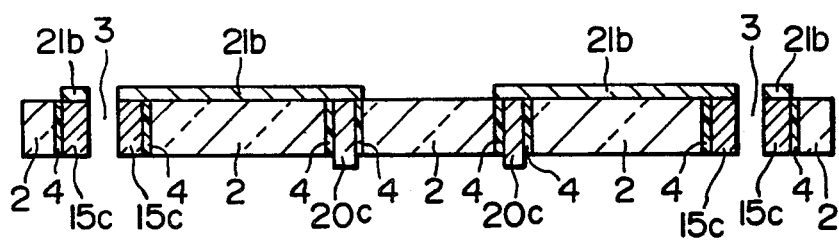

Then, as shown in FIG. 12j, ITO film patterns 21b respectively electrically connected to one end of each of the microprobes 20c were formed on a surface of the photosensitive glass base 2 by successively carrying out treatment of forming an ITO film on a surface of the photosensitive glass base 2 where the Ni-P layers 14b were polished/removed; treatment of forming resist patterns on the ITO film; and treatment of forming ITO film patterns, in the same manner as in Example 2. Each of the ITO film patterns 21b was electrically connected to one end of a corresponding microprobe 20c and was electrically connected to one of the Ni-P hollow pillar-shaped matters 15c provided in the terminal-forming through holes 3 and having one-to-one correspondence to the microprobes 20c.

Figure 12K:
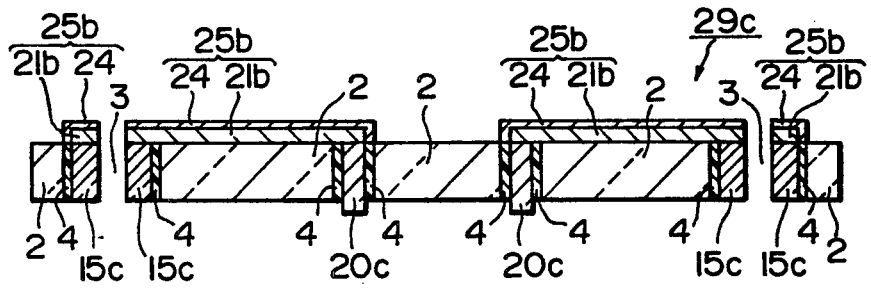

Then, the same electroless Ni-P plating treatment as in Example 2 was carried out to reduce electric resistance between the ITO film patterns 21b and the microprobes 20c. Thus, as shown in FIG. 12k, a plurality of two-layer structure conductive portions 25b formed by arranging a 2 μm-thick Ni-P layer 24 on the outer surface of the respective ITO film patterns 21b were provided on a surface of the photosensitive glass base 2 where the Ni-P layers 14b had been polished/removed. Thus, a circuit substrate 29c equivalent to circuit substrate A according to Method IIIa was prepared.

Then, a step of providing a reinforcement substrate made of an electrically insulating or semiconductive material on the surface of the photosensitive glass base 2 was carried out by the following procedure.

Figure 13A:
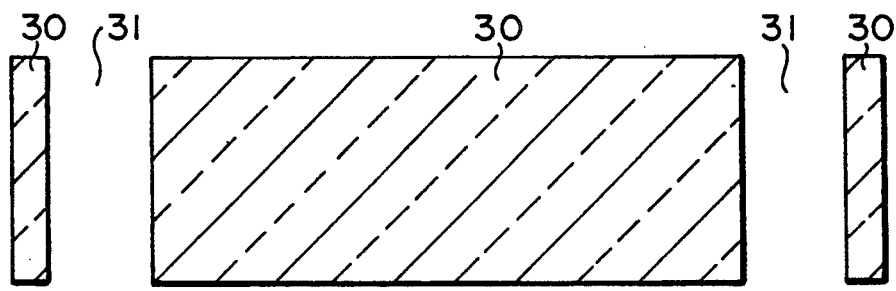
FIGS. 13*a* to 13*c* are sectional views showing typically an example of procedure for providing a reinforcement substrate on the circuit substrate depicted in FIG. 12*k*.

A chemically machinable photosensitive glass plate of the same quality and the same shape as in Example 2 was used as a reinforcement substrate material. The chemically machinable photosensitive glass plate (hereinafter merely called "photosensitive glass plate") was successively subjected to exposure treatment using a predetermined mask, developing treatment (heat treatment), etching treatment (acid treatment) and rinsing treatment in the same manner as in the first process. Thus, as shown in FIG. 13a, through holes 31 each having an opening diameter of 500 μm were arranged at equal intervals with separation of 5 mm from sides of the photosensitive glass plate 30. The through holes 31 were provided so as to respectively correspond to the terminal-forming through holes 3 provided in the photosensitive glass base 2 shown in FIG. 12a.

Figure 13B:
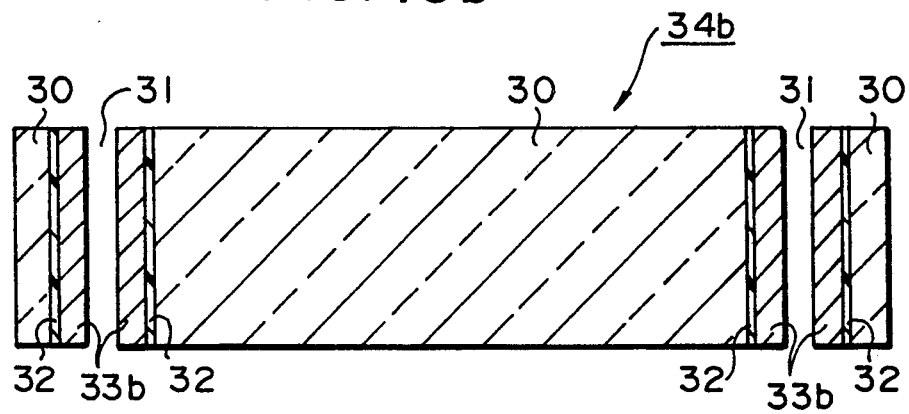

Then, the photosensitive glass plate was successively subjected to epoxy resin layer forming treatment, electroless Ni-P plating treatment and polishing treatment in the same manner as in Example 2. Thus, as shown in FIG. 13b, Ni-P hollow pillar-shaped matters 33b each having one end surface substantially flush with the upper surface of the photosensitive glass plate 30 with respect to the direction of the thickness thereof, and another, opposite end surface substantially flush with the lower surface of the glass plate 30 with respect to the direction of the thickness thereof were provided in the through holes 31. Thus, a reinforcement substrate 34b was prepared.

Figure 13C:
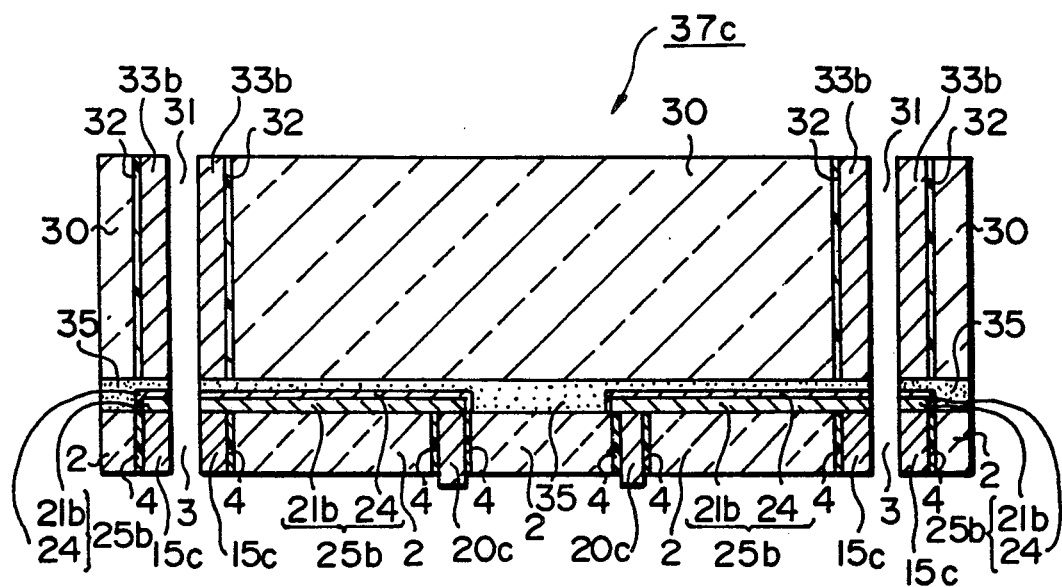

Then, treatment of piling/laminating the reinforcement substrate 34b and the circuit substrate 29c through a hot-melt type sheet-shaped adhesive agent, treatment of heating the laminate and then cooling the laminate and treatment of perforating the hot-melt type sheet-shaped adhesive agent were carried out in the same manner as in Example 2. Thus, as shown in FIG. 13c, the reinforcement substrate 34b was stuck through the hot-melt type sheet-shaped adhesive agent 35 onto the surface of the photosensitive glass base 2 in the circuit substrate 29c where the conductive portions 25b were provided. Thus, a circuit substrate 37c equivalent to circuit substrate A according to Method IIIa containing the reinforcement substrate 34b was prepared.

Figure 14:
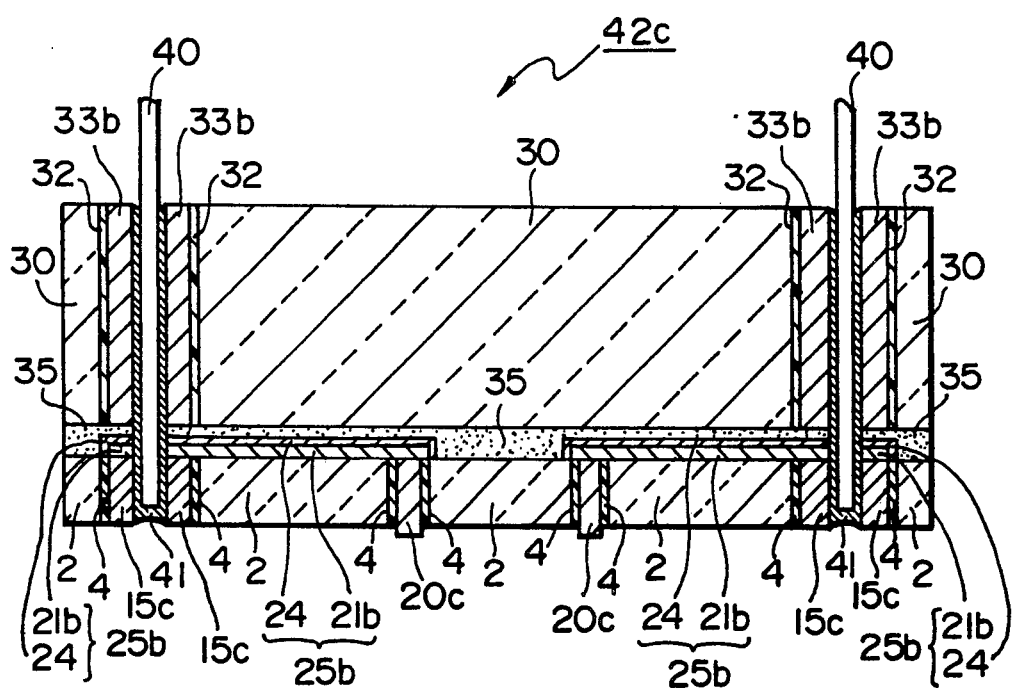
FIG. 14 is a sectional view showing typically an example of the circuit substrate A formed by providing connection terminals in the circuit substrate depicted in FIG. 13*c*.

Then, a step of providing a plurality of connection terminals respectively corresponding to the conductive portions 25b provided on the circuit substrate 29c, to electrically connect the conductive portions 25b and test apparatus to each other, was carried out in the same manner as in Example 2 to thereby prepare a circuit substrate 42c equivalent to circuit substrate A according to Method IIIa, containing the reinforcement substrate 34b and the connection terminals formed of stainless-steel wires 40 fixed by solder 41, as shown in FIG. 14.

EXAMPLE 5

Production of Circuit Substrate A according to Method IIIb (1) First Process

A chemically machinable photosensitive glass base of the same quality and the same shape as in Example 4 was used as a base made of an inorganic electrically insulating material. Cr and liquid positive-type photoresist (ultraviolet-rays hardening type, tradename: Photomal EP, made in Okuno Chemical Industry Co., Ltd.) was used as a probe-forming auxiliary layer material. A plurality of pillar-shaped fine conductors extending from the chemically machinable photosensitive glass base to the probe-forming auxiliary layer formed of the Cr and the negative-type photoresist film were provided in a base member, which is explained in detail below.

The chemically machinable photosensitive glass base (hereinafter merely called "photosensitive glass base") was successively subjected to exposure treatment, developing treatment (heat treatment), etching treatment (acid treatment) and rinsing treatment in the same manner as in Example 4, as a step of providing a plurality of fine through holes in the photosensitive glass base. Thus, fine through holes each having an opening diameter of 50 μm were arranged at intervals of 80 μm in the form of a regular square (in which the length of one side was taken as about 9 mm) in the central portion of the photosensitive glass base. At the same time, a plurality of terminal-forming through holes each having an opening diameter of 500 μm were arranged at equal intervals with separation of 5 mm from sides of the photosensitive glass base.

Then, epoxy resin layers were provided respectively on inner walls of the fine through holes provided in the photosensitive glass base in the same manner as in Example 4. At the same time, epoxy resin layers were provided respectively on inner walls of the terminal-forming through holes in the same manner as described above. Then, the photosensitive glass base having the epoxy resin layers was subjected to electroless Ni-P plating (partial plating) treatment in the same manner as in Example 4, except that the immersing time for the electroless plating was set to 100 minutes. Thus, Ni-P layers were formed on the epoxy resin layers in the fine through holes and out of the openings of the fine through holes with respect to the two surfaces of the photosensitive glass base without blockade of the fine through holes. At the same time, Ni-P layers were formed on the epoxy resin layers in the terminal-forming through holes and in the neighbors of the openings of the terminal-forming through holes with respect to the two surfaces of the photosensitive glass base without blockade of the terminal-forming through holes.

Thereafter, Ni-P being attached to the surfaces of the photosensitive glass base in the neighbors of the openings of the fine through holes was polished/removed with an abrasive agent of cerium oxide and then washed. Thus, Ni-P hollow pillar-shaped layers each having one end surface substantially flush with the upper surface of the photosensitive glass base with respect to the direction of the thickness thereof, and another, opposite end surface substantially flush with the lower surface of the base with respect to the direction of the thickness thereof were prepared in the fine through holes. Further, Ni-P being attached to the surfaces of the photosensitive glass base in the neighbors of the openings of the terminal-forming through holes was polished/removed and washed in the same manner as described above. Thus, Ni-P hollow pillar-shaped layers each having one end surface substantially flush with the upper surface of the photosensitive glass base with respect to the direction of the thickness thereof, and another, opposite end surface substantially flush with the lower surface of the base with respect to the direction of the thickness thereof were prepared in the terminal-forming through holes.

Figure 15A:
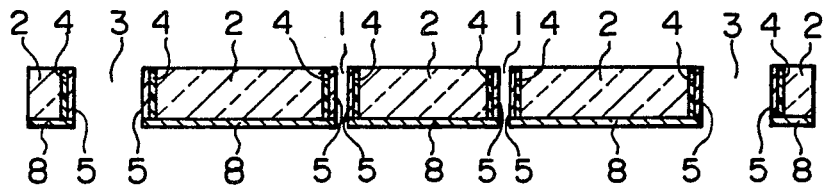
FIGS. 15*a* to 15*g* are sectional views showing typically an example of procedure carried out till the step of forming microprobes in the case where the circuit substrate A is produced according to the Method IIIb.

Then, the following procedure was carried out as a step of providing a probe-forming auxiliary layer having fine through holes connected to the fine through holes provided in the photosensitive glass base to have one-to-one correspondence thereto. First of all, a 0.1 μm-thick Cr film was formed on a surface of the photosensitive glass base by a sputtering method. FIG. 15a is a sectional view of the photosensitive glass base coated with the Cr film.

As shown in FIG. 15a, epoxy resin layers 4 were provided respectively in the fine through holes 1 and in the terminal-forming through holes 3 respectively corresponding to the fine through holes 1 provided in the photosensitive glass base 2. Ni-P hollow pillar-shaped layers 5 were provided on the epoxy resin layers 4 provided in the fine through holes 1. Further, Ni-P hollow pillar-shaped layers 5 were provided on the epoxy resin layers 4 provided in the terminal-forming through holes 3. A Cr film 8 was formed on a surface of the photosensitive glass base 2 containing the epoxy resin layers 4 and the Ni-P hollow pillar-shaped layers 5 in the direction of the thickness thereof. Such Cr particles did not adhere to the inner walls of the fine through holes 1 and terminal-forming through holes 3 in which the epoxy resin layers 4 and the Ni-P hollow pillar-shaped layers were provided.

Figure 15B:
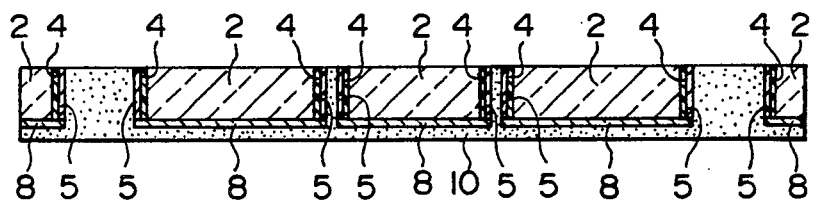

Then, the liquid positive-type photoresist was applied on the Cr film 8 by a roll-coating method. As shown in FIG. 15b, the fine through holes 1 and terminal-forming through holes 3 were respectively filled with the positive-type photoresist 10.

Figure 15C:
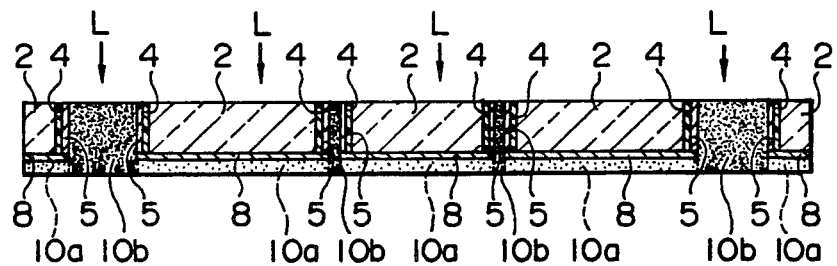

Then, as shown in FIG. 15c, ultraviolet rays L were applied to the photosensitive glass base 2 coated with the positive-type photoresist 10 from the back thereof (opposite to the surface coated with the positive-type photoresist 10) to carry out exposure treatment using the Cr film 8 as a mask to thereby form non-exposure portions 10a and exposure portions 10b in the positive-type photoresist 10.

Figure 15D:
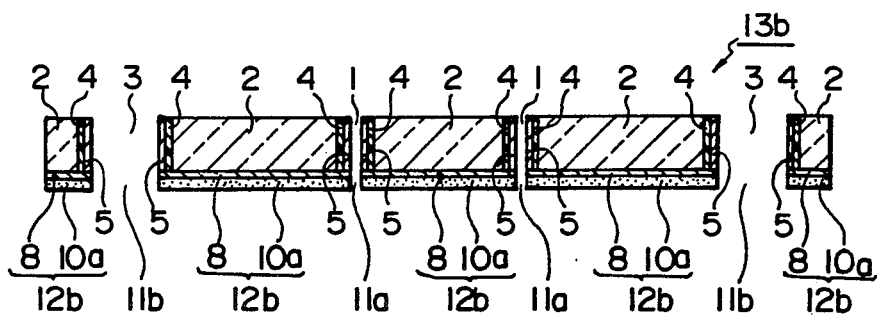

Then, the positive-type photoresist 10 having the non-exposure portions 10a and the exposure portions 10b was developed with an alkali developing solution to remove the exposure portions 10b. Thus, as shown in FIG. 15d, fine through holes 11a connected to the fine through holes 1 and through holes 11b connected to the terminal-forming through holes 3 were provided.

In this Example 5, the combination of the Cr film 8 and the non-exposure portion 10a of the positive-type photoresist 10 was equivalent to the probe-forming auxiliary layer (hereinafter called "probe-forming auxiliary layer 12b"). A base member 13b was constituted by the probe-forming auxiliary layer 12b and the photosensitive glass base 2 containing the epoxy resin layers 4 and the Ni-P hollow pillar-shaped layers 5. The thickness of the positive-type photoresist 10 (non-exposure portions 10a) was 30 μm.

Then, electroless Ni-P plating (partial plating) treatment was applied to the photosensitive glass base 2 containing the probe-forming auxiliary layer 12b as a step of providing pillar-shaped fine conductors extending from the photosensitive glass base 2 to the probe-forming auxiliary layer 12b in the fine through holes connecting between the photosensitive glass base 2 and the probe-forming auxiliary layer 12b. The Ni-P hollow pillar-shaped layers 5 had self-catalyzing effect. It was necessary to prevent the precipitation of Ni-P to the non-exposure portions 10a of the positive-type photoresist film 10 constituting the probe-forming auxiliary layer 12b. Accordingly, the electroless Ni-P plating treatment was carried out with no addition of catalyst in the order of activation, catalyst activation and electroless plating under the same condition as in the aforementioned electroless Ni-P plating treatment in Example 4, except that the immersing time for the electroless plating was set to about 3.5 hours.

Figure 15E:
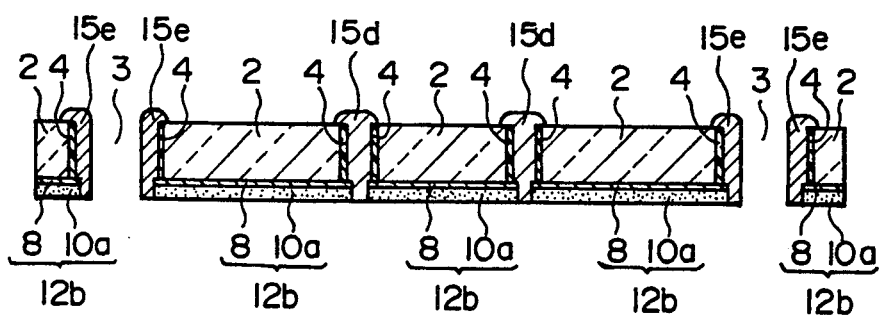
Figure 15F:
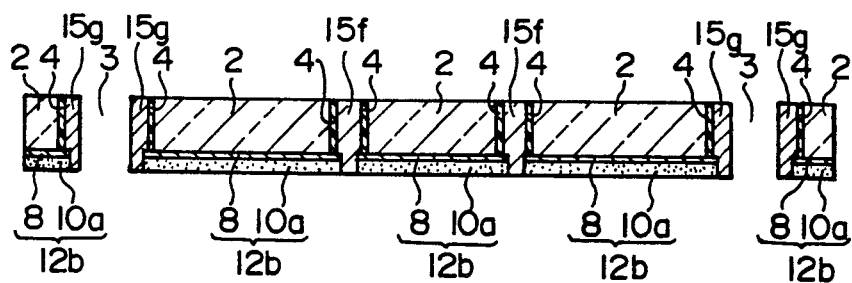

By the electroless Ni-P plating treatment, the fine through holes constituted by the fine through holes 1 covered with the Ni-P hollow pillar-shaped layers 5 and the fine through holes 11a provided in the probe-forming auxiliary layer 12b were blocked with Ni-P pillar-shaped matters 15d formed by uniting the Ni-P hollow pillar-shaped layers 5 and newly precipitated Ni-P as shown in FIG. 15e. Thus, a plurality of pillar-shaped fine conductors extending from the photosensitive glass base 2 to the probe-forming auxiliary layer 12b were provided in the base member 13b. At that time, Ni-P hollow pillar-shaped matters 15e formed by uniting the Ni-P hollow pillar-shaped layers 5 and newly precipitated Ni-P were provided in the through holes constituted by the terminal-forming through holes 3 covered with the Ni-P hollow pillar-shaped layers 5 and the through holes 11b provided in the probe-forming auxiliary layer 12b.

After the Ni-P pillar-shaped matters 15d were provided, Ni-P projecting out of a surface of the base member 13b was polished/removed with an abrasive agent of cerium oxide and washed to thereby newly form the both end surfaces of each of the Ni-P pillar-shaped matters 15d to be respectively substantially flush with the surfaces of the base member 13b as shown in FIG. 5f. The Ni-P pillar-shaped matters were called "Ni-P pillar-shaped matters 15f". Similarly, the both end surfaces of each of the Ni-P hollow pillar-shaped matters 15e were newly formed to be respectively substantially flush with the surfaces of the base member 13b. The Ni-P hollow pillar-shaped matters were called "Ni-P hollow pillar-shaped matters 15g".

(2) Second Process

Then, the second process of projecting one end of each of the Ni-P pillar-shaped matters 15f out of a surface of the photosensitive glass base 2 by removing a part or all of the probe-forming auxiliary layer 12b was carried out as follows. First of all, after the Ni-P pillar-shaped matters 15f and the Ni-P hollow pillar-shaped matters 15g were provided, the base member 13b was immersed in a solution of 10% sodium hydroxide. As a result, all of the positive-type photoresist 10 (non-exposure portions 10a) as a constituent member of the probe-forming auxiliary layer 12b was torn off and removed.

After the positive-type photoresist 10 (non-exposure portions 10a) was torn off and removed, the base member 13b was immersed in a solution consisting of 4:1:19 mixture of ammonio-ceric nitrate, a perchloric acid and water. As a result, all of the Cr film 8 was torn off and removed.

Figure 15G:
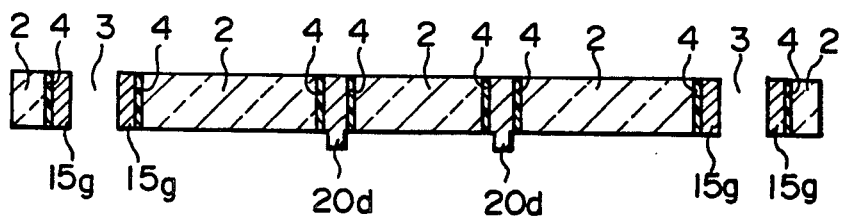

FIG. 15g is a sectional view of the base member 13b after the positive-type photoresist 10 (non-exposure portions 10a) and the Cr film 8 were torn off and removed, or in other words, after the probe-forming auxiliary layer 12b was torn off and removed.

As shown in FIG. 15g, one end of each of the Ni-P pillar-shaped matters 15f was projected by about 30 μm out of the surface of the photosensitive glass base 2 because the positive-type photoresist 10 (non-exposure portions 10a) and the Cr film 8 as constituent members of the probe-forming auxiliary layer 12b were torn off and removed. The Ni-P pillar-shaped matters 15f each having one projecting end were equivalent to microprobes (hereinafter called "microprobes 20d").

(3) Third Process

Then, a plurality of two-layer structure conductive portions each formed by providing an Ni-P layer on the outer surface of an ITO film pattern as a conductive portion electrically connected to one end of a corresponding microprobe 20c were provided on a surface of the photosensitive glass base 2 in the same manner as in Example 4. Thus, a circuit substrate equivalent to circuit substrate A according to Method IIIb was prepared.

EXAMPLE 6

Production of Circuit Substrate A according to Method IIIb (1) First Process

A chemically machinable photosensitive glass base of the same quality and the same shape as in Example 4 was used as a base made of an inorganic electrically insulating material. An epoxy resin thin plate with the size of 20 mm×20 mm×30 μm was used as a probe-forming auxiliary layer material. A plurality of pillar-shaped fine conductors extending from the chemically machinable photosensitive glass base to the probe-forming auxiliary layer constituted by the epoxy resin thin plate were provided in a base member, which is explained in detail below.

The chemically machinable photosensitive glass base (hereinafter merely called "photosensitive glass base") was successively subjected to exposure treatment, developing treatment (heat treatment), etching treatment (acid treatment) and rinsing treatment in the same manner as in Example 4, as a step of providing a plurality of fine through holes in the photosensitive glass base. Thus, as shown in FIG. 16a, fine through holes 1 each having an opening diameter of 50 μm were arranged at intervals of 80 μm in the form of a regular square (in which the length of one side was taken as about 9 mm) in the central portion of the photosensitive glass base 2. At the same time, a plurality of terminal-forming through holes 3 each having an opening diameter of 500 μm were arranged at equal intervals with separation of 5 mm from corners of the photosensitive glass base. The terminal-forming through holes 3 were provided so as to respectively correspond to the fine through holes 1.

Then, the following procedure was carried out as a step of providing on the photosensitive glass base 2 a probe-forming auxiliary layer having a plurality of fine through holes respectively correspondingly to the fine through holes 1 provided in the photosensitive glass base 2. First of all, fine through holes each having an opening diameter of 50 μm were arranged in the central portion of the epoxy resin thin plate correspondingly to the fine through holes 1 in the photosensitive glass base 2. The fine through holes were perforated by using laser beams.

Then, as shown in FIG. 16b, the epoxy resin thin plate (hereinafter called "probe-forming auxiliary layer 12c") having the fine through holes 11a was stuck to one surface of the photosensitive glass base 2 with an epoxy resin adhesive agent (not shown) so that the fine through holes 11a provided in the probe-forming auxiliary layer 12c were respectively connected to the fine through holes 1 provided in the photosensitive glass base 2 and had one-to-one correspondence to the fine through holes 1. The positioning of the fine through holes 11a and the fine through holes 1 was made by adjusting marks (not shown) provided at predetermined positions of the probe-forming auxiliary layer 12c and the photosensitive glass base 2 in advance.

In this Example 6, a base member 13c was constituted by the probe-forming auxiliary layer 12c having the fine through holes 11a and the photosensitive glass base 2 having the fine through holes 1.

Then, the following procedure was carried out as a step of providing pillar-shaped fine conductors extending from the photosensitive glass base 2 to the probe-forming auxiliary layer 12c in the fine through holes connecting between the photosensitive glass base 2 and the probe-forming auxiliary layer 12c. First of all, as shown in FIG. 16c, epoxy resin layers 4 were provided on inner walls of the fine through holes 1 provided in the photosensitive glass base 2 and on inner walls of the fine through holes 11a respectively connected to the fine through holes 1 in the same manner as in Example 4. At the same time, epoxy resin layers 4 were further provided on inner walls of the terminal-forming through holes 3 provided in the photosensitive glass base 2.

Then, electroless Ni-P plating (partial plating) treatment was applied to the base member 13c containing the epoxy resin layers 4 in the same manner as in Example 4, to prepare Ni-P pillar-shaped matters 15d blocking the fine through holes 1 and the fine through holes 11a respectively connected to the fine through holes 1 as shown in FIG. 16d. At the same time, Ni-P hollow pillar-shaped matters 15e were prepared with no blockade of the terminal-forming through holes 3.

By providing the Ni-P pillar-shaped matters 15d blocking the fine through holes 1 and the fine through holes 11a respectively connected to the fine through holes 1, a plurality of pillar-shaped fine conductors extending from the photosensitive glass base 2 to the probe-forming auxiliary layer 12c were provided in the base member 13c.

After the Ni-P pillar-shaped matters 15d were provided, Ni-P projecting out of a surface of the base member 13c was polished/removed with an abrasive agent of cerium oxide and washed to thereby newly form the both end surfaces of each of the Ni-P pillar-shaped matters 15d to be respectively substantially flush with the surfaces of the base member 13c in the neighbors of the Ni-P pillar-shaped matters 15d, as shown in FIG. 16e. The Ni-P pillar-shaped matters having the newly formed end surfaces were called "Ni-P pillar-shaped matters 15f". Similarly, the both end surfaces of each of the Ni-P hollow pillar-shaped matters 15e were newly formed to be respectively substantially flush with the surfaces of the base member 13c in the neighbors of the Ni-P hollow pillar-shaped matters 15e. The Ni-P hollow pillar-shaped matters having the newly formed end surfaces were called "Ni-P hollow pillar-shaped matters 15g".

(2) Second Process

Then, the second process of projecting one end of each of the Ni-P pillar-shaped matters 15f out of a surface of the photosensitive glass base 2 by removing a part or all of the epoxy resin thin plate as a probe-forming auxiliary layer 12c was carried out as follows. After the Ni-P pillar-shaped matters 15f and the Ni-P hollow pillar-shaped matters 15g were provided, the base member 13c was immersed in acetone.

As a result, all of the epoxy resin thin plate as a probe-forming auxiliary layer 12c was dissolved and removed. At the same time, epoxy resin layers (a part of epoxy resin layer 4) in the fine through holes 11a and the epoxy resin adhesive agent used for fixing the probe-forming auxiliary layer 12c were dissolved and removed.

FIG. 16f is a sectional view of the base member 13c after the probe-forming auxiliary layer 12c was dissolved and removed.

As shown in FIG. 16f, one end of each of the Ni-P pillar-shaped matters 15f was projected by about 30 μm out of the surface of the photosensitive glass base 2 because the epoxy resin thin plate as a probe-forming auxiliary layer 12c was dissolved and removed. The Ni-P pillar-shaped matters 15f each having one projecting end were equivalent to microprobes (hereinafter called "microprobes 20d").

(3) Third Process

Then, a plurality of two-layer structure conductive portions each formed by providing an Ni-P layer on the outer surface of an ITO film pattern as a conductive portion electrically connected to one end of a corresponding microprobe 20d were provided on a surface of the photosensitive glass base 2 in the same manner as in Example 4. Thus, a circuit substrate equivalent to circuit substrate A according to Method IIIb was prepared.

EXAMPLE 7

Production of Circuit Substrate A according to Method IV

Figure 17A:
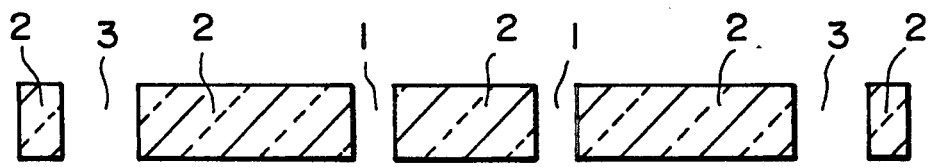
FIGS. 17*a* to 17*e* are sectional views showing typically an example of procedure for producing the circuit substrate A according to the Method IV.

A chemically machinable photosensitive glass base of the same quality and the same shape as in Example 2 was used as a base made of an inorganic electrically insulating material. The chemically machinable photosensitive glass base (hereinafter merely called "photosensitive glass base") was successively subjected to exposure treatment, developing treatment (heat treatment), etching treatment (acid treatment) and rinsing treatment in the same manner as in Example 2, as a step of providing a plurality of fine through holes in the photosensitive glass base. Thus, as shown in FIG. 17a, fine through holes 1 each having an opening diameter of 50 $\mu$m were arranged at intervals of 80 $\mu$m in the form of a regular square (in which the length of one side was taken as about 9 mm) in the central portion of the photosensitive glass base 2. At the same time, a plurality of terminal-forming through holes 3 each having an opening diameter of 420 $\mu$m were arranged at equal intervals with separation of 5 mm from sides of the photosensitive glass base 2. The terminal-forming through holes 3 were provided so as to respectively correspond to the fine through holes 1.

Figure 17B:
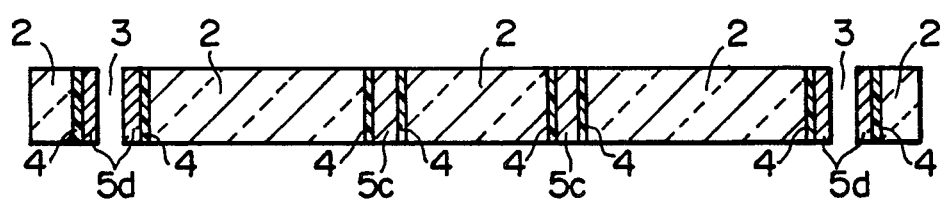

Then, epoxy resin layer forming treatment, electroless plating treatment and polishing treatment were successively carried out in the same manner as in Example 2, as a step of providing in the fine through holes 1 pillar-shaped conductors each having one end surface substantially flush with a surface of the photosensitive glass base 2. Thus, Ni-P pillar-shaped matters 5c each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the fine through holes 1 as shown in FIG. 17b. Further, as shown in FIG. 17b, Ni-P hollow pillar-shaped matters 5d each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the terminal-forming through holes 3 in the same manner as described above. In FIGS. 17b and 4d, items the same as or similar to each other are referenced correspondingly.

Figure 17C:
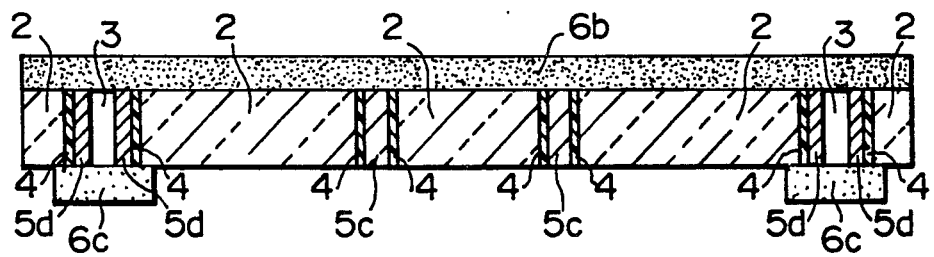
Figure 17D:
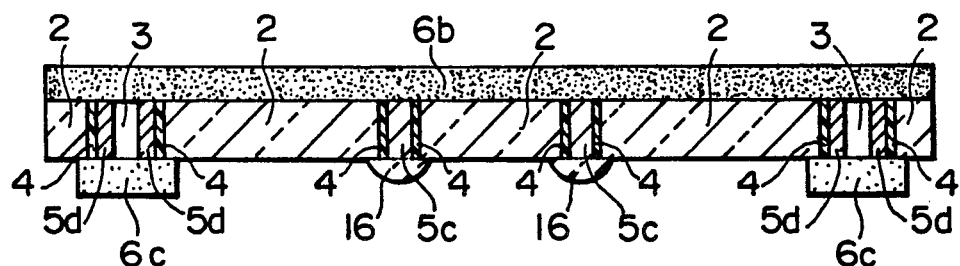

Then, the following procedure was carried out as a step of accumulating conductors on one end of each of the pillar-shaped conductors (Ni-P pillar-shaped matters 5c) by plating treatment to thereby project the end of the pillar-shaped conductor out of a surface of the photosensitive glass base 2 to thereby form microprobes. First of all, as shown in FIG. 17c, a resist 6b (tradename: Fuji Hunt Electronics Technology Co., Ltd.) Banx Dry Film-Photoresist A-425, made in Fuji Hunt Electronics Technology Co., Ltd.) having high adhesion to glass as a protective layer was stuck onto a surface of the photosensitive glass base 2 containing the Ni-P pillar-shaped matters 5c. Further, as shown in FIG. 17c, a resist 6c of the same quality as the resist 6b was stuck onto one end surface of each of the Ni-P hollow pillar-shaped matters 5d opposite to the surface where the resist 6b was stuck to thereby cover the end surface thereof.

Then, the same electroless plating treatment as in Example 2, constituted by catalyst activation and electroless plating, was applied to the photosensitive glass base 2 having the resists 6b and 6c for about 100 minutes. Thus, Ni-P was accumulated on an exposed end surface of each of the Ni-P pillar-shaped matters 5c and on a surface of the photosensitive glass base 2 in the neighbors thereof, to form vamps 16 with the thickness of 13 $\mu$m and the diameter of 77 $\mu$m. The vamps 16 were respectively united with the Ni-P pillar-shaped matters 5c, so that the combinations of the Ni-P pillar-shaped matters 5c and the vamps 16 constituted microprobes (hereinafter called "microprobes 20e").

Then, the following procedure was carried out as a step of providing on a surface of the photosensitive glass substrate 2 a plurality of conductive portions which were electrically connected to the microprobes 20e respectively and correspondingly. First of all, the resists 6b and 6c were torn off.

Figure 17E:
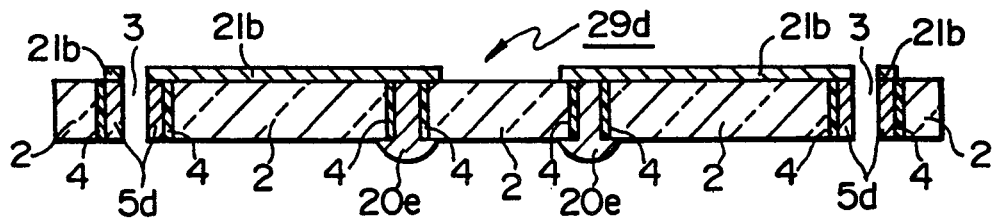

Then, treatment of forming an ITO film on a surface of the photosensitive glass base 2, treatment of forming a photoresist layer on the ITO film, treatment of forming resist patterns on the ITO film and treatment of forming ITO film patterns were successively carried out in the same manner as in the step of providing on a surface of the photosensitive glass base 2 conductive portions electrically connected to the microprobes 20a in Example 2. Thus, as shown in FIG. 17e, ITO film patterns 21b each electrically connected to one end of a corresponding microprobe 20e and electrically connected to a corresponding Ni-P hollow pillar-shaped matter 5d provided in a terminal-forming through hole 3 were provided on a surface of the photosensitive glass base 2.

The ITO film patterns 21b were equivalent to conductive portions. In short, in this Example 7, a plurality of monolayer-structure conductive portions constituted by the ITO film patterns 21b as conductive portions were provided on a surface of the photosensitive glass base 2 to thereby prepare a circuit substrate 29d equivalent to circuit substrate A according to Method IV.

EXAMPLE 8

Production of Circuit Substrate A according to Method I

Figure 18A:
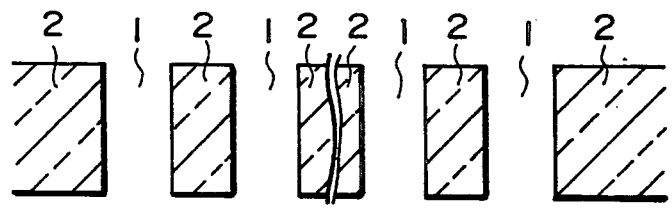
FIGS. 18*a* to 18*d* are sectional views showing typically another example of procedure for producing the circuit substrate A according to the Method I.

A chemically machinable photosensitive glass base of the same quality and the same shape as in Example 1 was used as a base made of an inorganic electrically insulating material. The chemically machinable photosensitive glass base (hereinafter merely called "photosensitive glass base") was successively subjected to exposure treatment, developing treatment (heat treatment), etching treatment (acid treatment) and rinsing treatment in the same manner as in Example 1, as a step of providing a plurality of fine through holes in the photosensitive glass base. Thus, as shown in FIG. 18a, fine through holes 1 each having an opening diameter of 80 $\mu$m were arranged at intervals of 20 $\mu$m in the form of a regular square (in which the length of one side was taken as about 9 mm) in the central portion of the photosensitive glass base 2.

Figure 18B:
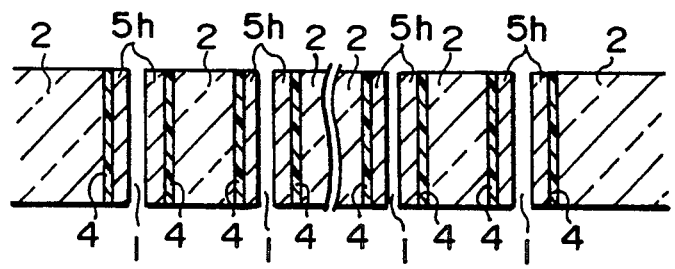

Then, the following procedure was carried out as a step of providing pillar-shaped conductors respectively in the fine through holes 1. First of all, epoxy resin layers were formed in the same manner as in Example 1. Then, electroless Ni-P plating treatment was carried out in the same manner as in Example 1, except that the time for precipitation in the treatment was changed from about 10 hours to 2 hours. Then, polishing treatment was carried out in the same manner as in Example 1. Thus, as shown in FIG. 18b, Ni-P hollow pillar-shaped matters 5h each having one end surface substantially flush with the upper surface of the photosensitive glass base 2 with respect to the direction of the thickness thereof, and another, opposite end surface substantially flush with the lower surface of the base 2 with respect to the direction of the thickness thereof were prepared in the fine through holes 1.

Figure 18C:
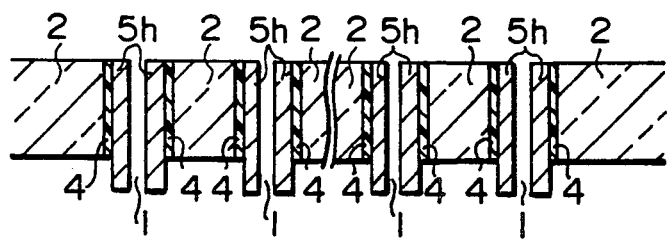

Then, vinyl tape sticking treatment, etching treatment, vinyl tape tearing-off treatment, and photosensitive glass base 2 washing treatment were successively carried out in the same manner as in Example 1, as a step of etching a surface portion of the photosensitive glass base 2 containing the Ni-P hollow pillar-shaped matters 5h to thereby project one end of each of the Ni-P hollow pillar-shaped matters 5h out of a surface of the photosensitive glass base 2. Thus, as shown in FIG. 18c, one end of each of the Ni-P hollow pillar-shaped matters 5h provided in the fine through holes 1 was projected out of a surface of the photosensitive glass base 2. The Ni-P hollow pillar-shaped matters 5h each having one projecting end were equivalent to microprobes (hereinafter called "microprobes 20f").

Figure 18D:
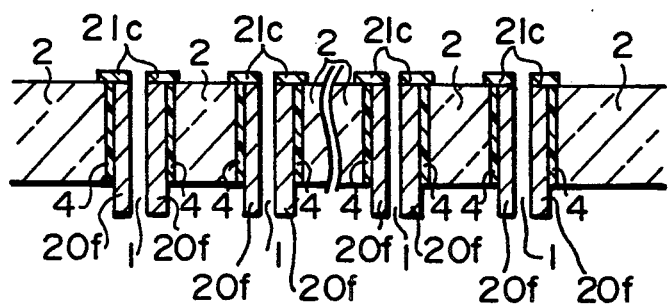

Then, treatment of forming an ITO film on a surface of the photosensitive glass base 2, treatment of forming a photoresist layer on the ITO film, treatment of forming resist patterns on the ITO film and treatment of forming ITO film patterns were successively carried out in the same manner as in Example 1, as a step of providing conductive portions on a surface of the photosensitive glass base 2, whereby an end of each conductive portion was electrically connected to an end of the corresponding one of the microprobes 20f. Thus, as shown in FIG. 18d, a plurality of monolayer-structure conductive portions constituted by the ITO film patterns 21c each having a linear width of 85 μm and having one end portion on one end surface of a corresponding microprobe 20f were provided on a surface of the photosensitive glass base 2 to thereby prepare a circuit substrate 29e equivalent to circuit substrate A according to Method I.

In respect to the circuit substrate 29e, there was no ITO film formed on the opening surfaces of the Ni-P hollow pillar-shaped matters 5h.

The circuit substrate 29e thus prepared was subjected to the following continuity test. The electrical continuity between the end portions of the conductive portions constituted by the ITO film patterns 21c and the microprobes 20f was tested by using a tester. It was found from the continuity test that they were perfectly continuous to each other with electric resistance of 23Ω.

Figure 19:
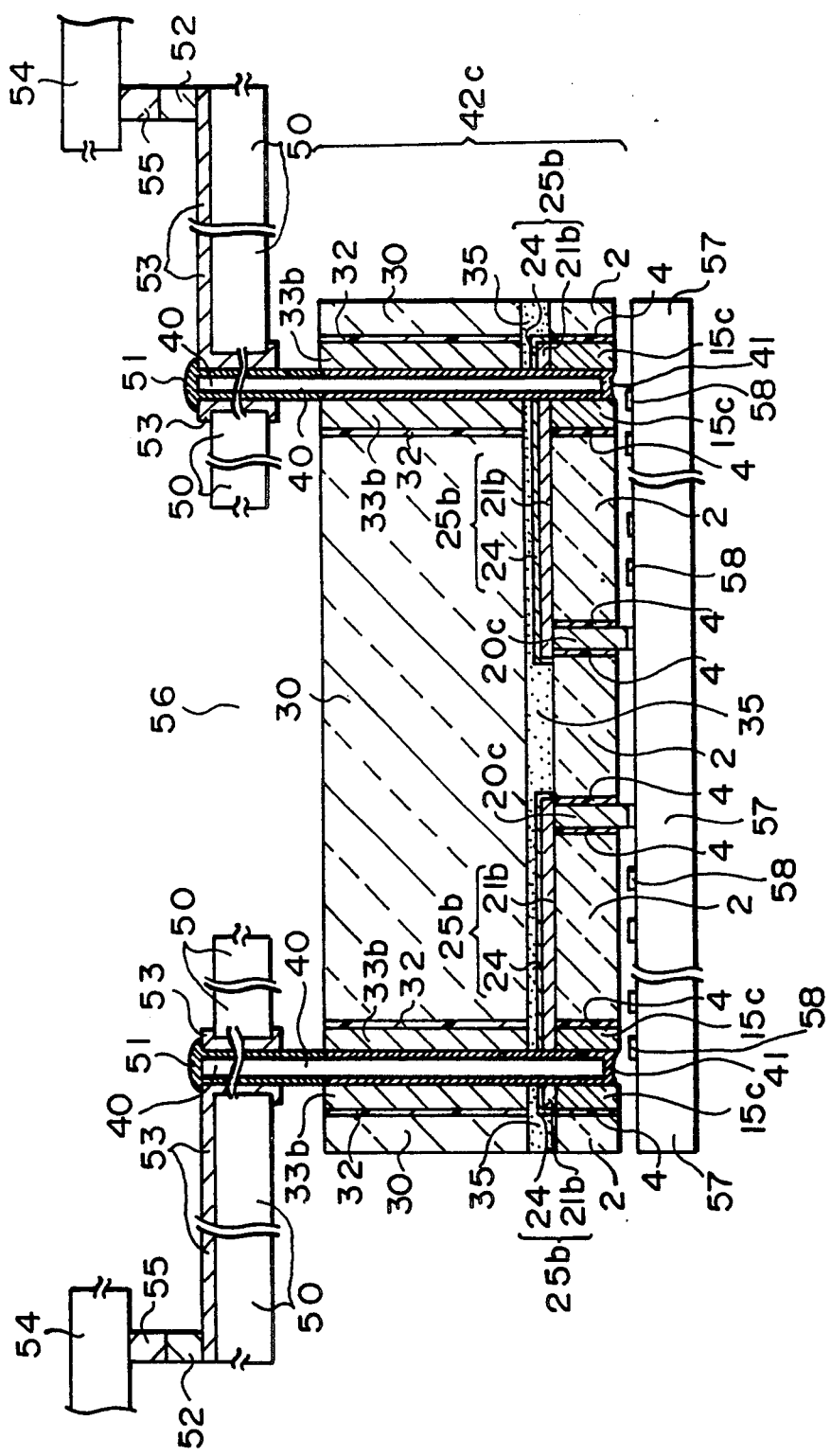
FIG. 19 is a sectional view showing typically an example of case where the circuit substrate A is used as a probe assembly.

In the case where the circuit substrate 42c finally prepared in Example 4 is used as a probe assembly, the circuit substrate 42c may be fixed to a supporting member 50 through melted solder while inserting ends of the stainless-steel wires 40 as connection terminals respectively into through holes provided in the supporting member 50 for supporting the circuit substrate 42c as typically shown in FIG. 19.

The supporting member 50 is made of a glass-epoxy plate larger than the circuit substrate 42c. The through holes for inserting the stainless-steel wires 40 therein are provided at predetermined positions having one-to-one correspondence to the stainless-steel wires 40. Ends of circuit patterns 53 having one-to-one correspondence to the through holes and electrically connected to connection terminals 52 provided at edge portions of the supporting member 50 are provided on inner walls of the through holes, respectively. The connection terminals 52 are provided at predetermined positions having one-to-one correspondence to connection terminals 55 provided in a probe assembly-tester head 54. An opening 56 is provided at a central portion of the supporting member 50.

Then, the circuit substrate 42c fixed to the supporting member 50 is used as a probe assembly after the connection terminals 52 provided in the supporting member 50 are respectively electrically connected to the connection terminals 55 provided in the probe assembly-tester head 54 and, at the same time, the projected ends of the microprobes 20c provided in the circuit substrate 42c are respectively brought into contact with test circuits 58 provided on a tested substrate 57. The stainless-steel wires 40, solder 41, conductive portions 25b and microprobes 20c (all of which constitute the circuit substrate 42c) function together with the connection terminals 52, circuit patterns 53 and melted solder 51 (all of which are provided on the supporting member 50), as a part of the circuit in which a test signal current flows between the probe assembly-tester head 54 (connection terminals 55) and the test circuit 58 provided on the integrated circuit of wafer 57.

It is to be understood that the present invention is not limited to the aforementioned Examples 1 through 8 and that the following modifications and applications may be made.

Although Examples 1 through 8 have shown the case where photosensitive glass is used as a base, the invention can be applied to the case where the base material may be selected from other inorganic insulating or semiconductive materials than the photosensitive glass, that is, the base material may be selected from various kinds of glass, such as alumino-boro-silicate glass, quartz glass, etc., polycrystals, monocrystals and amorphous matters of alumina sinter, PLZT, lithium niobate, tantalum niobate, quartz, aluminum phosphate, silicon, and the like. Or the invention can be applied to the case where the base material may be selected from organic semiconductive materials. The shape of the base is not restricted specifically. In short, the shape of the base can be modified to any suitable shape such as for example disk shape.

Although Examples 1 through 8 have shown the case where photolithographic technique is employed as a method for providing fine through holes in the base, the invention can be applied to the case where other photolithographic technique, electron discharge machining technique, printing technique, cutting machining technique, and the like, may be used. In the case where ceramics are used as a base, technique of sintering a green sheet after providing a plurality fine through holes in the green sheet may be used.

The quality and shape of the base and the means of providing fine through holes in the base can be selected suitable according to the size and number of microprobes, the accuracy in configuration of microprobes, the purpose and environment in use of the circuit substrate, and the like, as required of the microprobe-provided circuit substrate as a target of the invention. In the case where a large number of fine microprobes (for example, having a probe diameter of 300 μm or less) are arranged with high accuracy, it is particularly preferable that fine through holes are formed by photolithographic technique using photosensitive glass as a base as described in the aforementioned embodiments.

Although Examples 1 through 8 have shown the case where electroless Ni-P plating treatment is employed for providing pillar-shaped conductors in the fine through holes provided in the base, the invention can be applied to the case where electrically conductive metals (a), such as Co, Ni, Cu, Pd, Ag, Pt, Au, and the like, may be used precipitated by the electroless plating treatment. Or mixtures (b) containing these metals and other elements, such as B, N, P, V, Mn, Fe, Zn, Mo, Sn, W, Re, Tl, and the like, may be precipitated by the electroless plating treatment. Or metals, such as Au, Ag, Pt, Cr, Cu, Ni, Co, and the like, may be precipitated by electrolytic plating treatment with suitable lead wires. (In this case, prior to conducting the electrolytic plating treatment the above mentioned materials (a) or mixture (b) must be precipitated by electroless plating treatment.)

Further, technique of pouring melted solder into the fine through holes provided in the base, technique of pouring electrically conductive resin (electrically conductive adhesive agent) into the fine through holes, and the like, may be employed. According to the technique of pouring melted solder or conductive resin into the fine through holes, pillar-shaped conductors can be easily provided in the fine through holes provided in the base.

In this case, pillar-shaped conductors each having one end substantially flush with a surface of the base can be formed without application of polishing treatment, by sticking tape or the like to the surface of the base where electric patterns are to be provided.

Although Examples 1 through 8 have shown the case where one end surface of each of the microprobes or pillar-shaped conductors to be electrically connected to the conductive portions is provided to be substantially flush with a surface of the base, the invention can be applied to the case where the end surfaces of the microprobes or pillar-shaped conductors are not always substantially flush with a surface of the base, that is, the end surfaces may be projected out of a surface of the base. In short, one end surface of each of the microprobes or pillar-shaped conductors to be connected to the conductive portions may be projected out of a surface of the base if the conductive portions can be formed.

Although Examples 1 through 8 have shown the case where epoxy resin layers are respectively provided on inner walls of the fine through holes provided in the base to improve adhesion to the photosensitive glass base, of metal precipitated by electroless plating treatment, the same effect can be attained in the case where the epoxy resin may be replaced by a material having excellent adhesion to the base, such as photoresist, alcoxide, etc., or a mixture dispersively containing powder of a catalyst metal such as Pd, Au, Pt or the like in the aforementioned material. If the technique for the electroless plating treatment and the quality of the base can be selected suitably, pillar-shaped conductors can be provided in the fine through holes provided in the base, with no necessity of providing resin layers or the like.

In Examples 1 through 3, microprobes are formed by etching a surface portion of the base to thereby project one end of each of the pillar-shaped conductors provided in the base out of a surface of the base. In short, in Examples 1 through 3, a surface portion of the base is etched by immersing the base in a hydrofluoric acid after providing the pillar-shaped Ni-P conductors in the base. It is, however, a matter of course that the invention is not limited to the specific embodiments and that any suitable etching technique selected from spraying technique, RIE (reactive etching) technique, dry etching technique such as plasma etching technique, and the like, may be used for etching a surface portion of the base. In the aforementioned etching treatment, any suitable etching solution can be selected according to the quality of the base.

Figure 20:
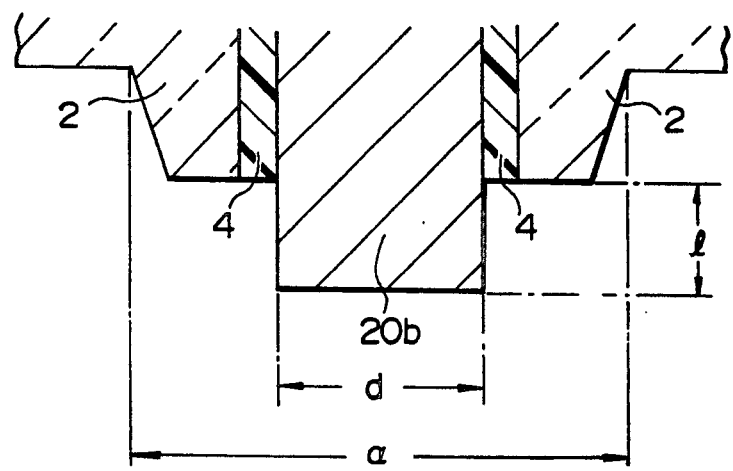
FIG. 20 is an enlarged view showing typically a microprobe formed according to the Method II.

When microprobes are formed according to Method II, the projection length of the respective microprobes $20b$ preferably satisfies the relation: $1 \leq (\alpha - d)/2$, in which d represents the diameter of the microprobe $20b$, l represents projection length of the microprobe $20b$, and $\alpha$ represents the diameter of the protrusion of the photosensitive glass base 2, as shown in FIG. 20. In FIGS. 20 and 1l, items the same as or similar to each other are referenced correspondingly.

Although a probe-forming auxiliary layer for forming micro-probes without etching a surface portion of the base is used in Method III, the quality of the probe-forming auxiliary layer can be selected suitable if fine through holes for providing pillar-shaped fine conductors extending from the base to the probe-forming auxiliary layer can be provided and, at the same time, a part or all of the probe-forming auxiliary layer can be removed while securing the supporting of the pillar-shaped fine conductors after providing the pillar-shaped fine conductors. For example, the negative-type photoresist, the positive-type photoresist and the epoxy resin thin plate respectively used in Examples 4 through 6 may be replaced by thin plate of various resins, such as polyimide resin, acryl resin, polystyrene resin, etc., photosensitive glass, ceramics, and the like.

The technique used for providing fine through holes in the base, as well as the photolithographic technique used in Examples 4 and 5 and the laser beam application technique used in Example 6, can be used as a method of providing fine through holes in the probe-forming auxiliary layer.

Figure 21:
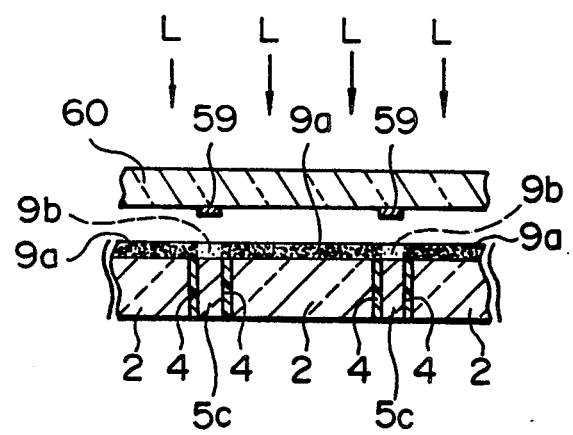
FIG. 21 is a sectional view showing typically another means for providing fine through holes in a probe-forming auxiliary layer in the case where the circuit substrate A is produced according to the Method IIIa.

Although ultraviolet rays for exposing the photoresist are applied to the base from the back of the base in Examples 4 and 5 using the photoresist as a material of the probe-forming auxiliary layer, a light-transmissible substrate 60 having Cr films 59 provided at positions corresponding to end surfaces of the Ni-P pillar-shaped matters 5c may be arranged above the negative-type photoresist provided on a surface of the photosensitive glass base 2 as shown in FIG. 21 so that exposure portions $9a$ and non-exposure portions $9b$ can be formed in the negative-type photoresist by applying ultraviolet rays L to the photosensitive glass base from the front (where the photoresist are provided) thereof with use of the Cr films 59 as a mask. Or a light-transmissible substrate having Cr films provided at positions except the positions corresponding to the end surfaces of the Ni-P pillar-shaped matters 5c may be used as a mask so that a positive-type photoresist can be exposed from the front of the base. In the afore-mentioned procedure, the Cr films may be replaced by thin films of $MoSi_2$, Ta, Ti, Si or the like as generally used as a shading film. In FIGS. 21 and 12f, items the same as or similar to each other are referenced correspondingly.

The material of the probe-forming auxiliary layer and the technique for forming fine through holes in the probe-forming auxiliary layer can be selected suitably according to the size and number of microprobes, the accuracy in configuration of microprobes, and the like, as required of the microprobe-provided circuit substrate as a target of the invention.

In the case where a material relatively excellent in mechanical strength is used as the probe-forming auxiliary layer, the probe-forming auxiliary layer may be provided on the base by mechanically bring the probe-forming auxiliary layer into contact with the base.

In the case where the assumption is that all of the probe-forming auxiliary layer is removed in the second process, the thickness of the probe-forming auxiliary layer can be selected suitably according to the projection length of the microprobes taken from the base. Although Examples 4 through 6 have shown the case where one end of each of the pillar-shaped fine conductors extending from the base to the probe-forming auxiliary layer is formed to be substantially flush with a surface of the probe-forming auxiliary layer, it is to be understood that the end of each of the pillar-shaped fine conductors may be projected out of the surface of the probe-forming auxiliary layer or may be de-pressed in the surface of the probe-forming auxiliary layer.

In the case where the assumption is that a part of the auxiliary layer is removed in the second process, the thickness of the auxiliary layer is set to be more than the projection length of the microprobes taken from the base member.

The following example can be given as a method of projecting one end of each of the pillar-shaped fine conductors extending from the base to the probe-forming auxiliary layer, out of a surface of the base member by removing a part of the probe-forming auxiliary layer. In short, the method comprises the steps of: preparing a probe-forming auxiliary layer made of photosensitive glass of the same shape as the photosensitive glass base 2 used as a base in Example 4, inclusively of fine through holes and terminal-forming through holes; sticking the probe-forming auxiliary layer and the photosensitive glass base 2 to each other to connect the respective fine through holes to each other; providing pillar-shaped fine conductors extending from the base to the probe-forming auxiliary layer in the same manner as in Example 6; and etching a surface portion of the photosensitive glass constituting the prove-forming auxiliary layer to thereby remove the surface portion by a predetermined thickness. In this case, the time of electroless Ni-P plating treatment is the same as that of Example 4 or 6, and the micro-probe can be supported more reliably than in Example 4 or 6.

As is obvious from Example 5, the diameter of the fine through holes provided in the probe-forming auxiliary layer may be smaller than the diameter of the pillar-shaped fine conductors provided in the base. If the diameter of the fine through holes provided in the probe-forming auxiliary layer is too large, it is apprehended that forward ends of adjacent ones of the finally produced microprobes may touch each other.

Although Examples 4 through 6 have shown the case where the probe-forming auxiliary layer is removed by immersing the base in a predetermined solution after going through the first process, the invention can be applied to the case where the probe-forming auxiliary layer may be removed by spraying technique, RIE (reactive etching) technique, dry etching technique such as plasma etching technique, or the like.

In Method IV, the technique of applying plating treatment to the pillar-shaped conductors each having one end substantially flush with a surface of the base to thereby accumulate conductors on the end of each of the pillar-shaped conductors to prepare microprobes is used for the purpose of forming microprobes without etching a surface portion of the base. The treatment used in the case where pillar-shaped conductors are provided in fine through holes by electroless and/or electrolytic plating technique may be used as the plating treatment in Method IV. In this case, the quality of the pillar-shaped conductors may be equal to that of conductors accumulated on one end of each of the pillar-shaped conductors or may be different.

The material of conductive portions electrically connected to the thus prepared microprobes is not limited to ITO and Ni-P used in Examples 1 through 8. For Example, the material can be selected suitably from electrically conductive matters such as Cr, Au, Ag, Cu, Ni, and the like.

The electric resistance between the conductive portions and the microprobes or pillar-shaped conductors can be reduced by providing Ni-P layers of the thickness of 1 to 5 $\mu$m on the outer surface of ITO film patterns as shown in Examples 2 and 4. Further, the Ni-P layers may be coated with gold to protect the Ni-P layers from oxidizing. The coating of the Ni-P layers with gold can be made by known electroless or electrolytic plating technique. Accordingly, the structure of the conductive portions can be selected suitably from monolayer structure, two-layer structure and three-layer structure. Furthermore, the structure of the conductive portions may be provided as a multilayer structure having four layers or more.

The conductive portions may be formed by other techniques, such as screen printing technique, offset printing technique, and the like, than the photolithographic technique, the electroless plating technique and the electrolytic plating technique.

It is not always necessary that the conductive portions are formed after the microprobes are formed. For example, as is obvious from Example 3, the conductive portions may be formed after preparing the pillar-shaped conductors as a precursor of the microprobes, before the microprobes will be prepared by projecting one end of each of the pillar-shaped conductors out of a surface of the base.

In the case where a reinforcement substrate which is not always a necessary member in circuit substrates A and B is provided, a step of proving a reinforcement substrate is added respectively to Methods I to IV.

The material of the reinforcement substrate is not restricted specifically if it is an electrically insulating or semiconductive matter having a predetermined amount of mechanical strength. The material may be inorganic or may be organic. The quality of the reinforcement substrate may be different from that of the base. The shape of the reinforcement substrate is not restricted specifically. Any suitable shape, for example, cross shape, can be selected suitably if the mechanical strength of the circuit substrate can be improved and, at the same time, the distortion of the substrate can be prevented.

Various kinds of insulating adhesive agents, solder glass, double-face adhesive tape, and the like, other than the hot-melt type sheet-shaped adhesive agent used in Examples 2 through 4 can be used for sticking the base and the reinforcement substrate to each other. Or heat sealing technique, bolting technique and the like can be used for sticking them.

In the case where connection terminals which are not always provided in advance in circuit substrates A and B are provided, a step of proving connection terminals is added respectively to Methods I to IV.

The structure of the connection terminals thus added is not restricted specifically. Any suitable structure can be selected if the connection terminals can electrically connect the conductive portions provided in the microprobe-provided circuit substrate to test apparatus. Further, the technique for forming the connection terminals can be selected suitably.

Figure 22:
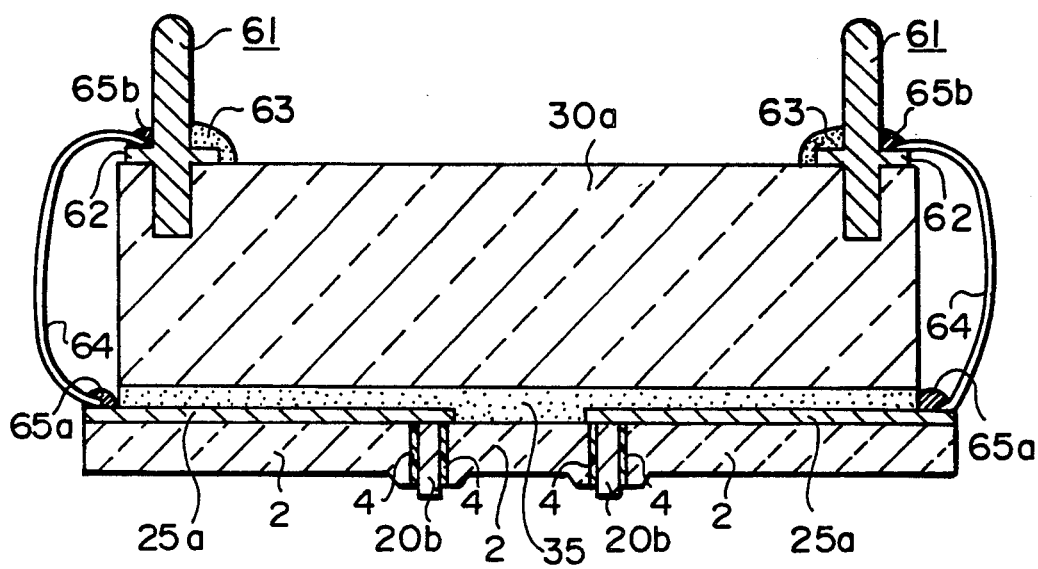
FIG. 22 is a sectional view showing typically another example of the circuit substrate B in which a reinforcement substrate and connection terminals are provided.

For example, as shown in FIG. 22, the connection terminals may be provided by sticking stoppers 62 provided in pins 61 onto a reinforcement substrate 30a (being smaller than the photosensitive glass base 2 and having a plurality of connection terminal insertion holes) with an adhesive agent 63 while inserting one end of each of the pins 61 as a connection terminal into a corresponding connection terminal insertion hole provided in the reinforcement substrate 30a to thereby electrically connect the fixed pins 61 and the conductive portions 25a (provided on a surface of the base 2) to each other through wires 64, respectively. In this case, the electrical connection between the conductive portions 25a and the pins 61 through the wires 64 can be made by fixing one-end portions of the wires 64 onto the conductive portions 25b with solder 65a and then fixing opposite-end portions of the wires onto the stoppers 62 with solder 65b.

In this case, it is not necessary that terminal-forming through holes are provided in the photosensitive glass base 2. In FIGS. 22 and 11, items the same as or similar to each other are referenced correspondingly.

Figure 23:
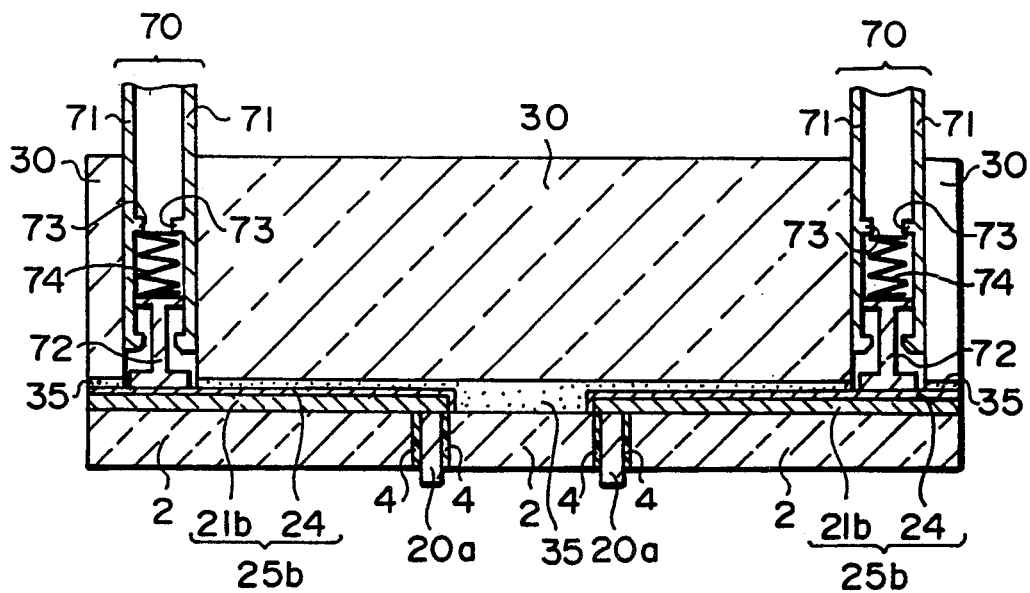
FIG. 23 is a sectional view showing typically an example of the circuit substrate A in which pogo-pins are provided as connection terminals.

Alternatively, as shown in FIG. 23, the stainless-steel wires 40 used in Examples 2 through 4 may be replaced by pogo-pins 70.

Each of the pogo-pins 70 has: a hollow pillar-shaped electrically conductive metal pin 71 having its bottom including an opening portion; an electrically conductive metal terminal 72 having an I or H shape in vertical section and being freely moved in the opening portion provided in the pin 71 while bring its one end into contact with the inner wall of the pin 71; and a spring 74 provided between the end surface of the electrically conductive metal terminal 72 within the pin 71 and the stopper 73 provided at a predetermined position in the inner wall of the pin 71. Thus, the pogo-pins 70 can be flexibly connected to the conductive portions 25b, respectively.

Also in this case, there is no necessity of providing terminal-forming through holes in the photosensitive glass base 2. In FIGS. 23 and 7b, items the same as or similar to each other are referenced correspondingly.

Figure 24A:
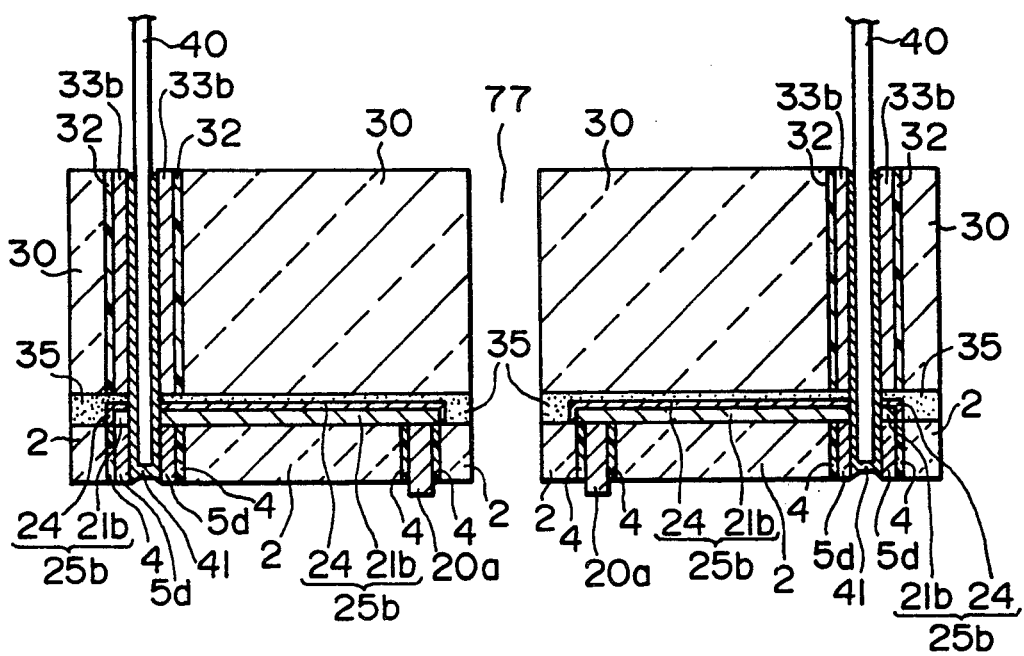
FIG. 24*a* is a sectional view showing typically an example of the circuit substrate A in which a work opening portion is provided.
Figure 24B:
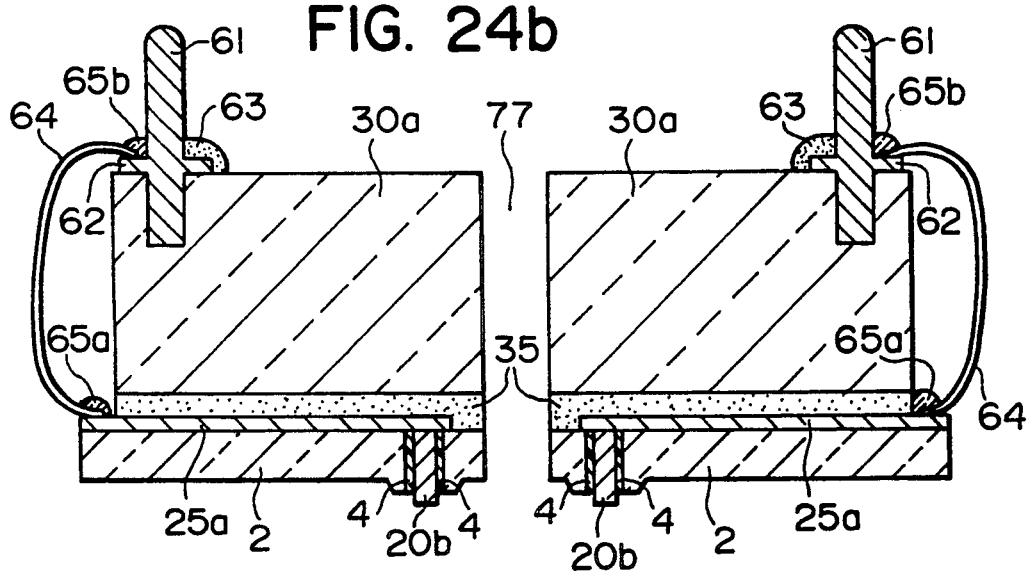
FIG. 24*b* is a sectional view showing typically an example of the circuit substrate B in which a work opening portion is provided.
Figure 25:
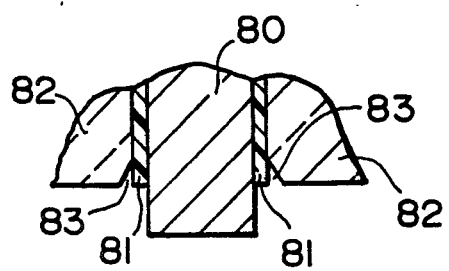
FIG. 25 is an enlarged view showing typically an example of an end surface of a microprobe formed according to the Method I.
Figure 26A:
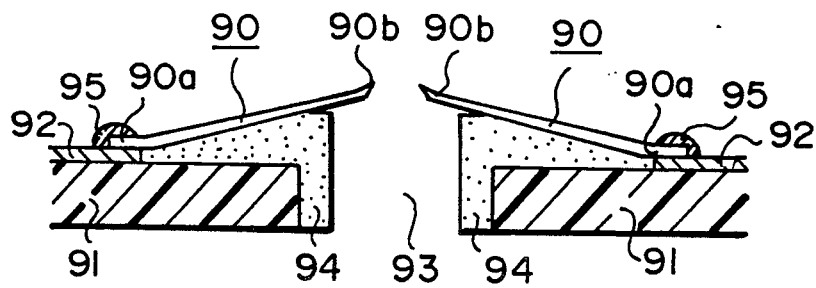
FIG. 26*a* is a sectional view showing typically an example of a microprobe portion of a conventional probe assembly.
Figure 26B:
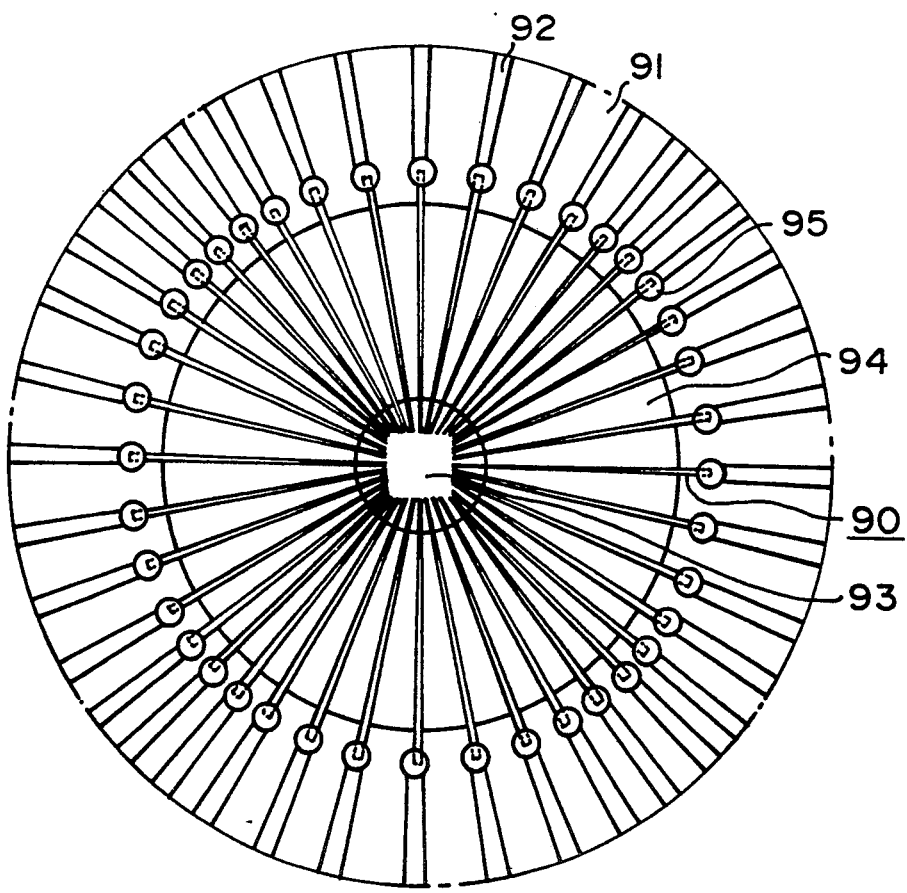
FIG. 26*b* is a top view showing typically the vicinity of a central portion of the probe assembly depicted in FIG. 26*a*.

In the case where circuit substrate A and/or circuit substrate B according to the invention is used as a probe assembly or the like requiring an opening portion as a work portion, the work opening portion 77 may be provided in advance as shown in FIGS. 24a and 24b. The work opening portion within a probe assembly is used for making inferior substrates tested, with ink or the like which is supplied through a tube inserted into the working opening portion. In FIGS. 24a and 7b, items the same as or similar to each other are referenced correspondingly, and also in FIGS. 24b and 22, items the same as or similar to each other are referenced correspondingly.

Not only circuit substrate A or B having the work opening portion can be prepared by using a work opening portion-provided inorganic electrically-insulating material or a semiconductive material as a base, but it can be prepared by Methods I to IV including a step of providing the work opening portion in the base, base member or microprobe-provided circuit substrate. In the case where a reinforcement substrate is added, a work opening portion-provided electrically insulating or semiconductive material may be used originally as a reinforcement substrate or a step of providing the work opening portion in the reinforcement substrate may be added respectively to Methods I to IV.

A known technique, such as etching technique, laser machining technique, chemical drilling technique, or the like, can be used for providing the work opening portion in the base, reinforcement substrate or circuit substrate including the base or reinforcement substrate.

The processing sequence for producing circuit substrate A and/or circuit substrate B in Methods I to IV of the invention is not limited to the processing sequence as shown in EXamples 1 through 8, if circuit substrate A and/or circuit substrate B can be produced finally.

For example, conductive portions may be formed brfore microprobes are formed from pillar-shaped conductors or pillar-shaped fine conductors or may be formed after microprobes are formed. Further, the step of forming microprobes from pillar-shaped conductors or pillar-shaped fine conductors may be carried out after the step of providing a reinforcement substrate or may be carried out after the step of forming connection terminals. The protrusions provided on a surface of the base in the case of production of circuit substrate B may be formed just after fine through holes are provided in the base or may be formed after pillar-shaped conductors are formed in the fine through holes.

Microprobes may be formed by projecting one end of each of the pillar-shaped conductors out of a base surface after providing fine grooves instead of the fine through holes in the base end surface and then providing the pillar-shaped conductors in the fine grooves. The concept "base end surface" contains the inner wall of an opening portion if the base has the opening portion. The aforementioned fine grooves can be provided in the same manner as the fine through holes. Further, the pillar-shaped conductors can be formed in the fine grooves in the same manner as used for forming the pillar-shaped conductors in the fine through holes.

As described above, since the microprobe-provided circuit substrate according to the present invention used a base made of an inorganic electrically insulating material or a semiconductive material both of which have a relatively low thermal expansion coefficient, positions of the microprobes provided in the base can be supported relatively stably against the thermal change in the surroundings or the outer atmosphere. In short, the positional accuracy of the microprobes is excellent. The microprobe-provided circuit substrate according to the present invention can be produced by the method for production of a microprobe-provided circuit substrate according to the present invention without the step of fixing precursors of microprobes at predetermined positions on the base by handwork.

Accordingly, a microprobe-provided circuit substrate which can be used as a probe assembly having excellent positional accuracy of the microprobes and can be easily accommodated to the high density (high integration) of a substrate to be tested can be provided by putting the present invention into practice.

What is claimed is:

1. A microprobe-provided circuit substrate comprising:
    a base made of an inorganic electrically-insulating material or a semiconductive material and having a plurality of fine through holes;
    microprobes constituted by pillar-shaped conductors correspondingly respectively provided in said fine through holes, each of said microprobes having one end that projects beyond one surface of said base, said one end being brought into contact with a circuit to be tested; and conductive portions provided on the other surface of said base electrically connected to the other end of corresponding microprobes.

2. A microprobe-provided circuit substrate according to claim 1, in which said one surface of said base has protruding regions that surround said microprobes.

3. A microprobe-provided circuit substrate according to claim 1, in which a reinforcement substrate made of an electrically insulating or semiconductive material is adhered to the base on the other surface where said conductive portions are provided.

4. A microprobe-provided circuit substrate according to claim 1, further comprising connection terminals, respectively corresponding to said conductive portions, for electrically connecting said conductive portions to test apparatus for supplying a signal current to said test circuit.

5. A microprobe-provided circuit substrate according to claim 1, in which said base is made of photosensitive glass.

6. A microprobe-provided circuit substrate according to claim 1, further comprising an opening portion formed at a central portion of said base and extending through the thickness of said base from the upper surface to the lower surface thereof.

7. A microprobe-provided circuit substrate according to claim 3, further comprising an opening portion formed at a central portion of an integral structure of said base and said reinforcement substrate and extending through the thickness of said integral structure from the upper surface to the lower surface thereof.

8. A microprobe-provided circuit substrate according to claim 1, wherein portions of said base surrounding the projected ends of said microprobes protrude beyond the base.

9. A microprobe-provided circuit substrate according to claim 1, wherein the diameter of said projected end of said microprobe is smaller than that of the other end of said microprobe.

10. A microprobe-provided circuit substrate according to claim 1, wherein said projected end of said microprobe is tapered.

11. A microprobe-provided circuit substrate according to claim 1, wherein said one surface is formed by etching.

12. A microprobe-provided circuit substrate according to claim 1, wherein said microprobe is a hollow pillar-shaped conductor.

13. A microprobe-provided circuit substrate according to claim 1, wherein said microprobe is made from electroless Ni-P plating.

14. A microprobe-provided circuit substrate according to claim 5, wherein said photosensitive glass is an $Li_2O-Al_2O_2-SiO_2$ (Au; Ce) chemically machinable photosenitive glass.

15. A microprobe comprising:
a flat base member made of an inorganic electrically-insulating material or semiconductive material having a plurality of transverse holes through the thickness of the base member;
a plurality of cylindrically-shaped microprobe conductors provided in the transverse holes so that one end of each microprobe is flush to one surface of the base member and the other end of each microprobe projects beyond the opposite surface of the base member; and
conductive members formed on the first surface of the base plate making electrical contact to the flush end of a corresponding microprobe, wherein the projecting ends of the microprobes are adapted for contacting various electrodes contained on an integrated circuit for test purposes.

16. A microprobe according to claim 15 wherein a reinforcement substrate made of an electrically insulating or semiconductive material is adhered to the base member on the one surface aligned with the flush ends of the microprobes.

17. A microprobe according to claim 16 further comprising:
connection terminals, corresponding to said conductive members, for supplying test signals to the integrated circuit electrodes, wherein the connection terminals are connected electrically and physically to the conductive members using a plurality of corresponding wires passing through the reinforcement substrate.

18. A microprobe according to claim 15 wherein the conductive members include a metal oxide conductor contacting the cylindrically shaped microprobes over which is formed a metal plating layer thereby reducing resistance between the microprobe and the conductive member.

* * * * *